United States Patent
Sundaresan et al.

(10) Patent No.: US 11,908,933 B2
(45) Date of Patent: Feb. 20, 2024

(54) DESIGNS FOR SILICON CARBIDE MOSFETS

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GENESIC SEMICONDUCTOR INC., Dulles, VA (US)

( * ) Notice: Subject to any disclaimer, the term of this patent is extended or adjusted under 35 U.S.C. 154(b) by 0 days.

(21) Appl. No.: 17/686,571

(22) Filed: Mar. 4, 2022

(65) Prior Publication Data

US 2023/0282744 A1 Sep. 7, 2023

(51) Int. Cl.
*H01L 29/78* (2006.01)
*H01L 29/66* (2006.01)
*H01L 21/04* (2006.01)
*H01L 29/16* (2006.01)

(52) U.S. Cl.
CPC ........ *H01L 29/7833* (2013.01); *H01L 21/046* (2013.01); *H01L 29/1608* (2013.01); *H01L 29/66068* (2013.01); *H01L 29/7802* (2013.01)

(58) Field of Classification Search
CPC ............... H01L 21/046; H01L 29/0869; H01L 29/1095; H01L 29/1608; H01L 29/41766; H01L 29/45; H01L 29/66068; H01L 29/7802; H01L 29/7833
USPC ......................................................... 257/329
See application file for complete search history.

(56) References Cited

U.S. PATENT DOCUMENTS

| | | | |
|---|---|---|---|
| 9,887,287 B1 | 2/2018 | Lichtenwalner et al. | |
| 11,049,962 B2 | 6/2021 | Sundaresan et al. | |
| 11,183,566 B1 | 11/2021 | Sundaresan et al. | |
| 2011/0266619 A1* | 11/2011 | Theeuwen | H01L 29/7835 257/340 |
| 2013/0299849 A1* | 11/2013 | Tega | H01L 29/1095 257/77 |
| 2013/0313576 A1 | 11/2013 | Nakano | |
| 2015/0295048 A1 | 10/2015 | Hiyoshi et al. | |
| 2018/0114857 A1 | 4/2018 | Okada et al. | |

(Continued)

FOREIGN PATENT DOCUMENTS

WO WO2017169777 * 5/2017 ............. H01L 29/78

*Primary Examiner* — Fazli Erdem
(74) *Attorney, Agent, or Firm* — Raj S. Dave; Dave Law Group LLC

(57) ABSTRACT

A metal-oxide-semiconductor field-effect transistor (MOSFET) device is described herein. The MOSFET device comprises a unit cell on a silicon carbide (SiC) substrate. The unit cell comprises: a source region; a well region; and a source attachment region. The source attachment region is in contact with the source region. The source attachment region is doped using first conductivity type ions. In an embodiment, the source attachment region is doped using second conductivity type ions. The source attachment region comprises a depth shallower than a depth of source region. In an embodiment, the source attachment region comprises a depth equal to a depth of the source region. The source attachment region comprises a doping concentration lower than a doping concentration of the source region. In an embodiment, the source attachment region comprises a doping concentration equal to a doping concentration of the source region.

20 Claims, 40 Drawing Sheets

(56) References Cited

U.S. PATENT DOCUMENTS

| | | |
|---|---|---|
| 2019/0393299 A1 | 12/2019 | Huerner et al. |
| 2020/0176251 A1 | 6/2020 | Cook et al. |
| 2020/0194546 A1 | 6/2020 | Arthur et al. |
| 2020/0295139 A1 | 9/2020 | Sundaresan et al. |
| 2020/0403069 A1 | 12/2020 | Kimoto et al. |
| 2021/0134998 A1 | 7/2021 | Sundaresan et al. |

\* cited by examiner

P-TYPE IMPLANT

N-TYPE IMPLANT

DESIGNS FOR SILICON CARBIDE MOSFETS

FIELD OF THE INVENTION

The present disclosure relates to power semiconductor devices and, in particular, relates to mitigation of short channel effects in silicon carbide (SiC) metal-oxide-semiconductor filed-effect transistor (MOSFETs).

BACKGROUND OF INVENTION

The reduction of channel lengths has driven modern planar gate SiC MOSFET technology development, in an attempt to reduce the high levels of channel resistance stemming from the low value of SiC MOS channel mobility. Modern planar SiC MOSFETs also known as (aka) DMOSFETs are typically manufactured with submicron channels. However, SiC DMOSFETs fabricated with submicron channels encounter a fundamental issue which is known as the threshold voltage roll-off effect. The threshold voltage roll-off effect is prominent for planar SiC MOSFETs fabricated with less than 0.5 μm in channel length. The threshold voltage roll-off effect leads to a drastic reduction of the threshold voltage (VTH) of SiC MOSFETs with decreasing channel length below 0.5 μm. This VTH roll-off issue has become a major roadblock in the efforts to further enhance the on-state performance via channel length reduction.

Planar gate SiC MOSFET with submicron channels may be fabricated using the self-aligned channel (SAC) formation technique. The SAC formation technique may consist of the following consecutive steps such as formation of the ion implant mask for a preparation for subsequent implant for the well region, the well ion implantation, the sidewall spacer formation for preparation for subsequent implant for the source region which includes an etch-back process, and the source ion implantation. Due to the sidewall spacer formation, it became possible to realize a sub 0.5 μm channel length for a conventional planar gate SiC MOSFET, even with lithography equipment with modest linewidth and alignment capability. The formation of sub-0.5 μm channels is a great advantage of the SAC formation technique that enabled dramatic reduction of the on-state resistance (RDS, ON) of the planar gate SiC MOSFET due to the short (<0.5 μm) channel length. The etch-back process is considered to be the most critical part of the SAC formation step. The etch-back process in defining the channel lengths, has an adverse effect with high likelihood of over-etching of the spacer layer and of etching non-uniformity. The over-etching of the spacer dielectric layer and of etching non-uniformity unavoidably arises from constantly changing process conditions within individual etching chambers and/or from the clusters of the etching chambers used for the SAC formation.

These aforementioned issues of the over-etching and etching non-uniformity will lead to significant drifting of the channel lengths off from the target which inherently results in channel length variations from wafer-to-wafer and lot-to-lot. The channel length variations will naturally lead to a poor statistical distribution of the VTH and RDS, ON of the planar gate SiC MOSFET manufactured with the SAC formation technique. These problems are exacerbated for planar SiC MOSFETs having less than 0.5 μm channel length since there is a dramatic reduction of Vth (due to aforementioned VTH roll-off) with decreasing channel length. The adverse effect of the etch-back process has become the most fundamental issue with the SAC formation technique. The adverse effect of the etch-back process is a major roadblock in achieving a tight distribution of the VTH and the RDS, ON of a conventional planar gate SiC MOSFET fabricated with the SAC formation technique.

Therefore, there is a significant long-felt need for a device and a method to mitigate the short channel effects (e.g., $V_{TH}$ roll-off issue) for the MOSFETs.

SUMMARY OF INVENTION

In an aspect a metal-oxide-semiconductor field-effect transistor (MOSFET) device is described. The MOSFET device comprises a unit cell on a silicon carbide (SiC) substrate. The unit cell comprises: a source region; a well region; and a source attachment region. The source attachment region is in contact with the source region.

In an embodiment, the source attachment region comprises a first conductivity type region.

In another embodiment, the source attachment region comprises a second conductivity type region.

In yet another embodiment, the source attachment region comprises a first depth that is one of shallower than and equal to a second depth of the source region.

In yet another embodiment, the source attachment region comprises a first doping concentration that is one of lower than and equal to a second doping concentration of the source region.

In yet another aspect, a method is described herein. The method comprises: preparing a silicon carbide (SiC) wafer comprising a substrate and a drift region; forming a well region by performing a first ion-implantation using second conductivity type ions through a first patterned mask layer; forming a source attachment region by performing a second ion-implantation through a first sidewall spacer; and forming a source region by performing a third ion-implantation ions through a second sidewall spacer.

In an embodiment, the source attachment region is formed by performing the second ion-implantation using first conductivity type ions through the first sidewall spacer.

In another embodiment, the source attachment region is formed by performing the second ion-implantation using the second conductivity type ions through the first sidewall spacer.

In yet another embodiment, the source region is formed by performing the third ion-implantation using both first conductivity type ions and the second conductivity type ions through the second sidewall spacer.

In another embodiment, the first patterned mask layer comprises at least one of a silicon oxide layer, a polysilicon layer, and a silicon nitride layer.

In yet another embodiment, the first patterned mask layer comprises a first thickness ranging from 50 nanometers to 5000 nanometers.

In yet another embodiment, depositing the first patterned mask layer comprises: a top silicon oxide layer and a bottom silicon oxide layer sandwiching a polysilicon layer.

In an embodiment, the method further comprises: etching the top silicon oxide layer and the polysilicon layer of the first patterned mask layer; forming a remnant thin silicon oxide layer; and performing the first ion-implantation using the second conductivity type ions through the remnant thin silicon oxide layer.

In another embodiment, forming the first sidewall spacer comprises: depositing a second mask layer over the first patterned mask layer; and etching the second mask layer with a first etch rate in a vertical direction, and a second etch rate in a horizontal direction that is one of lower than and equal to the first etch rate. The first sidewall spacer comprises an increase in a lateral extent over the first patterned mask layer in a range of 20 nanometers to 2000 nanometers.

In yet another embodiment, forming the second sidewall spacer comprises: depositing a third mask layer over the first sidewall spacer; and etching the third mask layer with a first etch rate in a vertical direction, and a second etch rate in a horizontal direction that is one of lower than and equal to the first etch rate. The second sidewall spacer comprises an increase in a lateral extent over the first sidewall spacer in a range of 20 nanometers to 2000 nanometers.

In yet another embodiment, forming the first sidewall spacer comprises a chemical vapor deposition (CVD) of at least one of a silicon oxide layer, a polysilicon layer, and a silicon nitride layer.

In yet another embodiment, forming the second sidewall spacer comprises a chemical vapor deposition (CVD) of at least one of a silicon oxide layer, a polysilicon layer, and a silicon nitride layer.

In yet another aspect, a method is described herein. The method comprises: preparing a silicon carbide (SiC) wafer comprising a substrate and a drift layer; forming a well region by performing a first ion-implantation using second conductivity type ions through a first patterned mask layer; forming a source attachment region by performing a second ion-implantation at a non-zero tilt angle through the first patterned mask layer; and forming a source region by performing a third ion-implantation through a first sidewall spacer.

In an embodiment, the source attachment region is formed by performing the second ion-implantation using one of first conductivity type ions and the second conductivity type ions.

In another embodiment, the source region is formed by performing the third ion-implantation using both first conductivity type ions and the second conductivity type ions.

Other features will be apparent from the accompanying drawings and from the detailed description that follows.

BRIEF DESCRIPTION OF THE FIGURES

In the present disclosure, reference is made to the accompanying drawings, which form a part hereof. In the drawings, similar symbols typically identify similar components, unless context dictates otherwise. Various embodiments described in the detailed description, and drawings, are illustrative and not meant to be limiting. Other embodiments may be used, and other changes may be made, without departing from the spirit or scope of the subject matter presented herein. It will be understood that the aspects of the present disclosure, as generally described herein, and illustrated in the figures, can be arranged, substituted, combined, separated, and designed in a wide variety of different configurations, all of which are contemplated herein. The embodiments are illustrated by way of example and not limitation in the figures of the accompanying drawings, in which like references indicate similar elements and in which:

FIG. 2AA illustrates a planar gate silicon carbide (SiC) double implantation metal-oxide-semiconductor field-effect transistor (DMOSFET) comprising a first conductivity type source attachment region, a second conductivity type well region, and a trench region formed, according to one or more embodiments.

FIG. 2AB illustrates a planar gate silicon carbide (SiC) double implantation metal-oxide-semiconductor field-effect transistor (DMOSFET) comprising a first conductivity type source attachment region, a second conductivity type well region, a p-type sinker region and a trench region formed, according to one or more embodiments.

Figure 1A:
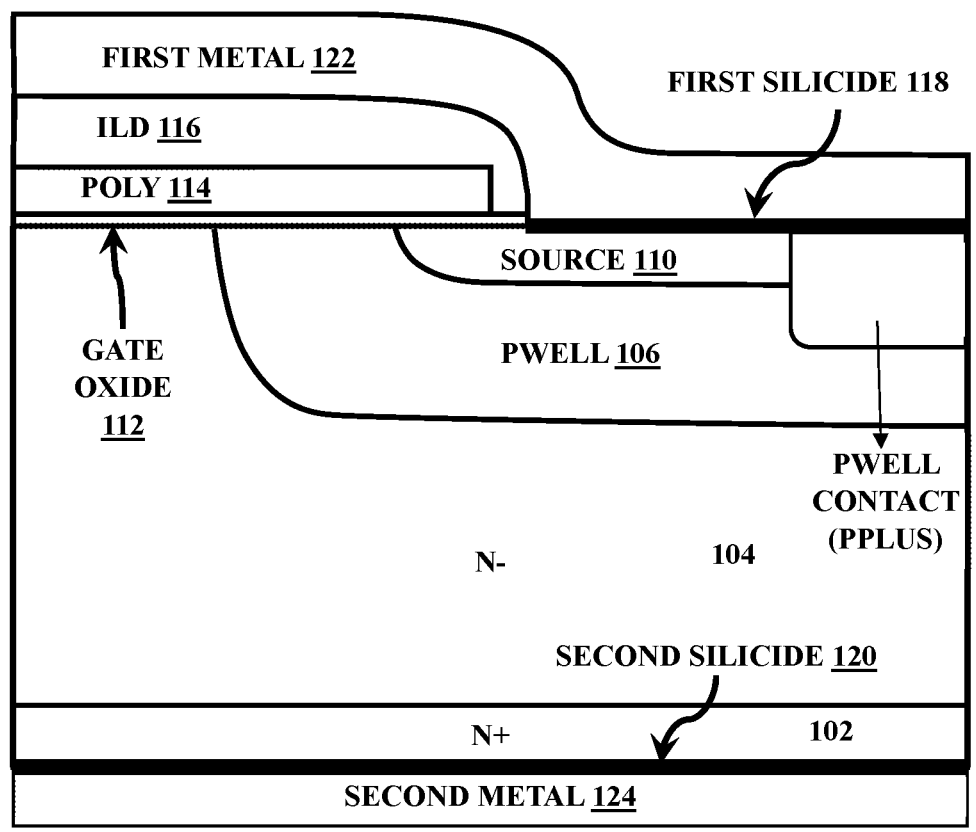
FIG. 1A illustrates a cross-section of a conventional planar gate SiC MOSFET, according to a prior art.

Other features of the present embodiments will be apparent from the accompanying drawings and from the detailed description that follows.

DETAILED DESCRIPTION

Definitions and General Techniques

Unless otherwise defined herein, scientific, and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references cited and discussed throughout the present specification unless otherwise indicated. The nomenclatures used in connection with, and the procedures and techniques of semiconductor device technology, semiconductor processing, and other related fields described herein are those well-known and commonly used in the art.

For simplicity and clarity of illustration, the drawing figures illustrate the general manner of construction. Descriptions and details of well-known features and techniques may be omitted to avoid unnecessarily obscuring the present disclosure. The dimensions of some of the elements in the figures may be exaggerated relative to other elements to help improve understanding of embodiments of the present disclosure. The same reference numeral in different figures denotes the same elements.

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only and is not intended to be limiting. Unless defined otherwise, all technical and scientific terms used herein have the same meaning as commonly understood by one with ordinary skill in the art to which this disclosure belongs.

The articles "a" and "an" are used herein to refer to one or to more than one (i.e., to at least one) of the grammatical object of the article. By way of example, "an element" means one element or more than one element.

The terms "first", "second", "third", and the like in the description and claims, if any, are used for distinguishing between similar elements and not necessarily for describing a particular sequence or chronological order. It is to be understood that the terms so used are interchangeable under appropriate circumstances such that the embodiments described herein are, for example, capable of operation in sequences other than those illustrated or otherwise described herein. Furthermore, the terms "include", "have", and any variations thereof, are intended to cover a non-exclusive inclusion, such that a process, method, system, article, device, or apparatus that comprises a list of elements is not necessarily limited to those elements but may include other elements not expressly listed or inherent to such process, method, system, article, device, or apparatus.

The terms "left", "right", "front", "back", "top", "bottom", "over", "under" and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

No element act, or instruction used herein should be construed as critical or essential unless explicitly described as such. Furthermore, as used herein, the term "set" is intended to include items (e.g., related items, unrelated items, a combination of related items and unrelated items, etc.), and may be used interchangeably with "one or more". Where only one item is intended, the term "one" or similar language is used. Also, as used herein, the terms "has", "have", "having", or the like are intended to be open-ended terms. Further, the phrase "based on" is intended to mean "based, at least in part, on" unless explicitly stated otherwise.

The terms "couple", "coupled", "couples", "coupling", and the like should be broadly understood and referred to as connecting two or more elements mechanically, electrically, and/or otherwise. Two or more electrical elements may be electrically coupled together, but not be mechanically or otherwise coupled together. Coupling may be for any length of time, e.g., permanent, or semi-permanent or only for an instant. "Electrical coupling" includes electrical coupling of all types. The absence of the word "removably", "removable", and the like near the word "coupled", and the like does not mean that the coupling, etc. in question is or is not removable.

As defined herein, two or more elements are "integral" if they are comprised of the same piece of material. As defined herein, two or more elements are "non-integral" if each is comprised of a different piece of material.

The present invention may be embodied in other specific forms without departing from its spirit or characteristics. The described embodiments are to be considered in all respects only as illustrative and not restrictive. The scope of the invention is, therefore, indicated by the appended claims rather than the foregoing description. All variations which come within the meaning and range of equivalency of the claims are to be embraced within their scope.

As defined herein, "approximately" can mean within a specified or unspecified range of the specified or unspecified stated value. In some embodiments, "approximately" can mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

The following terms and phrases, unless otherwise indicated, shall be understood to have the following meanings.

As used herein, the term "unit cell" refers to a piece of a pattern in a semiconductor device, which repeats periodically in the semiconductor device. The unit cell of the SiC MOSFET cross-sections shown herein in this disclosure may be designed with stripe cell or cellular layout topologies. In a stripe cell layout, the source and gate regions are laid out as parallel stripes, in a quasi-2-dimensional topology. On the other hand, cellular layouts are laid out as circular, square, or hexagonal unit cells. Cellular layouts may be formed with the source and body contact regions in the center, surrounded by a lattice of gate regions, for instance. Two or even three level metallization schemes may be used for interconnecting the source and gate unit cells that are separated from each other using appropriate interlevel dielectric layers. The cellular layouts may also be advantageously employed for fabricating the device structures disclosed herein, as these cellular layouts may have the advantage of a larger channel periphery or width which is advantageous for further reduction of the on-state resistance of the SiC planar MOSFETs. Every structural and fabrication aspect disclosed herein in this disclosure is equally applicable for different layout strategies. The unit cell pitch for the SiC MOSFET structures disclosed herein may be designed to be in the range of 3 micrometers to 15 micrometers. The unit cell pitch may be designed to be smaller than 5.0 micrometers in an attempt to increase the channel periphery or width.

As used herein, the term "SiC" refers to silicon carbide. The silicon carbide is a compound semiconductor and is a mixture of silicon and carbon with the chemical formula SiC. Silicon is covalently bonded with carbon. SiC is a polymorphic material, having different crystal organizations, but sharing a common stoichiometry (i.e., all forms contain bilayers of Si and C). SiC exists in a kind of polymorphic crystalline building known as a polytype, e.g., 3C-SiC, 4H-SiC, 6H-SiC. SiC polytypes are wide bandgap semiconductors which can operate at temperatures above 200° C. Each SiC polytype exhibits different electrical properties owing to differences in the stacking sequence and bandgap. Presently 4H-SiC is used in power device manufacturing. Silicon carbide (SiC) based devices can be used for high temperature applications in the field of aircrafts, automotive, space exploration, deep oil, or gas extraction. In 4H-SiC, 4H is written in the Ramsdell classification scheme where the number indicates the layer, and the letter indicates the Bravais lattice. That means in a 4H-SiC structure, four hexagonal layers of SiC are present. Silicon carbide (SiC) offers better overall performance, higher efficiency, higher switching frequencies, and more compact components than Silicon (Si). SiC provides benefits such as reduced switching losses, higher switching frequencies, increased critical breakdown strength, and higher temperature operation over Silicon.

As used herein, the term "substrate" refers to the supporting material on or in which the components of an integrated circuit are fabricated or attached. The substrate may refer to a base material over which a field effect transistor (FET) is fabricated. The term substrate may also refer to a material having a surface that is capable of supporting a component, including a device, component, or an interconnect. The substrate can be one of first conductivity type and second conductivity type (i.e., one of p-type and n-type).

As used herein, the term "JFET" refers to junction gate field-effect transistor which is a three-terminal semiconductor device that can be used as electronically controlled switches, amplifiers, or voltage-controlled resistors. The JFET region can also be referred to as an extent between the well regions of the semiconductor device. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET, and an insulated-gate FET. In the junction FET, the gate is isolated from the channel by a p-n junction. In an insulated-gate FET, the gate is isolated from the channel by an insulating layer so that the gate and channel form a capacitor with the insulating layer as the capacitor dielectric. In other words, the distance between two successive well regions are referred to as the JFET region.

As used herein, the term "MOSFET" refers to metal-oxide-semiconductor field-effect transistor. The MOSFET is a four-terminal device with source (S), gate (G), drain (D) and body (B) terminals. MOSFET is a field-effect transistor with a MOS structure. The body of the MOSFET is frequently connected to the source terminal, making it a three-terminal device like field effect transistor. MOSFETs may be made one of first conductivity type semiconductor and second conductivity type semiconductor (i.e., either p-type or n-type). The MOSFET described herein in this disclosure may be a power MOSFET. The MOSFET may also be one of enhancement mode MOSFET and depletion mode MOSFET.

As used herein, the term "DMOSFET" refers to double-implantation metal oxide semiconductor field-effect transistor. The "DMOSFET" refers to the MOSFET that is formed by using a double implantation process. For example, the DMOSFET is a device where the well regions and source regions are obtained by a double implantation process (i.e., implantation of the well region followed by implantation of the source region). A common physical structure of SiC MOSFETs is the planar double-implanted MOSFET in 4H-SiC (SiC-DMOSFET).

As used herein, the term "dopant" refers to an impurity added from an external source to a material by diffusion, coating, or implanting into a substrate, and changing the properties thereof "Dopant" may refer to ions, atoms, compounds, or any aggregates or combinations of these that are introduced into a material, to affect the material's chemical, electrical or physical properties. The term "dopant" comprises atoms, compounds, or any aggregates or combinations of these that are introduced in a semiconductor to affect the semiconductor's electrical characteristics, such as the semiconductor's electrical conductivity and resistance. In semiconductor technology, an impurity may be added to a semiconductor to modify its electrical properties or to a material to produce a semiconductor having desired electrical properties. N-type (negative) dopants (e.g., such as phosphorus for a group IV semiconductor, nitrogen, phosphorus, antimony, and arsenic) typically come from group V of the periodic table. When added to a semiconductor, n-type (negative) dopants create a material that contains conduction electrons. P-type (positive) dopants (e.g., such as boron or aluminium for a group IV semiconductor) typically come from group III and result in conduction holes (i.e., vacancies in the electron shells). Dopant may also be a combination of n-type dopant and p-type dopant.

As used herein, the term "drain" refers to the electrode of a field effect transistor which receives charge carriers that pass through the transistor channel from the source electrode. The term "drain" refers to an electrode through which charge carriers leave the channel. The drain may also refer to a region in a semiconductor layer where the resistivity is lower than or equal to a predetermined value.

As used herein, the term "source" refers to the active region/electrode to which the source of charge carriers is connected in a field effect transistor. The term "source" refers to an electrode through which charge carriers enter the channel. The source may also refer to a region in a semiconductor layer where the resistivity is lower than or equal to a predetermined value.

As used herein, the term "gate" refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof. The term "gate" may also refer to an electrode that controls the conductivity between the source and the drain.

As used herein, the term "impurity" refers to a foreign material present in a semiconductor crystal. The foreign material may be such as boron or arsenic in silicon, which is added to the semiconductor to produce either p-type or n-type semiconductor material. The foreign material may also be added to the semiconductor to otherwise result in material whose electrical characteristics depend on the impurity dopant atoms. The impurity atoms are the atoms of a different element than the atoms of the intrinsic semiconductor.

As used herein, the term "p-n junction" refers to the interface and region of transition between p-type and n-type semiconductors inside a single crystal of semiconductor.

The term "p-n junction" further refers to a contact surface between a p-type and an n-type semiconductor. The p-n junction is the basic building block employed in many semiconductor devices. The "p" in the term p-n junction refers to a semiconductor material that has positively charged current carriers (i.e., p-type) and the "n" in the term p-n junction refers to a semiconductor material that has negatively charged current carriers (i.e., n-type). When the two materials are brought together, the p-n junction is formed. By applying a voltage to the p-n junction, the device will provide a flow of electricity in one direction but not in the opposite direction. By way of analogy, diodes (i.e., p-n junctions) are viewed as electrical check valves that are used to turn the flow of electricity ON or OFF.

As used herein, the term "polysilicon" refers to a polycrystalline form of silicon. Polysilicon, doped degenerately with phosphorus or boron, is widely used as gate electrodes and interconnections in metal-oxide-semiconductor circuits. The reason for selecting heavily doped polysilicon in the semiconductor devices is that the threshold voltage of the MOS transistor is correlated with the work function difference between the gate and the channel.

As used herein, the term "p-type" refers to the impurities that when added to an intrinsic semiconductor creates deficiencies of valence electrons. In the "p-type" semiconductor, the majority charge carriers are holes whereas minority charge carriers are electrons. In the case of the p-type semiconductor, the majority of charge carriers move from high potential to low potential. Examples of p-type dopants, i.e., impurities, include, but are not limited to, Boron, Aluminium, Gallium, Indium, etc.

As used herein, the term "n-type" refers to the addition of impurities that contributes free electrons to an intrinsic semiconductor. In the "n-type" semiconductor, the majority charge carriers are electrons whereas minority charge carriers are holes. In the case of n-type semiconductor, the majority of charge carriers move from low potential to high potential. Examples of "n-type" impurities comprises Antimony, Arsenic, Bismuth, Phosphorous, Nitrogen etc.

As used herein, the term "bandgap" refers to the difference between the energy levels of electrons bound to their nuclei (valence electrons) and the energy levels that allow electrons to migrate freely (conduction electrons). The band gap depends on the particular semiconductor involved. The "bandgap" refers to an energy difference (typically expressed in electron volts, eV) between the valence band and the conduction band of a semiconductor material. The bandgap energy represents the minimum amount of energy needed for an electron to jump from the valence band to the conduction band.

As used herein, the term "MOSFET channel" refers to a metal-oxide-semiconductor field-effect transistor channel that defines an extent between an edge of the source region, and an edge of the well region. The MOSFET channel refers to a region between a source and a drain of a metal oxide semiconductor transistor that becomes conductive when the transistor is turned on. The MOSFET channel may be designed to enhance mobility of ions. The MOSFET channel of a device is preferred to be as short as possible.

As used herein, the term "chip" refers to a single crystal substrate of semiconductor material on which one or more active or passive solid-state electronic devices are formed. A chip may contain an integrated circuit. A chip is not normally ready for use until packaged and provided with external connectors. The chip may be an integrated circuit (IC) in which hundreds to millions of devices are integrated into one chip. If desired, the integrated circuit may be a semiconductor chip packaged in a flip chip form. For example, the integrated circuit may, be, but is not limited to, an application processor chip such as a central processor (e.g., CPU), a graphics processor (e.g., GPU), a digital signal processor, a cryptographic processor, a microprocessor, etc.

As used herein, the term "contact" refers to the point or part of a conductor which touches another electrical conductor or electrical component to carry electrical current to or from the conductor or electrical component. The term "contact" may also refer to a low resistance junction (non-rectifying) that provides current conduction from metal to semiconductor and vice versa. The contact may be an ohmic contact (which includes a silicide contact), a Schottky contact, etc.

As used herein, the term "drift layer" refers to a lightly doped region to support the high voltage in power MOSFET. The "drift layer" refers to a thick and low doped epitaxial layer which causes an increase in the on-resistance. The drift layer (e.g., n− drift layer) refers to a layer introduced between the heavily doped (p+) and (n+) layers.

As used herein, the term "well" refers to certain regions in a semiconductor device where metal-oxide-semiconductor (MOS) transistors are created. A PMOS (positive-channel MOS) transistor is made in an n-doped region, called "n-well" region. Similarly, an NMOS transistor (negative-channel MOS) is made in a p-doped region called "p-well". The well region ensures that the leakage between two transistors, through the bottom side, is low due to the reverse bias between the transistor areas and the well region.

As used herein, the term "interconnect" refers to an electrically conducting structure capable of establishing an electrical connection with another component or between components. In particular, an interconnect may establish electrical contact between components (e.g., circuit elements, transistors, etc.) that are separate. For example, the interconnect refers to a structure that interconnects many MOSFETs using fine-line metal patterns. Depending on the desired device specifications, operation, and application, an interconnect is made from a suitable material. Suitable conductive materials include semiconductors and metallic conductors. For example, the interconnect may be one of aluminum and an aluminum-based alloy.

As used herein, the term "self-aligned" refers to a technique comprising processing steps used in manufacturing of semiconductor devices. It is often necessary to achieve precise alignment between structures fabricated at different lithographic stages of integrated circuit fabrication. Stringent requirements on lithographic alignment tolerance can be relaxed if the structures are "self-aligned" which means one is forced into a specific position relative to the other for a wide range of lithographically defined positions. In other words, the term "self-aligned" refers to formation of precise alignment of a region with another region while performing lithographic stages of integrated circuit fabrication without any specific steps involved for alignment.

As used herein, the term "device" refers to the physical realization of an individual electrical element in a physically independent body which cannot be further divided without destroying its stated function. The device may be a power semiconductor device such as a MOSFET.

As used herein, the term "dielectric" refers to a non-conductor of electricity, otherwise known as an insulator. The term "dielectric" refers to a non-metallic material having insulating properties. The dielectric may be one of organic dielectric and an inorganic dielectric. Some liquids and gases can also serve as dielectric. Specific examples of organic dielectric materials include, but are not limited to, porcelain (ceramic), mica, glass, plastics, and the oxides of various metals. The inorganic dielectric comprises a dielectric material substantially free of carbon. Specific examples of inorganic dielectric materials include, but are not limited to, silicon nitride, silicon dioxide, silicon oxynitride, silk, silk composite, elastomers, and polymers.

As used herein, the term "mobility" refers to a measure of the velocity with which charge carriers, for example, holes (or units of positive charge) in the case of a p-type semiconductor material, and electrons in the case of an n-type semiconductor material, move through the material under the influence of an electric field. This parameter, which depends on the device architecture, can be measured using a field-effect device or space-charge limited current measurements. Electrons and holes typically have different mobilities in the same semiconductor.

As used herein, the term "ion-implantation" refers to a process by which ions of a material are implanted into another solid material, causing a change in at least one of the surface physical and chemical properties. The ion-implantation may also refer to a technique for injecting energetic ions into the surface of a solid target to modify or change the near-surface chemical composition or the defect state of the target material. Every instance of ion-implantation within this document may refer to a single or a chained sequence of multiple ion-implantation steps, which may be designed as appropriate for realizing a box-implant profile, retrograde implant profile or any combination thereof. While specific and pertinent instances are described explicitly and more fully, we refer to single or chained implantation unless otherwise specified. Further, the ion-implantation may be conducted at a temperature ranging from room-temperature to 1000° C. High-temperature ion-implantation of dopants into SiC is typically conducted to minimize implantation induced lattice damage and to promote some dynamic annealing of the damage during the implantation process itself. Ion-implantation of dopants into silicon carbide is typically followed by a high-temperature annealing step at temperatures in the range of 1600° C. to 2100° C. after protecting the SiC surface with a carbon film for a duration ranging from few minutes to an hour. This annealing step is necessary for electrical activation of the ion-implanted dopants and for alleviating the implant-induced lattice damage to the SiC crystal lattice.

As used herein, the term "RIE" refers to reactive ion etching. RIE is an etching technology used in microfabrication. RIE is a type of dry etching which has different characteristics than wet etching. RIE uses chemically reactive plasma to remove material deposited on wafers. The plasma is generated under low pressure by an electromagnetic field. The different types of RIE equipment include those wherein the plasma is generated using capacitively coupled electrodes or inductive coupling when a higher plasma density is desired. High-energy ions from the plasma attack the wafer surface and react with the material. Reactive ion etching may also refer to a method of etching a material by ionizing and radicalizing a gas with plasma. Reactive ion etching may generally refer to the removal of materials by the action of chemically active ions and/or free radicals, which can react with undesired materials to facilitate the removal of the material. When using reactive chemicals, one purpose of the ions may be to activate the surface of the reaction.

As used herein, the term "ILD" refers to interlayer dielectric. The ILD is a dielectric material used to electrically separate closely spaced interconnect lines arranged in several levels (multilevel metallization) in an advanced integrated circuit. The interlayer dielectric material used in semiconductor integrated circuit devices is predominantly $SiO_2$, which is generally formed using chemical vapor deposition (CVD) or plasma enhanced techniques and has the requisite mechanical and thermal properties to withstand various processing operations associated with semiconductor manufacturing. The SiO2 film may be preferably doped with boron and/or phosphorus. The ILD film may then be subjected to a heat treatment step at temperatures ranging from 800° C. to 1100° C. in order to reflow the film and remove any sharp edges formed during dry etch patterning of the ILD film.

As used herein, the term "CVD" refers to chemical vapor deposition, a method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber. "CVD" refers to a process in which one or more reactants continuously form a film on a substrate by reaction in a process chamber containing the substrate or on the surface of the substrate. The term "chemical vapor deposition (CVD)" may also refer to a layer on a substrate, without the need to separate the reaction components from the vaporized metal precursor compound (and other optionally used reactant gases) in the deposition chamber. Every instance of CVD described within this document may refer to any type of chemical vapor deposition (such as plasma-enhanced chemical vapor deposition, low pressure chemical vapor deposition, atmospheric pressure CVD (APCVD), and plasma enhanced CVD (EPCVD), metal-organic CVD (MOCVD), etc.), which may be designed as appropriate for realizing the film. While specific and pertinent instances are described explicitly and more fully, we refer to any type of CVD unless otherwise specified.

As used herein, the term "PECVD" refers to a plasma-enhanced chemical vapor deposition process used to deposit thin films from a gas state (vapor) to a solid state on a substrate. Chemical reactions are involved in the process, which occur after creation of a plasma of the reacting gases. Plasma Enhanced Chemical Vapor Deposition (PECVD) is a process by which thin films of various materials can be deposited on the substrate at lower temperatures than that of standard Chemical Vapor Deposition (CVD). The deposition may be achieved by introducing reactant gases between parallel electrodes—a grounded electrode and an RF-energized electrode. The capacitive coupling between the electrodes excites the reactant gases into a plasma, which induces a chemical reaction and results in the reaction product being deposited on the substrate. In other words, "Plasma-Enhanced Chemical Vapor Deposition" or "PECVD" refers to a method of vapor deposition used to deposit a thin film coating on an array of substrate, wherein the thin film coating is produced from the chemical reaction of gases.

As used herein, the term "LPCVD" refers to low pressure chemical vapor deposition technology that uses heat to initiate a reaction of a precursor gas on the solid substrate. The reaction initiated at the surface forms the solid phase material. LPCVD may be used to deposit a wide variety of materials including polysilicon for gate contacts, thick oxides used for isolation, doped oxides for global planarization, nitrides, and other dielectrics.

As used herein, the term "source attachment region" refers to a region in contact with a main source region. The source attachment region may be doping using one of first conductivity type ions (e.g., n-type ions), and second conductivity type ions (e.g., p-type ions). The source attachment region reduces the depletion width in the second conductivity type well region and enables a smaller minimum channel width. The source attachment region is adapted to provide the minimum channel width without undesirable Vth roll-off effects.

As used herein, the term "well attachment region" refers to a region in contact with a well region. The well attachment region may be connected to the well region outside the MOSFET channel region. The well attachment region and the well region may be doped using the same conductivity type ions.

As used herein, the term "sinker" refers to deep implanted regions at key locations within the DMOSFET structure. The sinker region is adapted to reduce the electric field close to the gate region and make the device robust and reliable. The sinker region is adapted to move the peak electric field location from the corner of the well region to the sinker region during high drain bias (i.e., peak electric field is moved away from the gate region). In other words, the term "sinker" refers to appropriately designed doped regions placed strategically within the semiconductor device that result in "sinking" the electric field from the surface of the semiconductor to deeper within the epitaxial layers.

As used herein, the term "trench" refers to electrical isolation of electronic components in a monolithic integrated circuit by the use of grooves or other indentations in the surface of the substrate. The trench may or may not be filled with electrically insulative (i.e., dielectric) material. The trench can be a recess formed in the substrate such as by etching, a space on or above the substrate formed for example by depositing two adjacent elements on or above the substrate, or a combination thereof. The trench can be of any shape or size as long as it separates two adjacent elements.

FIG. 1A illustrates a cross-section of a conventional planar gate SiC MOSFET, according to a prior art. The planar gate SiC MOSFET, shown in FIG. 1A, comprises a first conductivity type substrate 102, and a first conductivity type drift region 104. The planar gate SiC MOSFET, shown in FIG. 1A, comprises a second conductivity type well region 106 within the first conductivity type drift region 104. The second conductivity type well region 106 comprises a source region 110 inside the second conductivity type well region 106, from a perspective of a half unit cell view, as shown in FIG. 1A. From a geometric structural standpoint, the second conductivity type well region 106 is defined by one geometric boundary that surrounds the second conductivity type well region 106 and meets with the first conductivity type drift region 104, a gate oxide layer 112, and the source region 110. A portion of the boundary of the second conductivity type well region 106 which meets the first conductivity type drift region 104 is a curve. The curve of the second conductivity type well region 106 has no sudden change of its curvature over its full extent. The boundary of the second conductivity type well region 106 between the first conductivity type drift region 104 and the second conductivity type well region 106 meets the gate oxide layer 112 with zero or near-zero curvature.

The source region 110, as shown in FIG. 1A, comprises a boundary which meets with the second conductivity type well region 106, the gate oxide layer 112, and the silicide region 118 (denoted as first silicide). A portion of the boundary of the source region 110 is a curve where the curve separates the source region 110 from the second conductivity type well region 106. The curve of the source region 110 has no sudden change of its curvature over its full extent. In addition, the curved boundary between the source region 110 and the second conductivity type well region 106 meets the gate oxide layer 112 with zero or near-zero curvature.

The second conductivity type well region 106 may be formed with a constant level of doping concentration throughout the second conductivity type well region 106 or with a non-uniform doping concentration as a function of the depth of the well region. The second conductivity type well region 106 further forms a p-n junction with the first conductivity type drift region 104. The source region 110 further forms a p-n junction with the second conductivity type well region 106. Other than the aforementioned details about the second conductivity type well region 106 and the source region 110, the rest of the elements of the planar gate SiC MOSFET may follow a convention that is widely accepted by the power semiconductor device community. The other elements of the planar gate SiC MOSFET comprise, but are not limited to, the first conductivity type substrate 102, first conductivity type drift region 104, gate oxide layer 112, polysilicon layer 114, silicide regions (118, 120) on the front side and the back side of the SiC wafer, the ILD layer 116, and the metal layers (122, 124) on the front side and the back side of the SiC wafer. The formation of the depletion region around the p-n junction incurs undesirable VTH roll-off issues as explained in FIG. 1B.

Figure 1B:
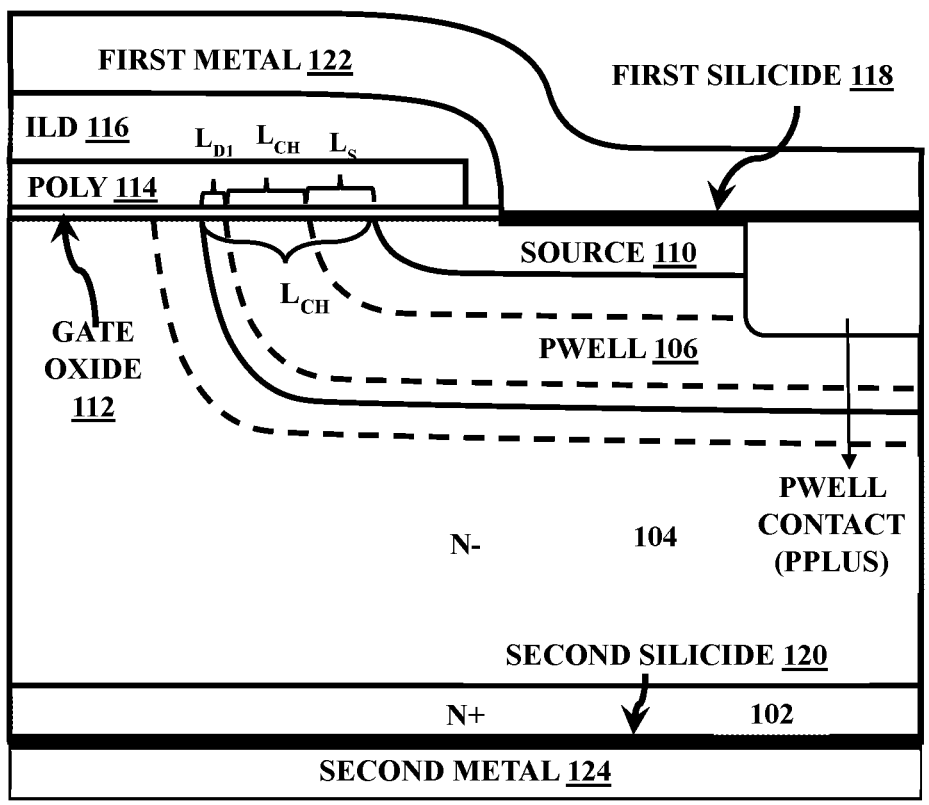
FIG. 1B illustrates a cross-section of a planar SiC DMOSFET with depletion region boundaries marked as dashed lines, according to a prior art.

FIG. 1B illustrates a cross-section of a planar SiC DMOSFET with depletion region boundaries marked as dashed lines, according to a prior art. The DMOSFET shown in FIG. 1B comprises a source region 110. The source region 110 performs two main functions. The first function is to delineate an edge of the MOSFET channel. The second function is to create a highly doped surface layer to minimize the ohmic contact resistance. The highly doped source regions are typically used with doping concentrations in the low to mid $10^{19}$ cm$^{-3}$ range. The highly doped source regions are essential for forming low resistance ohmic contacts. However, there are implications of using these heavily doped source regions, when it comes to defining an electrically active MOSFET channel length, (also called the effective channel length or $L_{eff}$). The aforementioned shortcomings can be understood by those in the field of the invention as follows.

Under zero (electrical) bias, the DMOSFET comprises a depletion region that surrounds the p-n junction formed at the Source/pwell p-n junction. The width of the depletion region formed is inversely proportional to doping concentration on either side of the p-n junction. The depletion region primarily extends into the second conductivity type well region 106 (i.e., pwell region) when heavily doped source regions are used. The depletion region, primarily extending into the second conductivity type well region 106, effectively reduces the $L_{eff}$ by the width of the depletion region. The effective reduction (shrinking) of the channel length incurs undesirable VTH roll-off issues. The channel length reduction is comparable to the width of the depletion region in the second conductivity type well region 106. A second depletion region is formed on the other side between the second conductivity type well region 106 and the first conductivity type drift region 104. The second depletion region mostly extends into the first conductivity type drift region 104 since the doping concentration of the first conductivity type drift region 104 is significantly lower than the second conductivity type well region 106. The higher bandgap of SiC as compared to Si results in larger zero-bias depletion widths in SiC, as compared to Si, and this sets a lower limit on the channel length that can be designed for reliable operation.

A first-order equation can be derived for the effective channel length considering the extent of the depletion region in the second conductivity type well region as follows:

$$L'_{CH} = L_{CH} - \sqrt{\frac{2V\epsilon}{qN_A}} - \sqrt{\frac{2V\epsilon}{qN_A\left[1 + \frac{N_A}{N_D}\right]}}$$

Where NA is a doping concentration of second conductivity type well region, ND is a doping concentration of a drift region, V is the (zero-bias) built-in voltage of a 4H-SiC p-n junction, epsilon $\epsilon$ is the dielectric constant of 4H-SiC, and q is the electronic charge.

Figure 1C:
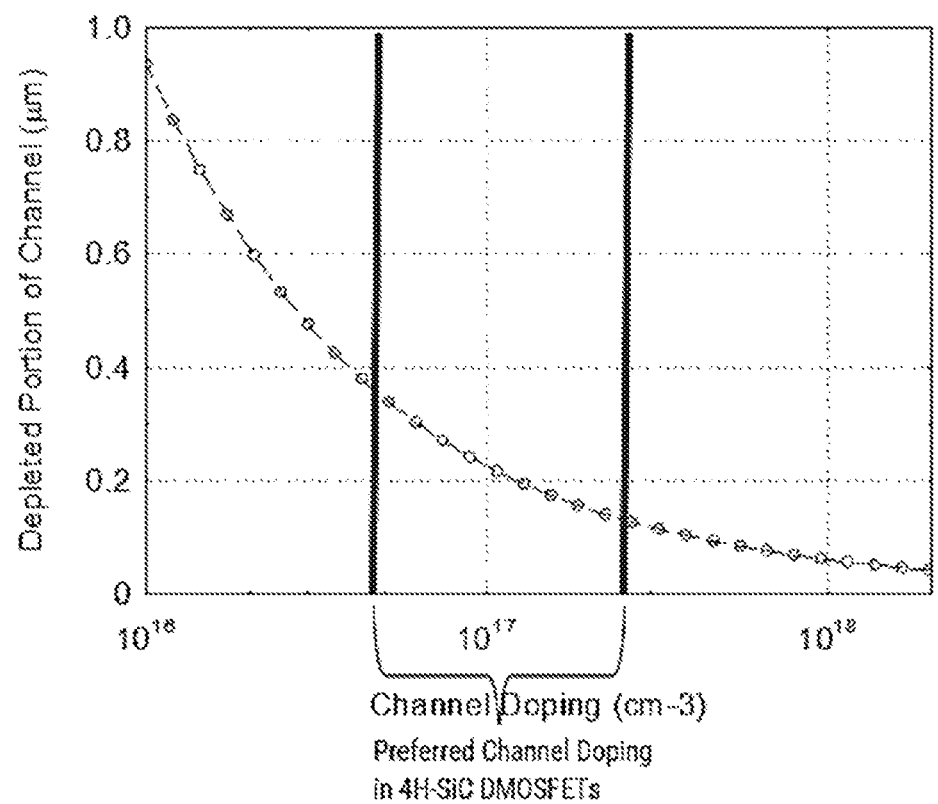
FIG. 1C illustrates a graphical representation depicting a plot of depleted portion of the MOSFET channel versus channel doping, according to one or more embodiments.

FIG. 1C illustrates a graphical representation depicting a plot of depleted portion of the MOSFET channel versus channel doping, according to one or more embodiments. FIG. 1C shows that the depleted portion of MOSFET channel decreases when the doping concentration of the channel is increased. The extent of the depletion region can be minimized by increasing NA to greater than 1E18 cm-3. NA is a doping concentration of second conductivity type well region. The SiC DMOSFET fabricated with such NA values (e.g., 1E18 cm-3) may result in a higher threshold voltage VTH than acceptable VTH. FIG. 1C shows an analytical calculation of the depleted portion of the MOSFET channel as a function of channel doping. It is evident from FIG. 1C, the preferred channel doping concentration is around 1017 cm-3.

Figure 2A:
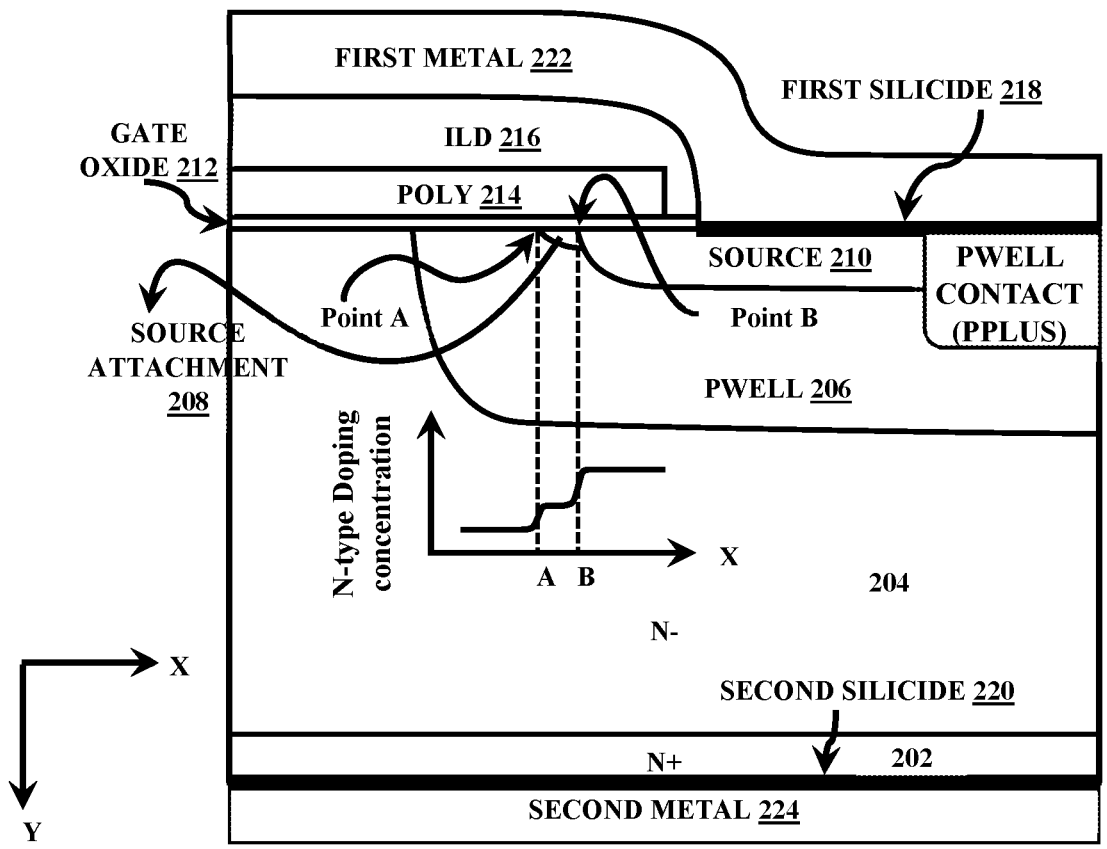
FIG. 2A illustrates a planar gate silicon carbide (SiC) double implantation metal-oxide-semiconductor field-effect transistor (DMOSFET) comprising a first conductivity type source attachment region and a second conductivity type well region formed, according to one or more embodiments.
Figure 2A:
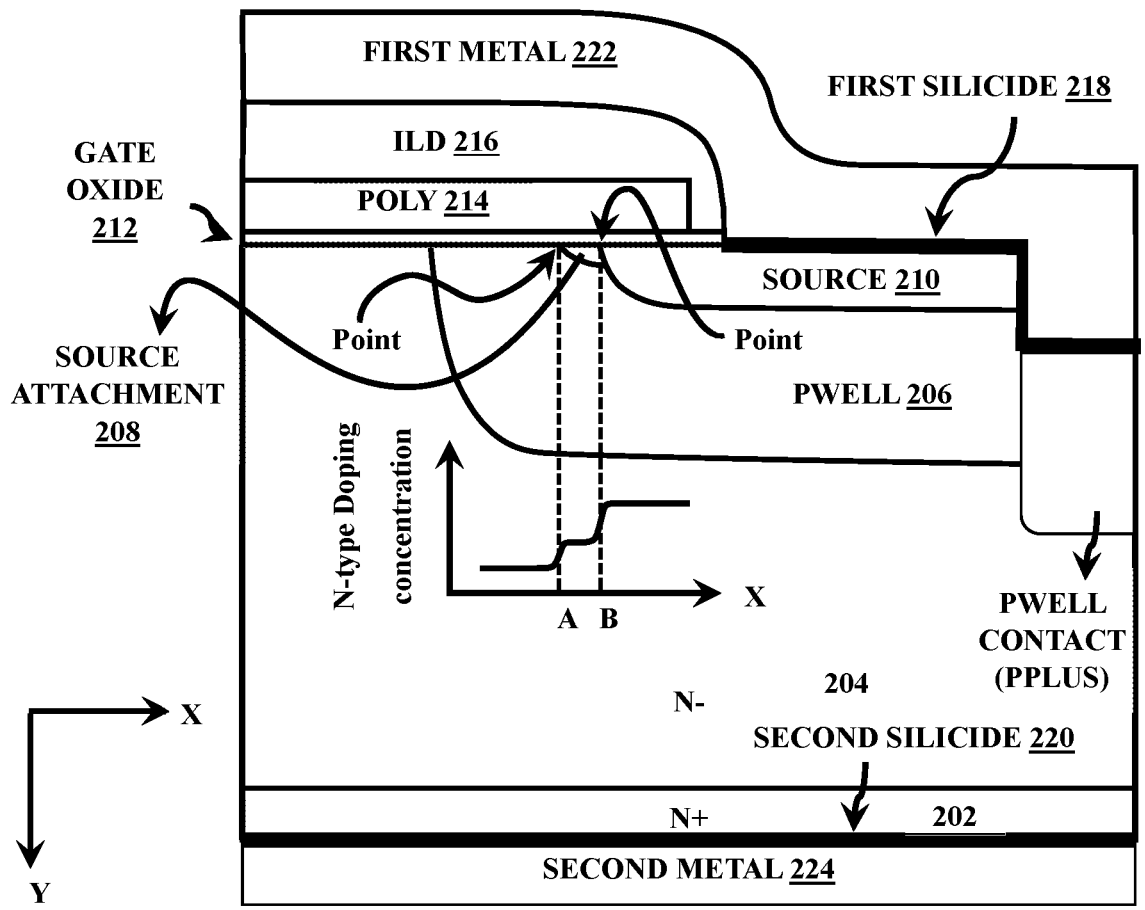
Figure 2A:
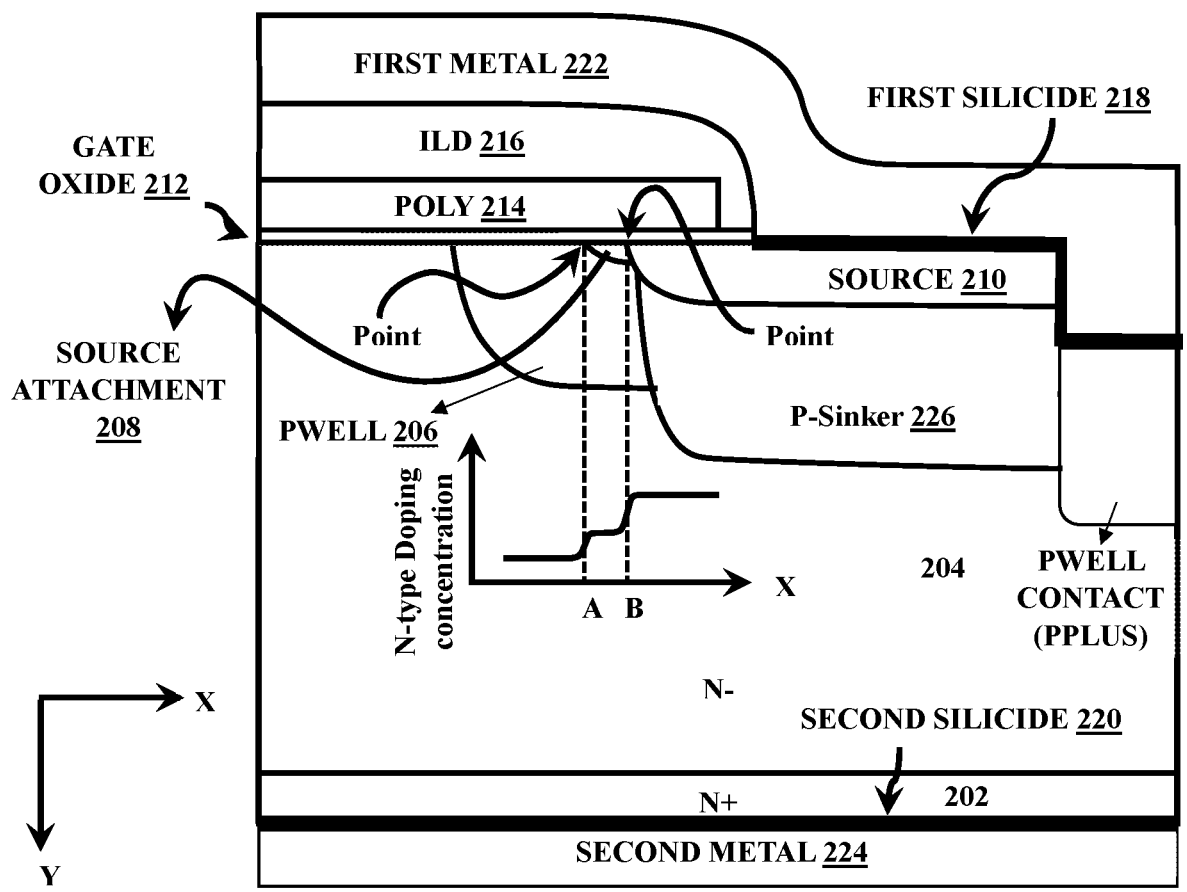

FIG. 2A illustrates a planar gate silicon carbide (SiC) double implantation metal-oxide-semiconductor field-effect transistor (DMOSFET) comprising a first conductivity type source attachment region and a second conductivity type well region formed using different masks, according to one or more embodiments. The planar gate SiC DMOSFET shown in FIG. 2A comprises a source attachment region 208. The SiC DMOSFET further comprises the second conductivity type well region 206. The second conductivity type well region 206 surrounds a source region 210. The SiC DMOSFET further comprises a well contact region, gate oxide layer 212, a polysilicon layer 214, an inter-layer dielectric (ILD) 216, silicide layers (218, 220), and interconnect metal layers (222, 224).

In an embodiment, the source attachment region 208 is doped using first conductivity type ions (e.g., n-type ions). The source attachment region 208 is physically and laterally connected to the source region 210. In an embodiment, the source region 210 may be doped using first conductivity type ions (i.e., n-type ions). In an embodiment, the source region 210 may be formed by ion-implantation using both first conductivity type ions and second conductivity type ions. In one example and preferred implementation of the source region 210, the ion-implantation energy for the second conductivity ions may be in the range of 200 kiloelectron-volt to 3000 kiloelectron-volt, whereas the ion-implantation energy for the first conductivity ions may be in the range of 10 kiloelectron-volt to 200 kiloelectron volt. Furthermore, the source region 210 may comprise multiple ion-implantation steps using the first (and or second) conductivity type ions, in a chained sequence, with each sequence being defined by a combination of a specific implanted species, an ion-implantation energy and an ion-implantation dose. The source attachment region 208 is connected to the source region 210 between an edge of the source region 210 and an edge of the second conductivity type well region 206. The source attachment region 208 comprises a depth shallower than a depth of the source region 210. In an embodiment, the source attachment region 208 comprises the depth equal to the depth of the source region 210. The source attachment region 208 further comprises a doping concentration lower than a doping concentration of the source region 210. In an embodiment, the source attachment region 208 further comprises a doping concentration equal to the doping concentration of the source region 210. The SiC DMOSFET, shown in FIG. 2A, comprises a metal-oxide-semiconductor filed-effect transistor (MOSFET) channel.

The MOSFET channel extends from an edge of the second conductivity type well region 206 to an outer edge of the source attachment region 208. The SiC DMOSFET, shown in FIG. 2A, comprises the source region 210 formed physically and laterally spaced apart from the leftmost edge of the source attachment region 208. In an embodiment of the SiC DMOSFET having the p-type source attachment region, the MOSFET channel has an extent that is equal to the sum of the second conductivity type well region 206 and the p-type source attachment region. The process of fabrication of the planar gate SiC DMOSFET shown in FIG. 2A is described in detail in FIG. 5A to 5S.

The source attachment region shown in FIG. 2A allows greater freedom to the designer for optimizing the source region 210 and the source attachment region 208 separately. In an embodiment, the doping concentration of the source attachment region 208 is lower when compared to the doping concentration of the source region 210. The lower doping concentration of the n-type source attachment region enables the depletion region to extend into the source attachment region 208. The extension of the depletion region into the source attachment region 208 reduces the depletion width in the second conductivity type well region 206. The reduction of the depletion width in the second conductivity type well region 206 enables a minimum MOSFET channel length without undesirable Vth roll-off effects.

The SiC DMOSFET, shown in FIG. 2A, comprising the source attachment region 208 with lower doping concentration may be an effective solution in minimizing the VTH roll-off issues. The SiC DMOSFET, shown in FIG. 2A, is an effective solution even if a portion of its implant mask has a slanted sidewall region. As the source attachment region 208 may be formed using low energy ion-implantation, the ion penetration through the slanted sidewall portion of the implant mask can be minimized, leading to a reduction of lateral staggering of the implanted source ions into the channel region.

The SiC DMOSFET requires a high-quality source ohmic contact (with low contact resistance). In the SiC DMOSFET formed using this embodiment as shown in FIG. 2A, the high-quality source ohmic contact is achieved by performing a high dose/low energy implantation to form the source region 210, while a low-dose ion-implantation can be used for the source attachment region 208. The difference in doses is used with the sole objective of accommodating a significant portion of the zero-bias depletion width, thereby reducing the extent of the depletion width in the channel region. This will reduce the magnitude of the VTH roll-off effect, pushing it to smaller channel lengths.

In an embodiment, the SiC DMOSFET does not require an additional photo mask step for the formation of the source region 210, the second conductivity type well region 206 and the source attachment region 208. The SiC DMOSFET having the source attachment region 208, shown in FIG. 2A, fabricated via the fabrication steps described in FIG. 5A to 5S minimizes overall complexity of the entire process flow of fabrication from the standpoint of the number of photo mask steps needed. The fabrication steps illustrated in FIG. 5A to 5S leads to yield improvement and manufacturing cost savings.

Figure 5A:
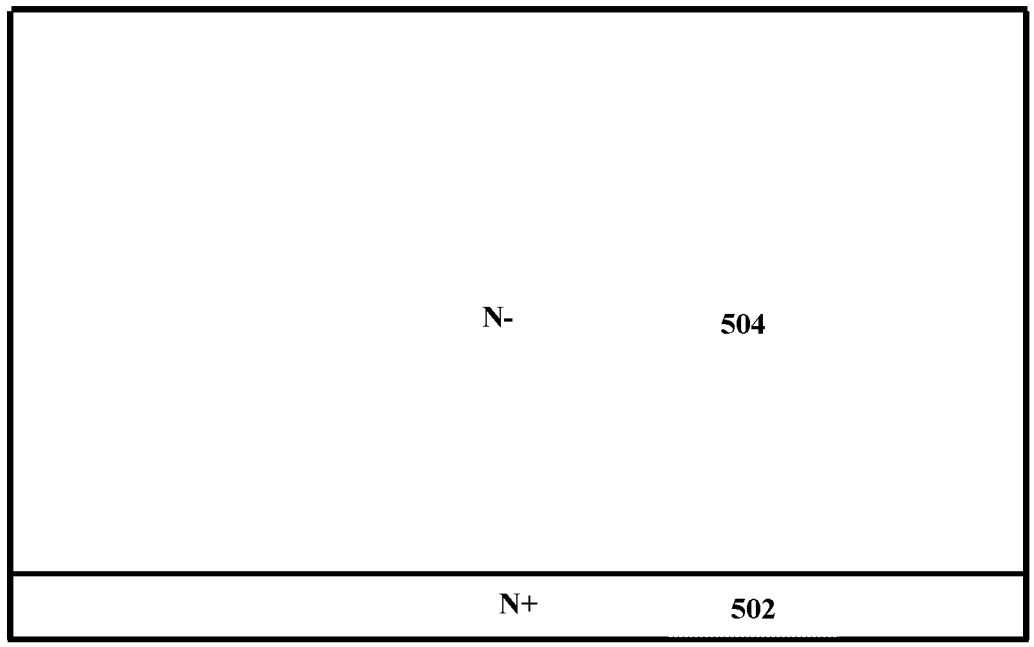
FIG. 5A-5S illustrates a fabrication process of a silicon carbide (SiC) DMOSFET shown in FIG. 2A, according to one or more embodiments.

The SiC DMOSFET having the source attachment region 208 with doping concentration less than or equal to the doping concentration of source region 210 enables the designer to fine-tune the channel lengths of the MOSFET channel. The source attachment region 208 formed with lower doping concentration enables the designer to minimize the lateral staggering of the implanted ions into the channel region. The minimization of the lateral staggering of the implanted ions into the channel region enables the channel length to be directly defined. The source attachment region 208 formed, via fabrication steps illustrated in FIG. 5A to 5S, further enables a minor tuning of the channel length. The SiC DMOSFET comprises the sharp drop of VTH within the deep submicron regime. The capability to fine-tune the channel lengths, achieved via the device fabrication process as illustrated in FIG. 5A to 5S, may endow a SiC MOSFET device engineer with a solution to better control the VTH. The SiC DMOSFET, shown in FIG. 2A, may be a better solution to mitigate the VTH roll-off issue that arises from modern planar gate SiC MOSFETs with deep submicron channel.

FIG. 2AA illustrates a planar gate silicon carbide (SiC) double implantation metal-oxide-semiconductor field-effect transistor (DMOSFET) comprising a first conductivity type source attachment region, a second conductivity type well region, and a trench region formed, according to one or more embodiments. FIG. 2AA illustrates a similar SiC DMOSFET structure as shown in FIG. 2AA but with the addition of a trench region etched into the SiC, under which the well contact region is placed. The trench region may be formed by etching the surface of the SiC wafer. In an embodiment, a depth of the trench region may be deeper than a depth of the source region.

FIG. 2AB illustrates a planar gate silicon carbide (SiC) double implantation metal-oxide-semiconductor field-effect transistor (DMOSFET) comprising a first conductivity type source attachment region, a second conductivity type well region, a p-type sinker region and a trench region formed, according to one or more embodiments. FIG. 2AB illustrates a similar SiC DMOSFET structure as shown in FIG. 2AB but with the addition of a p-type sinker region placed directly underneath the source region. The trench region may be formed by etching the surface of the SiC wafer. In an embodiment, a depth of the trench region may be deeper than a depth of the source region. It should be understood that incorporating the trench region with the well contact region underneath and a p-type sinker region formed under the source region may be advantageous for electric field shaping during the blocking mode of operation of the SiC DMOSFET.

Figure 2B:
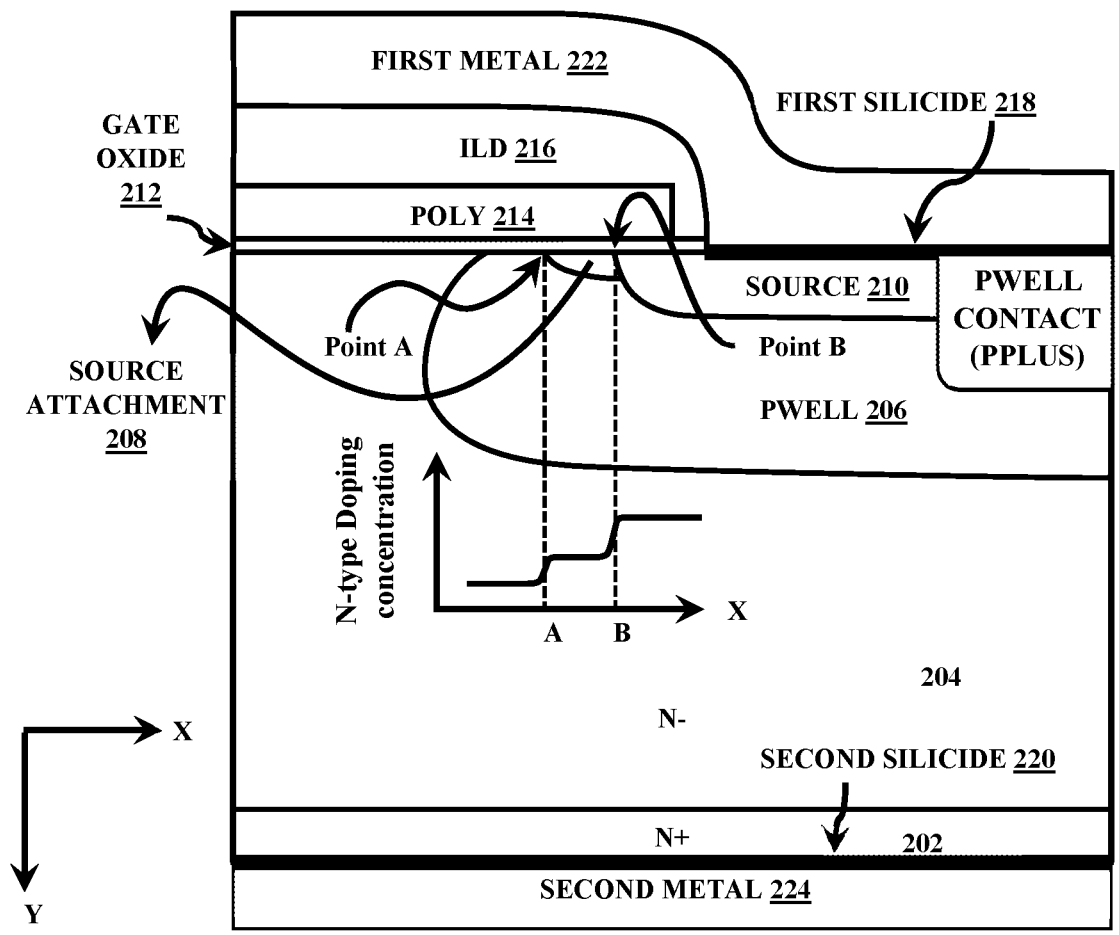
FIG. 2B illustrates a planar gate silicon carbide (SiC) double implantation metal-oxide-semiconductor field-effect transistor (DMOSFET) comprising a first conductivity type source attachment region and a second conductivity type well region formed, according to one or more embodiments.

FIG. 2B illustrates a planar gate silicon carbide (SiC) double implantation metal-oxide-semiconductor field-effect transistor (DMOSFET) comprising a first conductivity type source attachment region and a second conductivity type well region formed, according to one or more embodiments. The planar gate SiC DMOSFET shown in FIG. 2B comprises a source attachment region 208. The source attachment region 208 is doped using first conductivity type ions (e.g., n-type ions). The source attachment region 208 is physically and laterally connected to a source region 210. It should be noted that the embodiment shown in FIG. 2B, and other embodiments of this invention may also feature the trench region and the p-type sinker region as shown in FIGS. 2AA and 2AB. These regions are omitted from the remaining figures of this document, in an effort to make the figures more readable. It should be understood that incorporating the trench region with the well contact region underneath and a p-type sinker region formed under the source region may be advantageous for electric field shaping during the blocking mode of operation of the SiC DMOSFET.

The difference between the SiC DMOSFET shown in FIG. 2B, and the SiC DMOSFET shown in FIG. 2A, is that an ion implantation performed for forming a second conductivity type well region 206 in FIG. 2B is performed using an angled implantation (i.e., at non-zero tilt angle). Whereas in FIG. 2A, an ion implantation performed for forming the second conductivity type well region 206 is performed in a direction orthogonal to the SiC wafer. In FIG. 2B, the source attachment region 208 and the second conductivity type well region 206 are formed over the same patterned mask. For the SiC DMOSFET in FIG. 2B, there is no additional patterned mask created for the implantation of the second conductivity type well region 206. In FIG. 2A, the source attachment region 208 and the second conductivity type well region 206 may be formed using two different masks.

The source attachment region 208 shown in FIG. 2B is formed by performing the ion implantation over the patterned mask layer in a direction orthogonal to a surface of a SiC wafer of the SiC DMOSFET. The ion implantation for forming the source attachment region 208 may be performed using first conductivity type ions. The second conductivity type well region 206 shown in FIG. 2B is formed by performing the ion implantation over the same patterned mask layer at non-zero tilt angle. The ion implantation for forming the second conductivity type well region 206 may be performed using second conductivity type ions.

The SiC DMOSFET further comprises an ion-implantation step for realizing a contact to the well region. The ion-implantation step can be accomplished by performing one or more (chained) ion-implantation steps using second conductivity ions with high an electrical dose in the range of $10^{14}$ per centimeter squared to $10^{16}$ Per centimeter squared. This well contact region may be optionally placed at the center of the MOSFET unit cell as shown in FIG. 2A-3B. In one embodiment, when a stripe cell layout is utilized for fabrication, the well contact regions may be formed at orthogonal locations along the direction of the source/gate stripes.

Figure 6A:
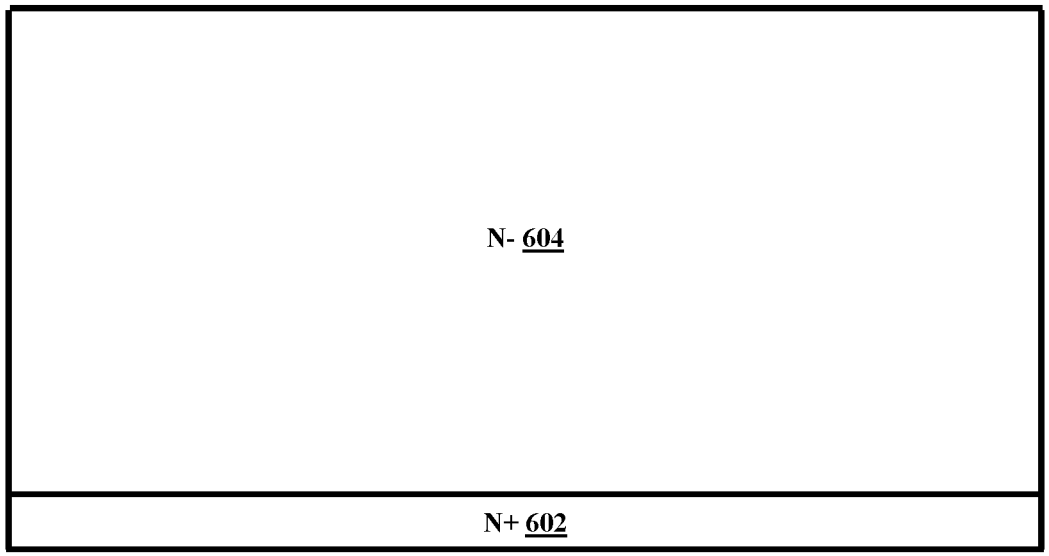
FIG. 6A-6Q illustrates a fabrication process of a silicon carbide (SiC) DMOSFET shown in FIG. 2B, according to one or more embodiments.

The SiC DMOSFET further comprises the gate oxide layer 212, a polysilicon layer 214, silicide layers (218, 220), and interconnect metal layers (222, 224). The process of fabrication of the SiC DMOSFET shown in FIG. 2B is illustrated in FIG. 6A-6Q.

Figure 3A:
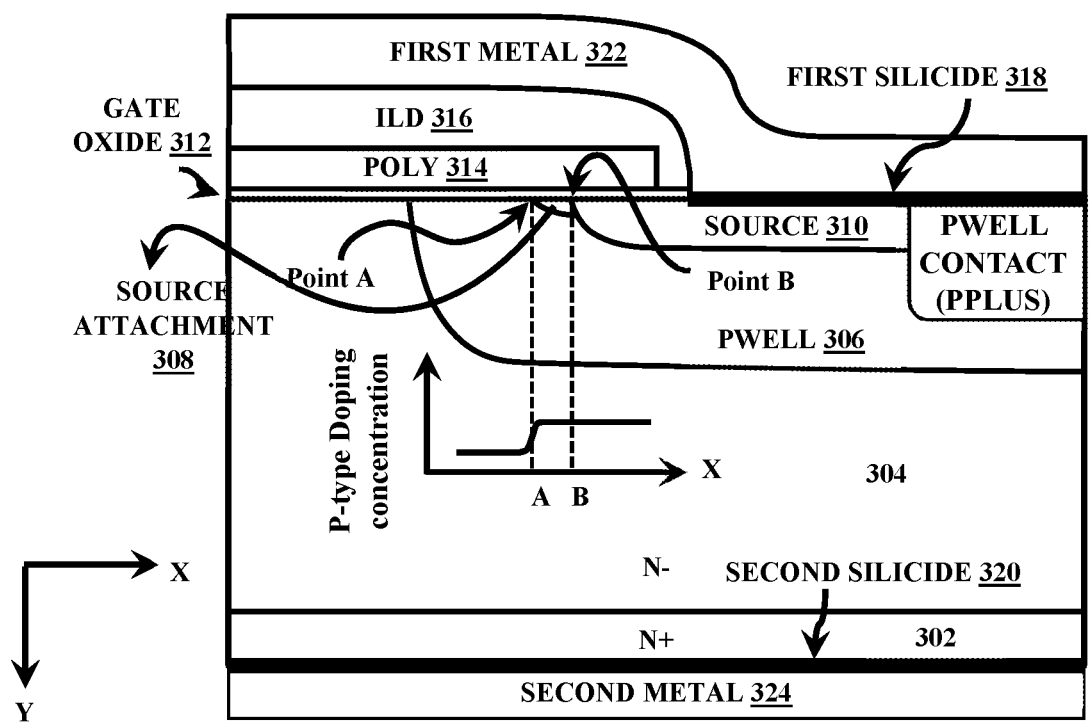
FIG. 3A illustrates a planar gate silicon carbide (SiC) double implantation metal-oxide-semiconductor field-effect transistor (DMOSFET) comprising a second conductivity type source attachment region and a second conductivity type well region formed using different masks, according to one or more embodiments.

FIG. 3A illustrates a planar gate silicon carbide (SiC) double implantation metal-oxide-semiconductor field-effect transistor (DMOSFET) comprising a second conductivity type source attachment region and a second conductivity type well region formed using different masks, according to one or more embodiments. The planar gate SiC DMOSFET shown in FIG. 3A comprises a source attachment region 308. The source attachment region 308 is doped using second conductivity type ions (e.g., p-type ions). The source attachment region 308 is physically and laterally connected to a source region 310. The SiC DMOSFET further comprises a second conductivity type well region 306, a gate oxide layer 312, a polysilicon layer 314, inter-layer dielectric (ILD) 316, silicide layers (318, 320), and interconnect metal layers (322, 324). The difference between the SiC DMOSFET shown in FIG. 3A and the SiC DMOSFET shown in FIG. 2A is that the source attachment region 308 in FIG. 3A is a first conductivity type source attachment region, whereas the source attachment region 208 in FIG. 2A is a second conductivity type source attachment region.

In the SiC DMOSFET with the source attachment region 308 (doped using the second conductivity type ions), the channel length is increased by the lateral extent of the source attachment region 308. In one example implementation, the p-type doping in the source attachment region 308 could be made higher than the doping of the second conductivity type well region 306, creating a delta doped region. Existence of the delta doping within the MOSFET channel may minimize the lateral staggering of the n-type species from the source region 310 and reduce the penetration of the zero-bias depletion width into the channel region. The lateral staggering of the n-type species from the source region 310 is minimized by compensating some portion of the n-type species from the source region 310 that intruded into the channel region. In addition, the delta doping with the highest doping within the overall MOSFET channel may play a role in determining the VTH of the proposed planar gate SiC MOSFET to the first order. This may be an effective solution to mitigate the VTH roll-off issue that is observed in modern planar gate SiC MOSFETs with deep submicron channel.

Figure 3B:
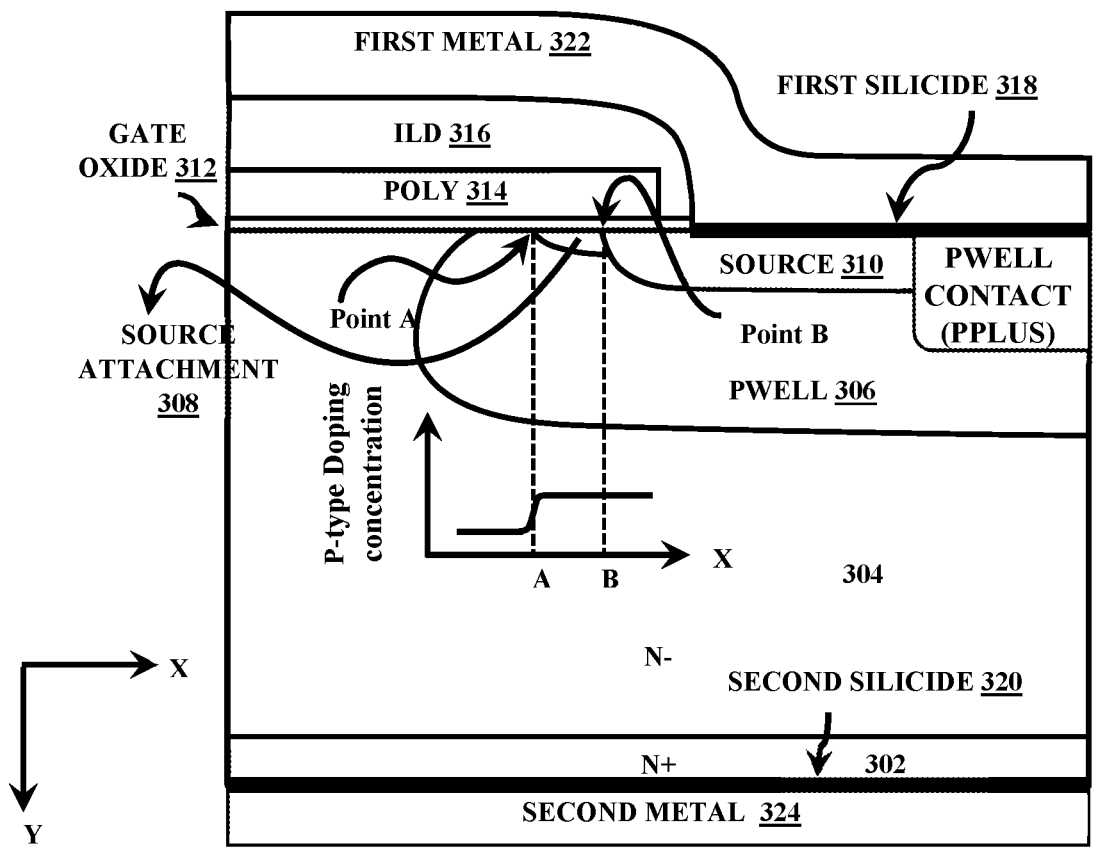
FIG. 3B illustrates a planar gate silicon carbide (SiC) double implantation metal-oxide-semiconductor field-effect transistor (DMOSFET) comprising a second conductivity type source attachment region and a second conductivity type well region formed using same mask, according to one or more embodiments.

FIG. 3B illustrates a planar gate silicon carbide (SiC) double implantation metal-oxide-semiconductor field-effect transistor (DMOSFET) comprising a second conductivity type source attachment region and a second conductivity type well region formed using a same mask, according to one or more embodiments. The planar gate SiC DMOSFET shown in FIG. 3B comprises a source attachment region 308. The source attachment region 308 is doped using second conductivity type ions (e.g., p-type ions). The source attachment region 308 is physically and laterally connected to a source region 310. The SiC DMOSFET further comprises a second conductivity type well region 306, a gate oxide layer 312, a polysilicon layer 314, an ILD 316, silicide layers (318, 320), and interconnect metal layers (322, 324). The difference between the SiC DMOSFET shown in FIG. 3B and the SiC DMOSFET shown in FIG. 2B is that the source attachment region 208 in FIG. 2B is a first conductivity type source attachment region, whereas the source attachment region 308 in FIG. 3B is a second conductivity type source attachment region. The second conductivity type well region 306 in both FIG. 2B and FIG. 3B is formed by performing the ion implantation using respective conductivity type ions at a non-zero tilt angle (i.e., non-orthogonal to the SiC wafer).

The unit cell of the SiC MOSFET cross-sections shown in FIGS. 2A, 2B, 3A, and 3B may be designed with stripe cell or cellular layout topologies. In a stripe cell layout, the source and gate regions are laid out as parallel stripes, in a quasi-two-dimensional topology. On the other hand, cellular layouts such as circular, square, or hexagonal unit cells may also be advantageously employed for fabricating the device structures disclosed herein, as these cellular layouts may have the advantage of a larger channel periphery or width which is advantageous for further reduction of the on-state resistance of the SiC planar MOSFETs. Every structural and fabrication aspect disclosed herein is equally applicable for different layout strategies.

The unit cell pitch for the SiC MOSFET structures disclosed herein may be designed to be in the range of 3 micrometers to 6 micrometers. In one embodiment, the unit cell pitch may be designed to be smaller than 5.0 micrometers in an attempt to increase the channel periphery or width.

Figure 4:
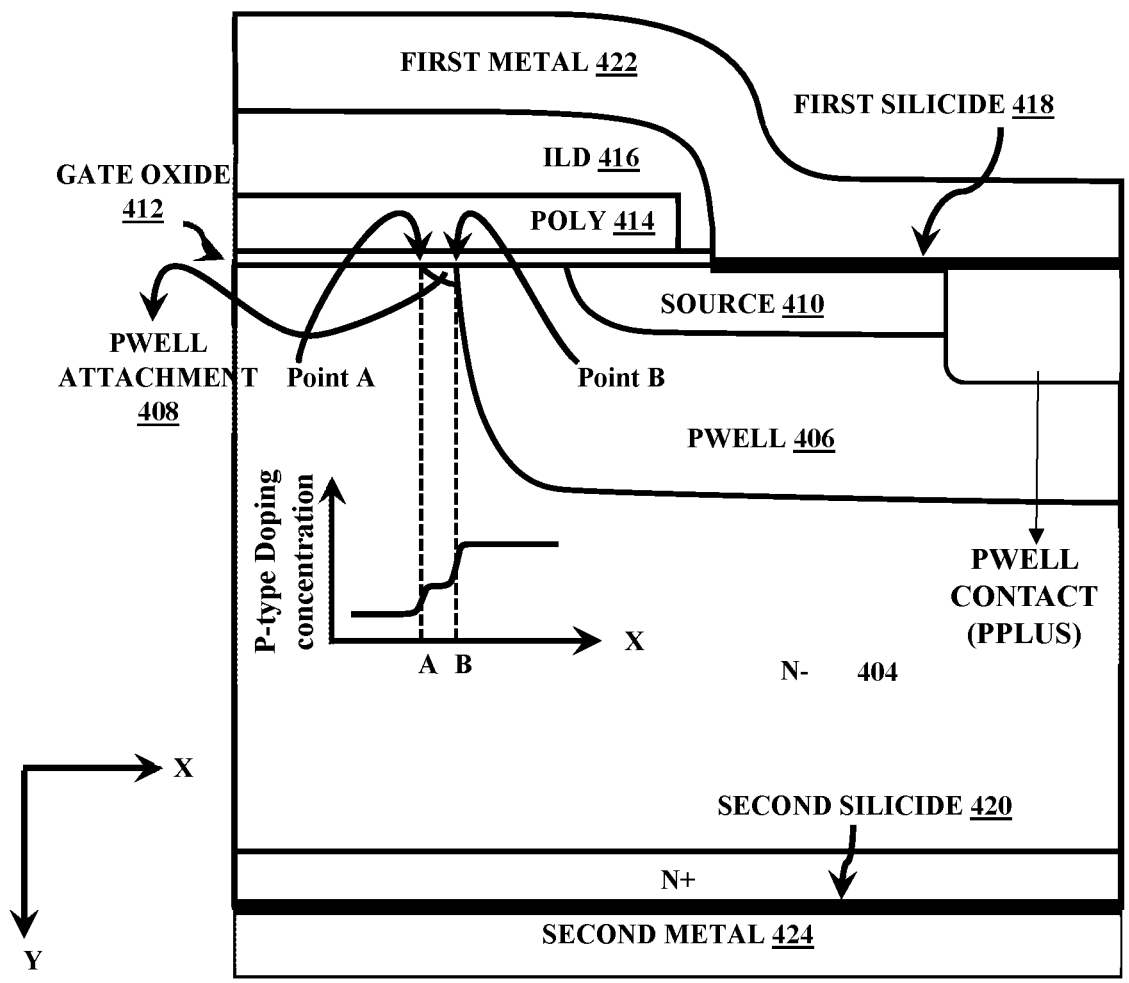
FIG. 4 illustrates a planar gate silicon carbide (SiC) double implantation metal-oxide-semiconductor field-effect transistor (DMOSFET) comprising a well attachment region, according to one or more embodiments.

FIG. 4 illustrates a planar gate silicon carbide (SiC) double implantation metal-oxide-semiconductor field-effect transistor (DMOSFET) comprising a well attachment region 408, according to one or more embodiments. The planar gate SiC DMOSFET shown in FIG. 4 comprises the well attachment region 408. The well attachment region 408 is doped using second conductivity type ions (e.g., p-type ions). The well attachment region 408 is physically and laterally connected to a second conductivity type well region 406 outside a metal-oxide-semiconductor field-effect transistor (MOSFET) channel. The well attachment region 408 comprises a doping concentration equal to a doping concentration of the second conductivity type well region 406. In an embodiment, the well attachment region 408 comprises a doping concentration lower than a doping concentration of the second conductivity type well region 406.

The SiC DMOSFET further comprises a first conductivity type substrate 402, a first conductivity type drift region 404, a source region 410, a gate oxide layer 412, a polysilicon layer 414, an ILD 416, a first silicide layer 418, a second silicide layer 420, a first interconnect metal layer 422, and a second interconnect metal layer 424. The second conductivity type well region 406 is formed by performing the ion implantation using second conductivity type ions in a direction orthogonal to a SiC wafer. In an embodiment, the second conductivity type well region 406 is formed by performing the ion implantation using second conductivity type ions in a direction non-orthogonal to a SiC wafer (i.e., at a non-zero tilt angle).

FIG. 5A-5S illustrates a fabrication process of a silicon carbide (SiC) DMOSFET shown in FIG. 2A, according to one or more embodiments. A silicon carbide (SiC) wafer is prepared as shown in FIG. 5A. The SiC wafer prepared comprises a first conductivity type substrate 502, and a first conductivity type drift region 504. The first conductivity type drift region 504 is epi-grown and sandwiched between the first conductivity type substrate 502 and the air. The doping concentration and the thickness of the first conductivity type drift region 504 are designed primarily by the required electrical target performances including, but not limited to, blocking voltage (BV) and on-state resistance (RDS, ON) of a planar-gate SiC MOSFET device.

Figure 5B:
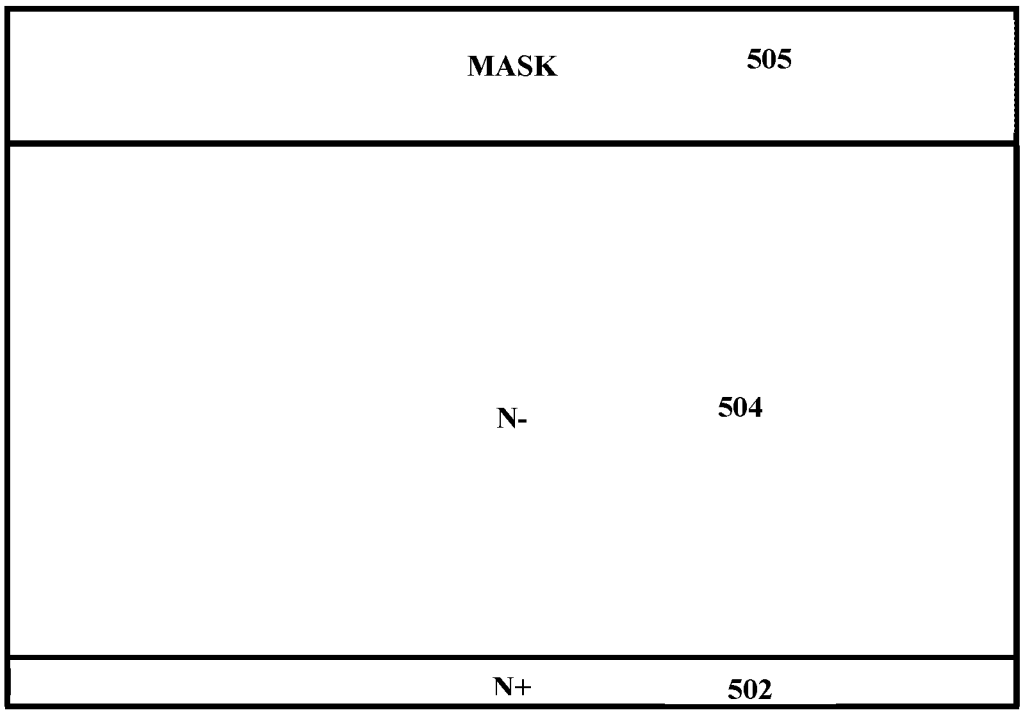

A mask layer 505, as shown in FIG. 5B, is deposited on top of the surface of the SiC wafer. The mask layer 505 may be a hard mask layer. The mask layer 505 comprises a photoresist layer, an oxide layer, a nitride layer, a polysilicon layer, or a combination of the above layers. In an embodiment, the mask layer 505 comprises at least one of a silicon oxide layer, a polysilicon layer, and a silicon nitride layer. The mask layer 505 may comprise thickness ranging from 50 nanometers to 5000 nanometers.

In one embodiment, the mask layer 505 deposition comprises a top silicon oxide layer and a bottom silicon oxide layer sandwiching a polysilicon layer. A thickness of the mask layer 505, comprising the top silicon oxide layer and the bottom silicon oxide layer, is in a range of 1300 nanometers to 1800 nanometers. The top silicon oxide layer and the bottom silicon oxide layer is then etched. The etching performed onto the top silicon oxide layer and the bottom silicon oxide layer forms a remnant thin silicon oxide layer on the top of the SiC wafer. The second conductivity type well region 506 may be formed by performing the ion implantation using the second conductivity type ions through the remnant thin silicon oxide layer.

Figure 5C:
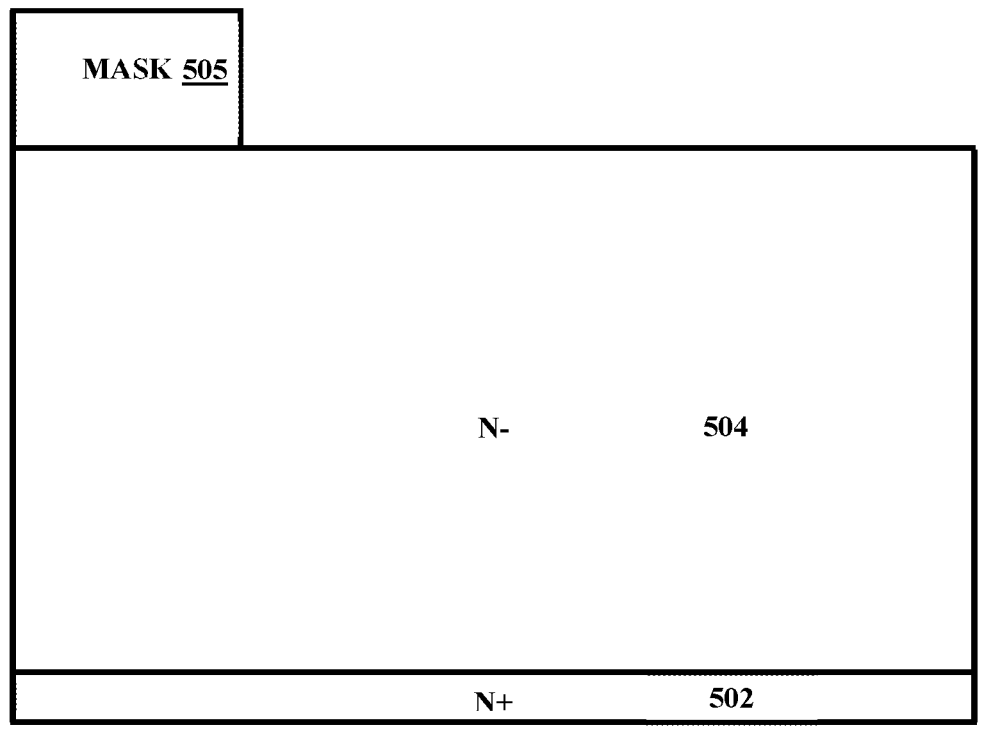
Figure 5D:
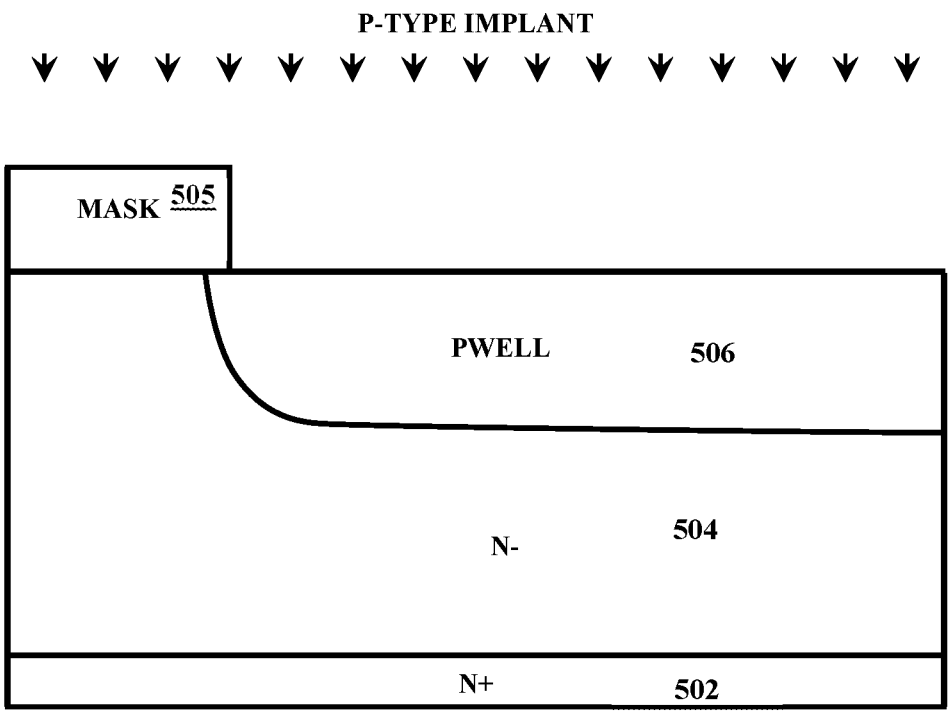

The mask layer 505 is then patterned, as shown in FIG. 5C, by an etching technique. The etching technique comprises one of, but not limited to, reactive ion etching (RIE), inductively coupled plasma etching (ICP) or wet etching. In an embodiment, the etching is performed to open up an area where the second conductivity type well region 506 may be formed underneath. A thin layer of screen oxide (not shown in the schematic) may be formed immediately upon patterning the mask layer 505. With the patterned mask and the screen oxide present on the surface of the SiC wafer, the second conductivity type ion implantation is performed to form the second conductivity type well region 506 as shown in FIG. 5D.

The patterned mask may be designed to completely block any unwanted high energy impurities during the second conductivity type ion implantation step outside the active region. The second conductivity type well region 506 may touch a surface of the SiC wafer. The second conductivity type well region 506 is formed by performing the ion implantation within the active region of the SiC DMOSFET using the second conductivity type ions. The active region is an area that most conduction current of a completely fabricated planar-gate SiC MOSFET flows during the on-state operation of the planar-gate SiC DMOSFET. The second conductivity type ions comprise, but are not limited to, aluminum and boron. The second conductivity type well region 506 is formed within the first conductivity type drift region 504 as shown in FIG. 5D.

Figure 5E:
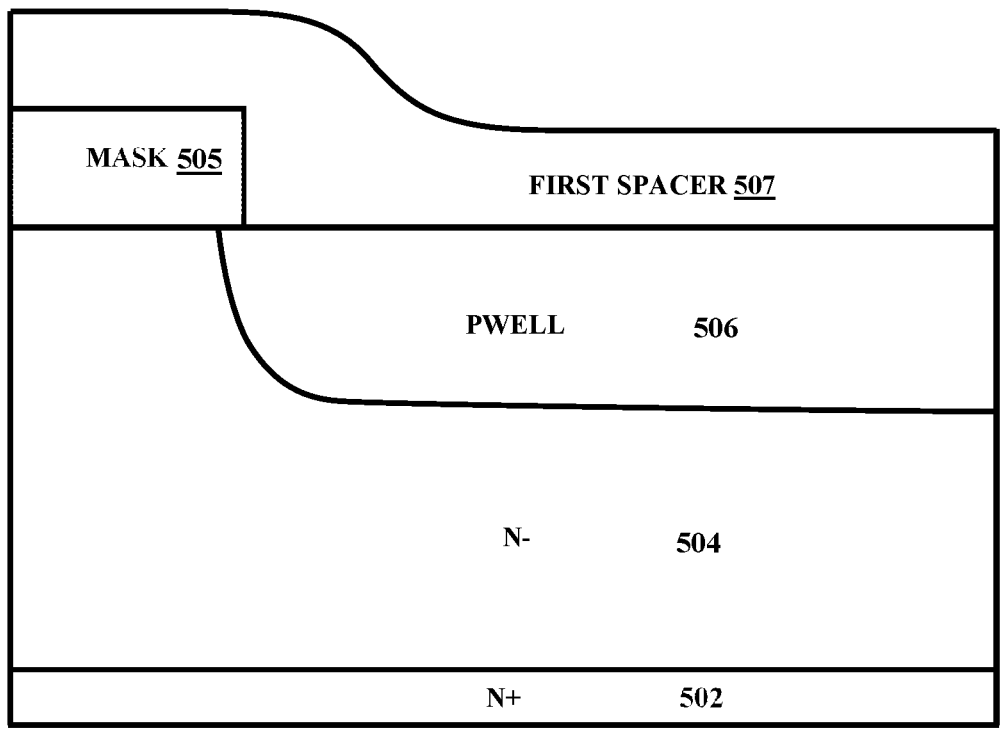
Figure 5F:
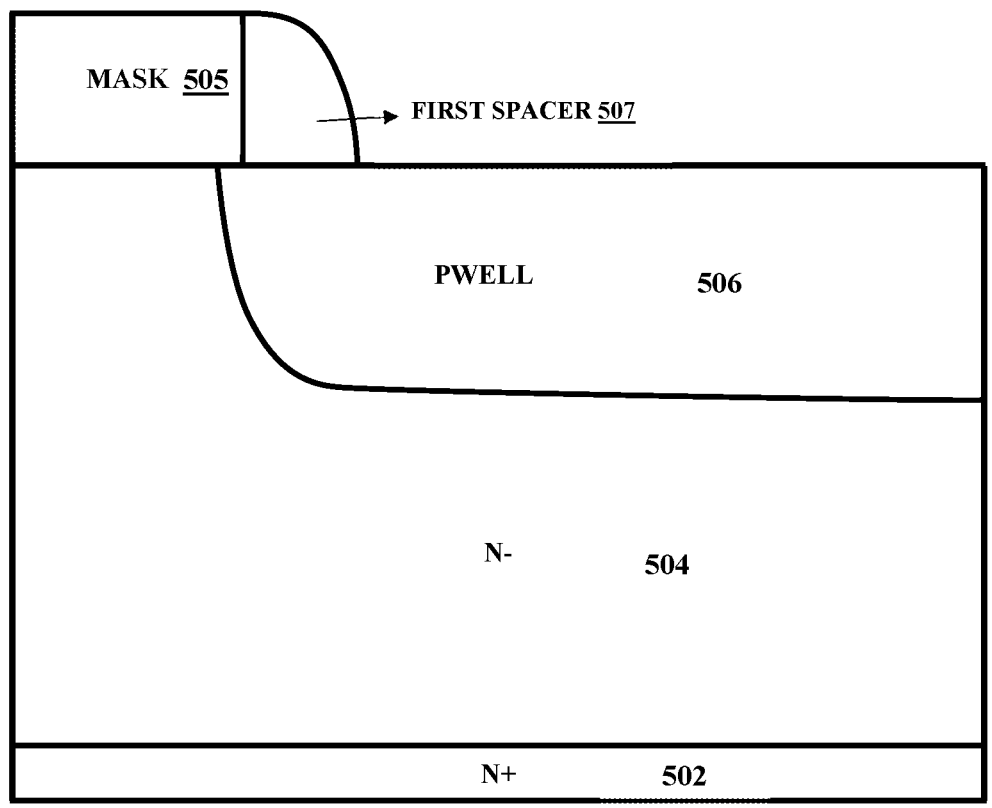

A first spacer layer 507 is then deposited on the front side of the SiC wafer while the mask layer 505 (deposited and patterned), which was used to form the second conductivity type well region 506, is still present on the top of the SiC wafer as shown in FIG. 5E. A side (e.g., top side) of the SiC wafer where the surface of the SiC wafer is located may be referred to as the front side of the SiC wafer. An opposite side (e.g., bottom side) of the front side of the SiC wafer may be referred to as a back side of the SiC wafer. The first spacer layer 507 may comprise at least one of an oxide layer, a nitride layer, a polysilicon layer, or a combination of the above layers. The first spacer layer 507 deposited on the top of the SiC wafer is then etched back as shown in FIG. 5F. The first spacer layer 507 may be etched back by an etching technique. The first spacer layer 507 may be etched with a first etch rate in a vertical direction and a second etch rate in a horizontal direction. The second etch rate is lower than the first etch rate. The etching technique comprises, but is not limited to, RIE or ICP based dry etching or wet etching. The first spacer layer 507 comprises a first sidewall spacer formed along a vertical side of the mask layer 505 (deposited and patterned) which was used for the formation of the second conductivity type well region 506. The first sidewall spacer may be a remnant of the first spacer layer 507 as shown in FIG. 5F. In an embodiment, the first spacer sidewall comprises a chemical vapor deposition (CVD) of one of a silicon oxide layer, a polysilicon layer, and a silicon nitride layer.

Figure 5G:
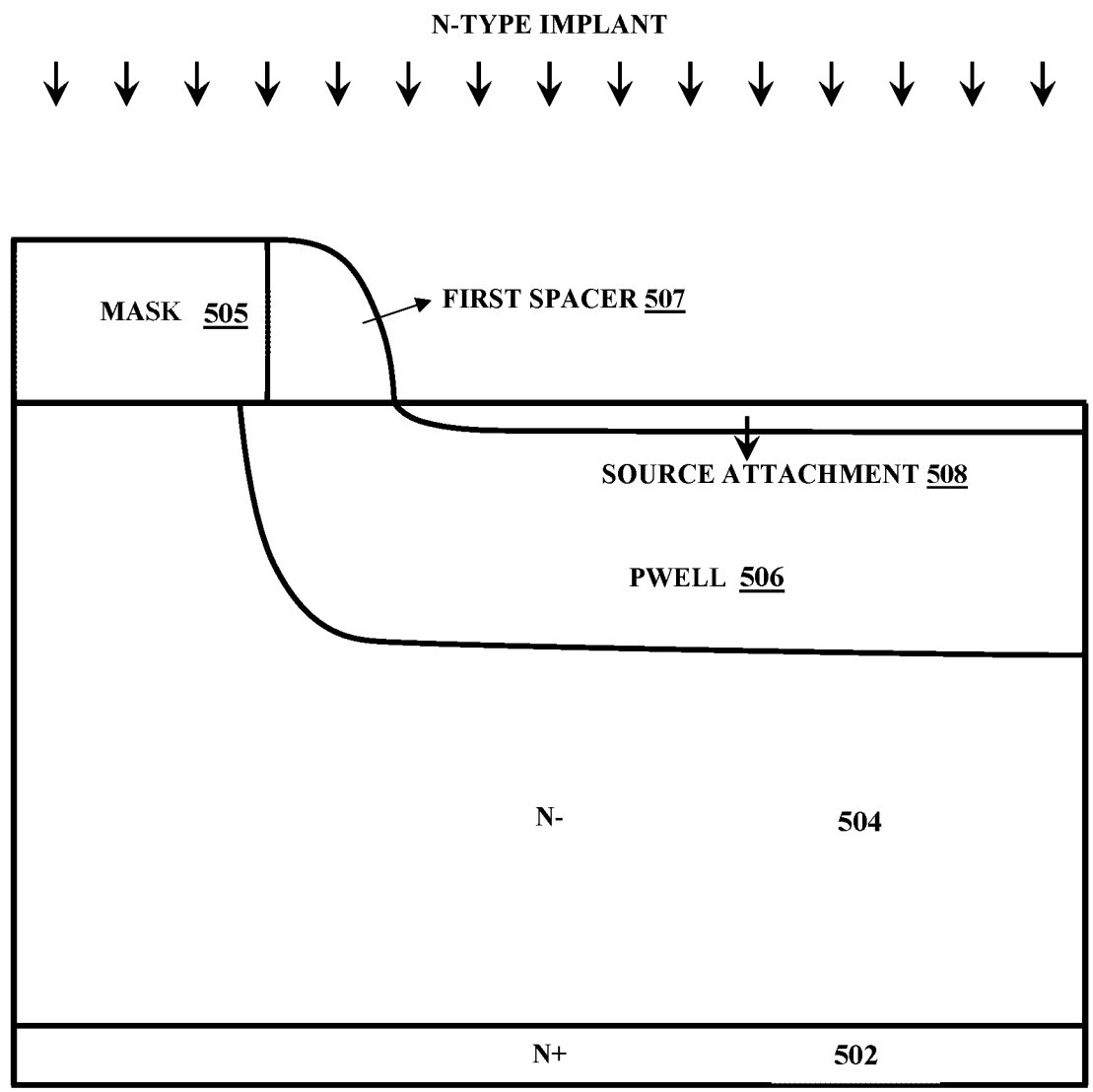

Upon the completion of the etch-back step of the first spacer layer 507, the patterned mask used for the second conductivity type well region 506 and the first sidewall spacer combined may form a second implant mask for a subsequent ion implantation step for a source attachment region 508. The second implant mask may be the combination of the patterned mask used for the second conductivity type well region 506 and the first sidewall spacer. The second implant mask may be used for the ion implantation to form the source attachment region 508. The source attachment region 508 may be formed with an n-type implant species, including but not limited to, nitrogen and/or phosphorus as shown in FIG. 5G. In an embodiment, the source attachment region 508 may be formed with a p-type species such as Aluminum or Boron. The source attachment region 508 may be formed within the second conductivity type well region 506 as shown in FIG. 5G. The top of the source attachment region 508 may touch the surface of the SiC wafer. The ion implantation step for forming the source attachment region 508 may require an additional mask (not shown in the schematic) other than what was mentioned above to prevent any unwanted n-type impurities from reaching an edge termination region (not shown in the schematic).

In one embodiment, the source attachment region 508 may be formed upon completely removing the patterned mask layer used for forming the second conductivity type well region 506. A new hard mask layer or photoresist layer may be deposited and patterned upon removing the patterned mask layer of the second conductivity type well region 506. The ion implantation is formed over the new hard mask layer or photoresist layer to form the source attachment region as shown in FIG. 5G.

In another embodiment, the source attachment region 508 may be formed with the mask layer 505 (deposited and patterned) used for the formation of the second conductivity type well region 506. The source attachment region 508 is formed by performing an angled ion implantation (i.e., at a non-zero tilt angle) using the mask layer 505. In this embodiment, the mask layer 505 is used for forming both the second conductivity type well region 506 and the source attachment region 508. The second conductivity type well region 506, herein this embodiment, is formed by performing the ion implantation in a direction orthogonal to the SiC wafer using the mask layer 505. The source attachment region 508, herein this embodiment, is formed by performing the ion implantation in a direction non-orthogonal (i.e., at a non-zero tilt angle) to the SiC wafer using the mask layer 505.

Figure 5H:
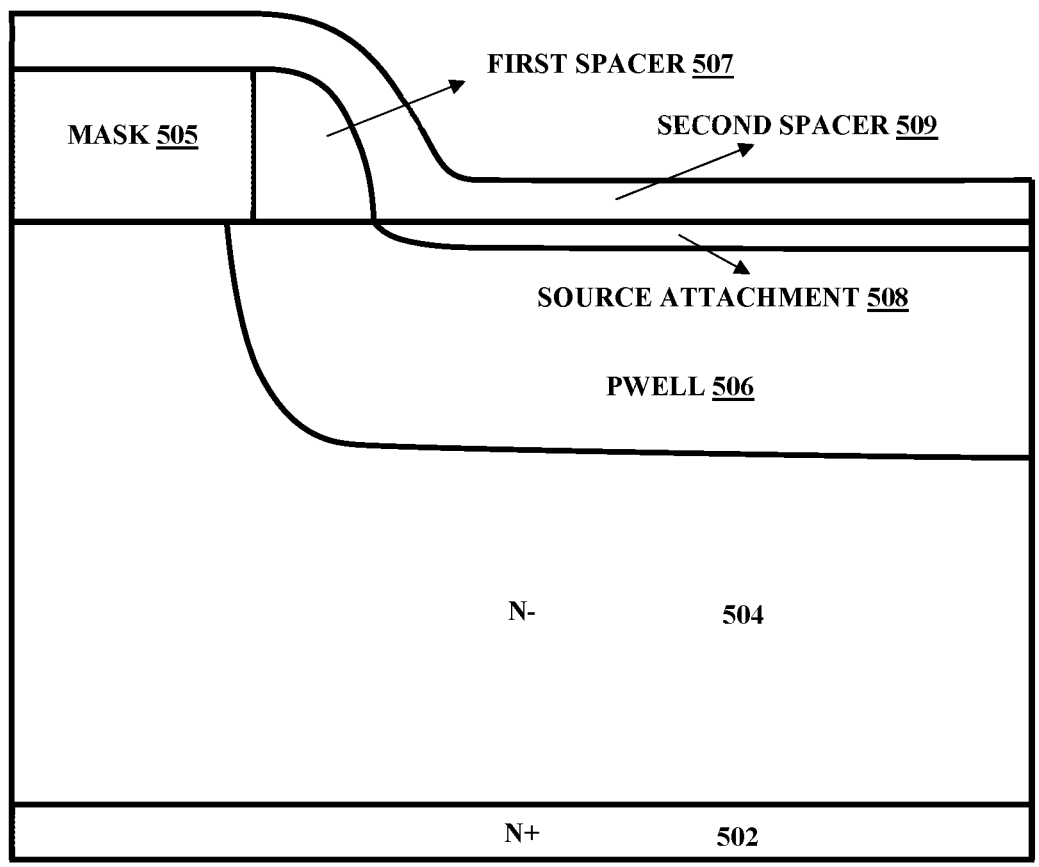
Figure 5I:
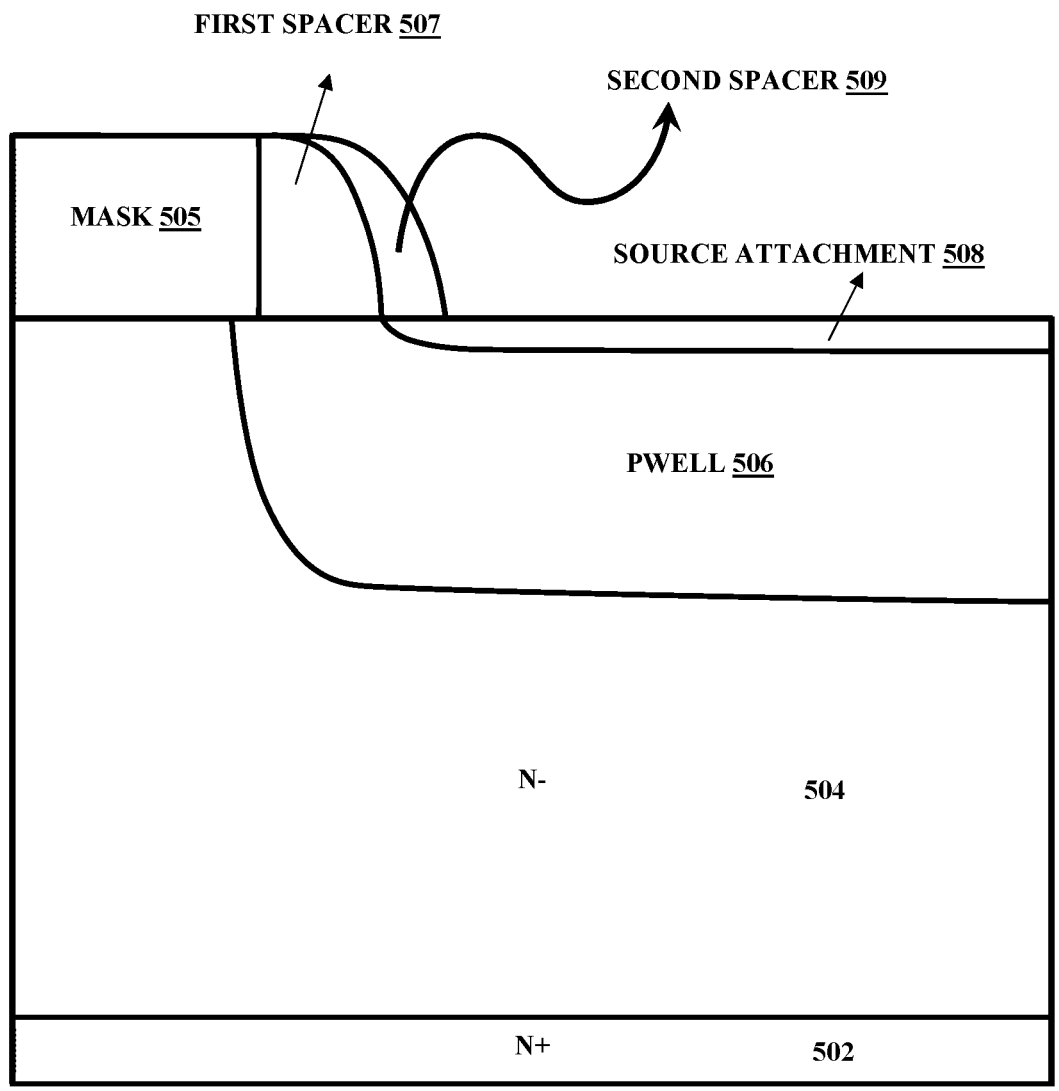

A second spacer layer 509 is then deposited on the front side of the SiC wafer while the implant mask which was used to form the source attachment region 508 is still present as shown in FIG. 5H. The second spacer layer 509 comprises an oxide layer, a nitride layer, a polysilicon layer, or a combination of the above layers. The second spacer layer 509 is then etched back using an etching technique. The second spacer layer 509 may be etched with a first etch rate in a vertical direction and a second etch rate in a horizontal direction. The second etch rate is lower than the first etch rate. The etching technique comprises one of but not limited to the RIE or ICP based dry etching. The etch back performed onto the second spacer layer 509 forms a second sidewall spacer along a vertical side of the implant mask which was used for the formation of the source attachment region 508. The second side wall spacer may be a remnant of the second spacer layer 509 as shown in the FIG. 5I. In an embodiment, the second spacer sidewall comprises a chemical vapor deposition (CVD) of one of a silicon oxide layer, a polysilicon layer, and a silicon nitride layer. Upon the completion of the etch-back of the second spacer layer 509, the implant mask used for the source attachment region 508 and the second sidewall spacer combined may form a third implant mask for a subsequent ion implantation for the formation of the source region 510. Alternatively, a separate hard mask layer or a photoresist layer may be deposited and patterned prior to performing the ion-implantation step for forming the source region 510.

Figure 5J:
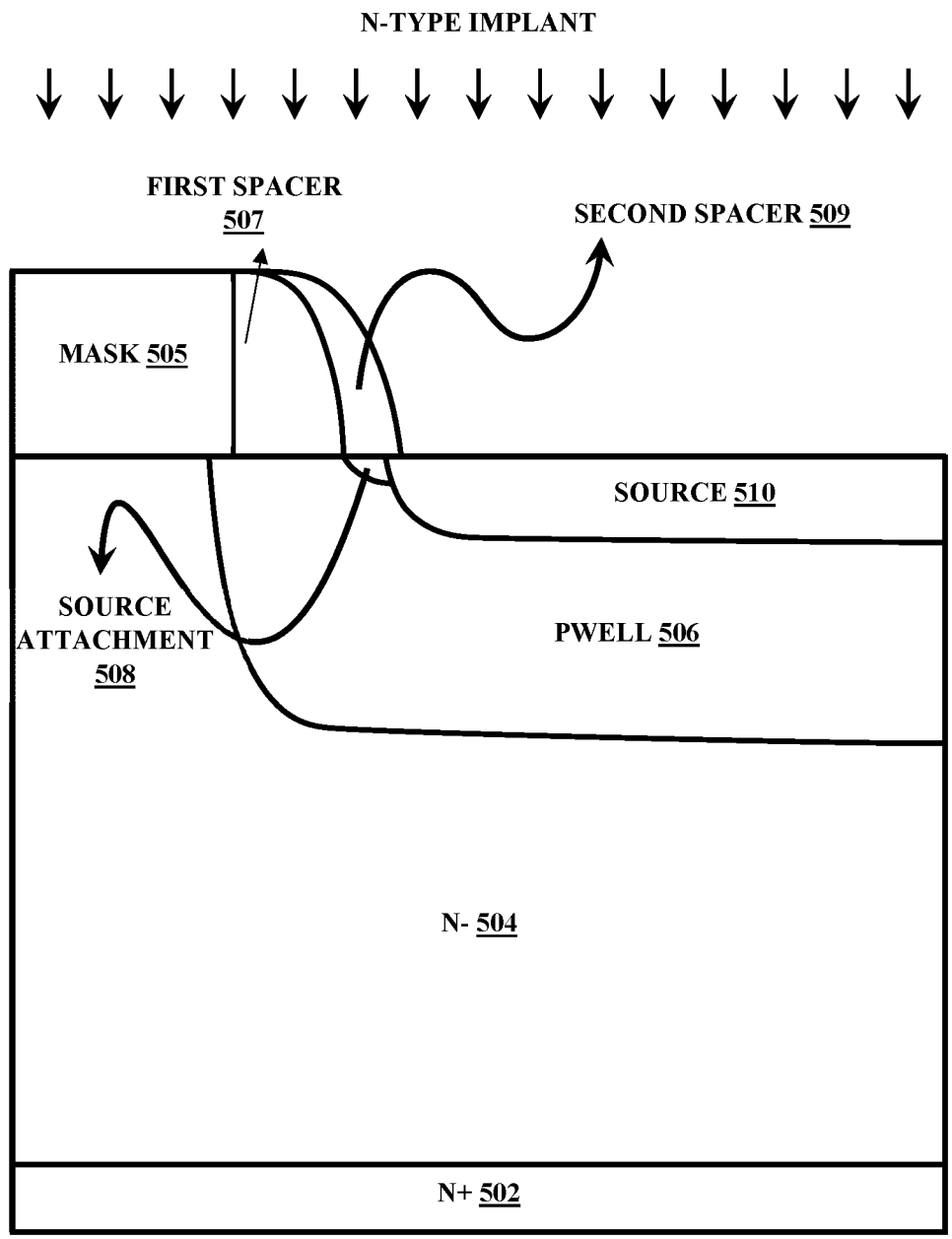

Immediately after completing the second sidewall spacer formation, the second implant mask is obtained. The second implant mask, which is a combination of the patterned mask used for the second conductivity type well region formation, the first sidewall spacer, and the second sidewall spacer, may be used for the ion implantation to form the source region 510. The source region 510 may be formed with a first conductivity type ions (e.g., n-type implant species). The n-type implant species comprises but not limited to nitrogen or/and phosphorus. The source region 510 may be formed within the second conductivity type well region 506 as shown in FIG. 5J. The top of the source region 510 may touch the surface of the SiC wafer as shown in FIG. 5J. The source region 510 may comprise a depth deeper than a depth of the source attachment region 508. In an embodiment, the source region 510 may comprise the depth equal to the depth of the source attachment region 508. The source region 510 may comprise a doping concentration greater than a doping concentration of the source attachment region 508. In an embodiment, the source region 510 may comprise the doping concentration equal to the doping concentration of the source attachment region 508. The first conductivity type ion implantation step for forming the source region 510 may require an additional mask (not shown in the schematic). The additional mask may be other than what was mentioned above to prevent any unwanted n-type impurities from reaching to an edge termination region (not shown in the schematic).

Figure 5K:
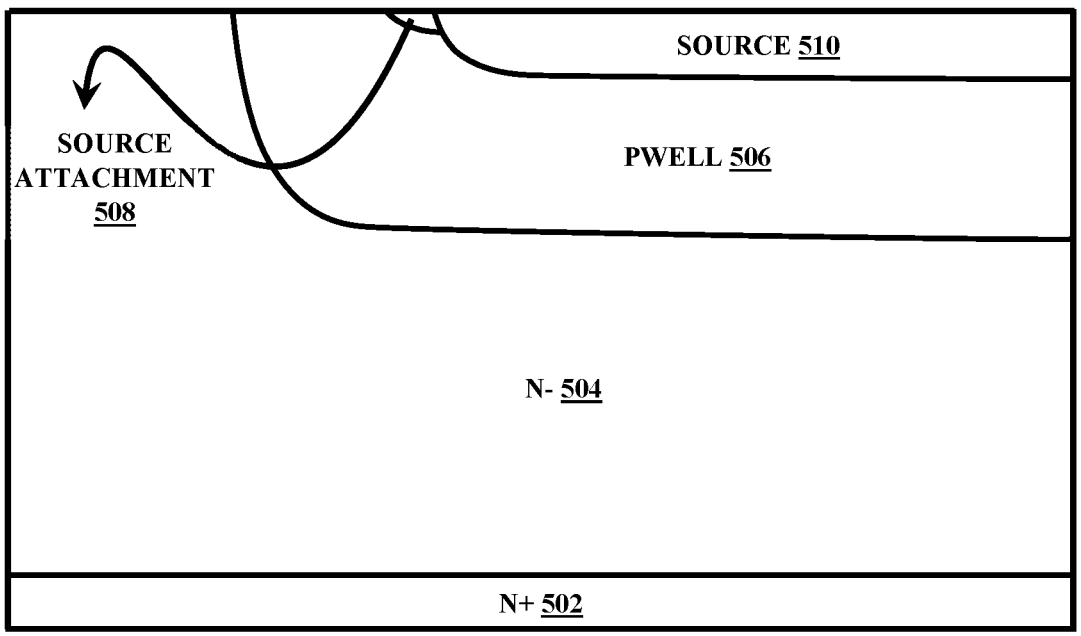

As shown in FIG. 5K, the patterned mask used for forming the second conductivity type well region, the first sidewall spacer, and the second sidewall spacer may be removed from the surface of the SiC wafer completely. The removal of the mask layers may be performed using an etching technique (e.g., wet etching) as shown in FIG. 5K. A fourth mask layer is then deposited onto the surface of the SiC wafer. The fourth mask layer is then patterned (not shown in the schematic). A p-conductivity type ion implantation is then performed onto the fourth mask layer for creating highly doped second conductivity type (e.g., p-type) regions that serve as the body contact regions. A short SiC dry etch step may be performed using the same patterned fourth mask layer in order to selectively remove the first conductivity type implanted regions. The short SiC dry etch step may be performed after the hard mask layer is patterned and prior to performing the second conductivity type implantation for the body contact region.

A thermal activation step is then performed (not shown in the schematics). The thermal activation electrically activates all implanted species which may start by coating the SiC wafer with a suitable coating material. The coating material may be a carbon-based material such as photoresist. As soon as the SiC wafer is coated using the coating material, the SiC wafer may be thermally annealed at a predefined high temperature. The predefined high temperature may be 1700° C. or even higher. The coating material may be removed from the SiC wafer upon completing the thermal annealing step. Immediately after performing the thermal activation step, an oxide layer may be thermally grown on both sides of the SiC wafer. The oxide layer grown is subsequently removed. The oxide layer formation and removal are collectively called as oxidation step by the SiC device community. The oxidation step is performed in order to improve the quality of the surface of the SiC wafer.

A field oxide layer may be formed on the surface of the SiC wafer. The field oxide layer may be formed by dry oxidation or wet oxidation of the SiC wafer (not shown in the schematics). In an embodiment, the field oxide layer may be formed by chemical vapor deposition (CVD) of a dielectric layer. The dielectric layer comprises a silicon oxide layer, silicon nitride layer or a combination thereof. A portion of the field oxide layer may be selectively cleared out by an etching technique. The etching technique comprises, but is not limited to, hydrofluoric acid (HF)-based wet etching. The etching is performed so as to define the active region of the planar gate SiC MOSFET.

Figure 5L:
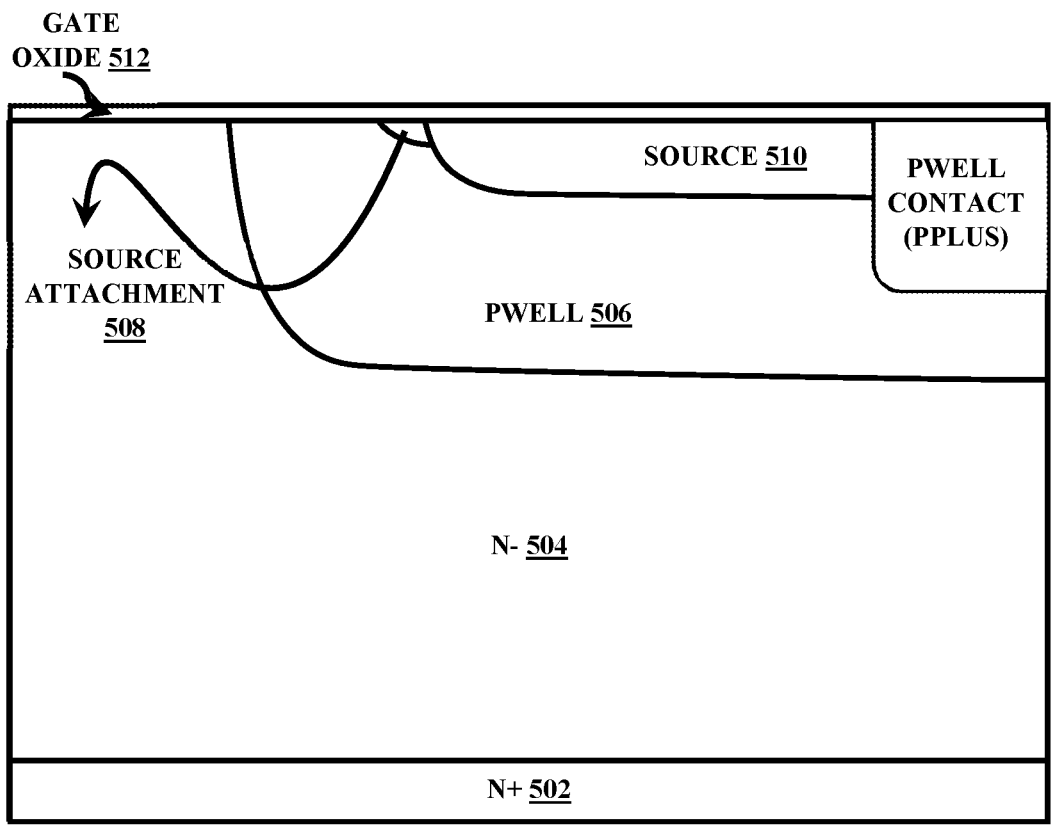
Figure 5M:
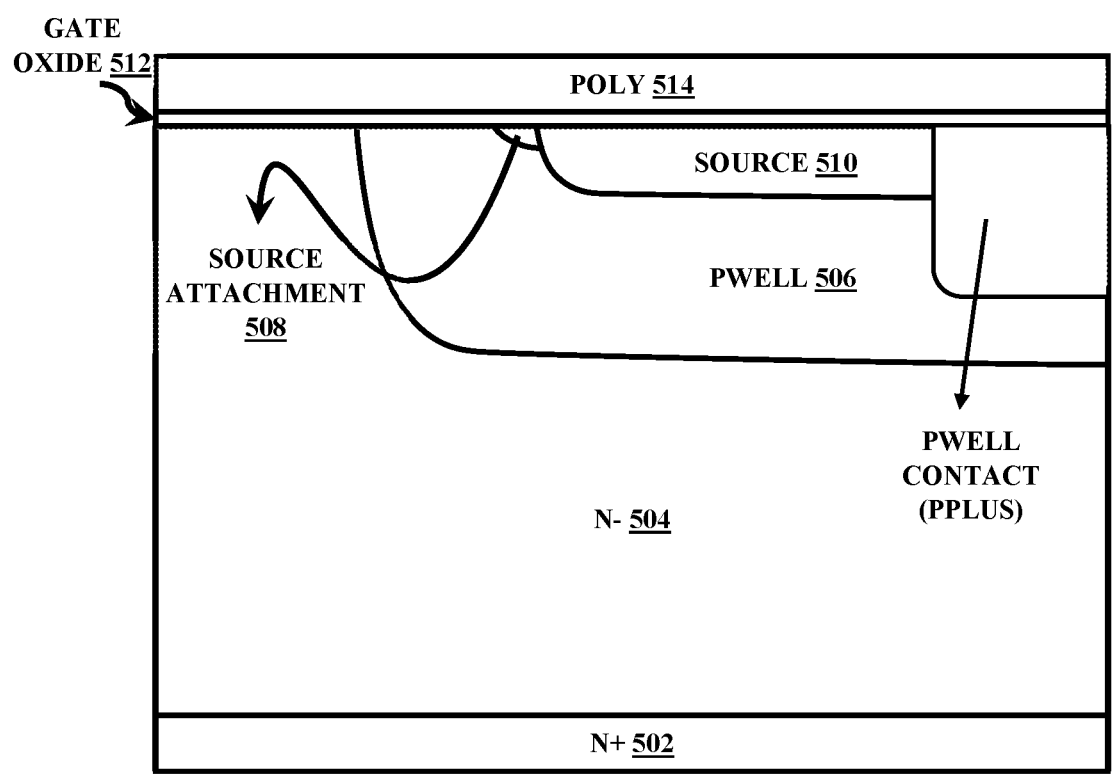
Figure 5N:
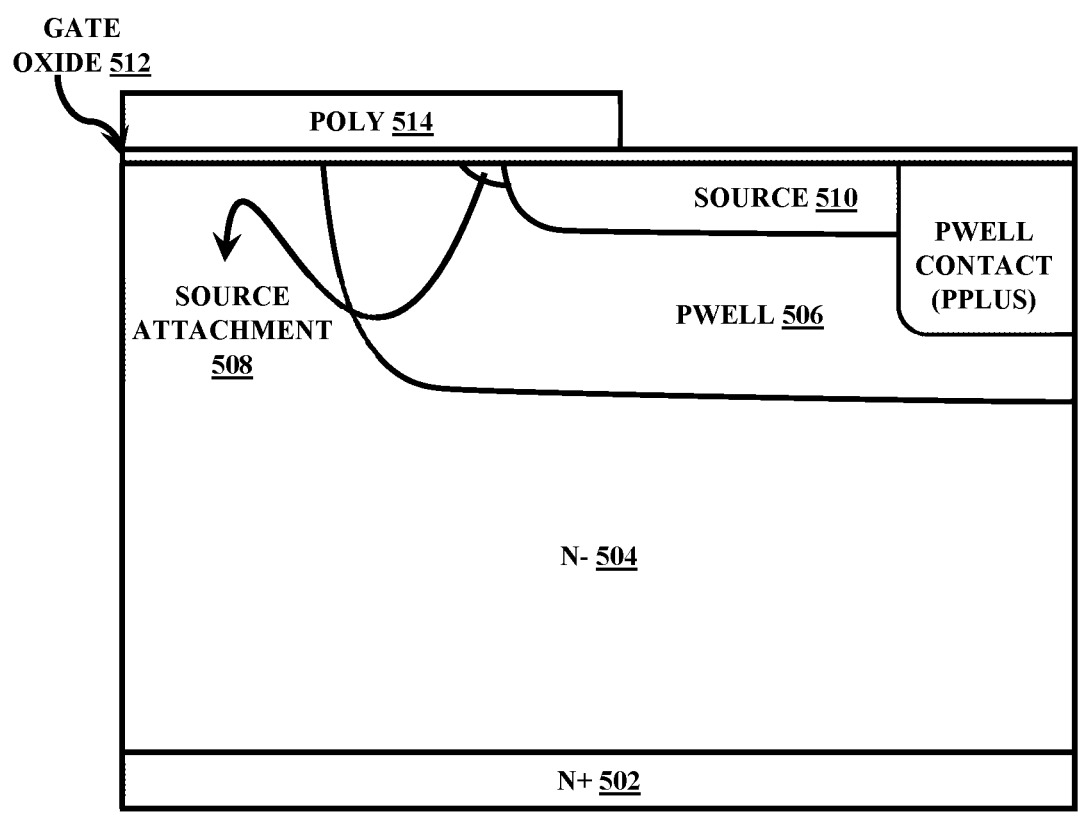

Once the active region is defined, a gate oxide layer 512 may be formed on the surface of the SiC wafer as shown in FIG. 5L. The gate oxide layer 512 may be formed by thermal oxidation. In an embodiment, the gate oxide layer 512 is formed by Plasma-enhanced chemical vapor deposition (PECVD) or low-pressure chemical vapor deposition (LPCVD), followed by adequate nitridation treatment to passivate the SiC surface. A polysilicon layer 514 is then deposited on top of the gate oxide layer 512 as shown in FIG. 5M. The polysilicon layer 514 may be doped either by in-situ doping or by Phosphorus oxychloride (POCL3) based doping. The polysilicon layer 514 is then patterned preferably by an etching technique as shown in FIG. 5N. The etching technique comprises, but is not limited to, the reactive ion etching (RIE). The etching is performed to define a lateral extent of a gate stack of the planar gate SiC MOSFET. In an embodiment, the gate layer may be formed using a combination of polysilicon and refractory metals such as Molybdenum, Tungsten, Tungsten Silicide, etc.

Figure 5O:
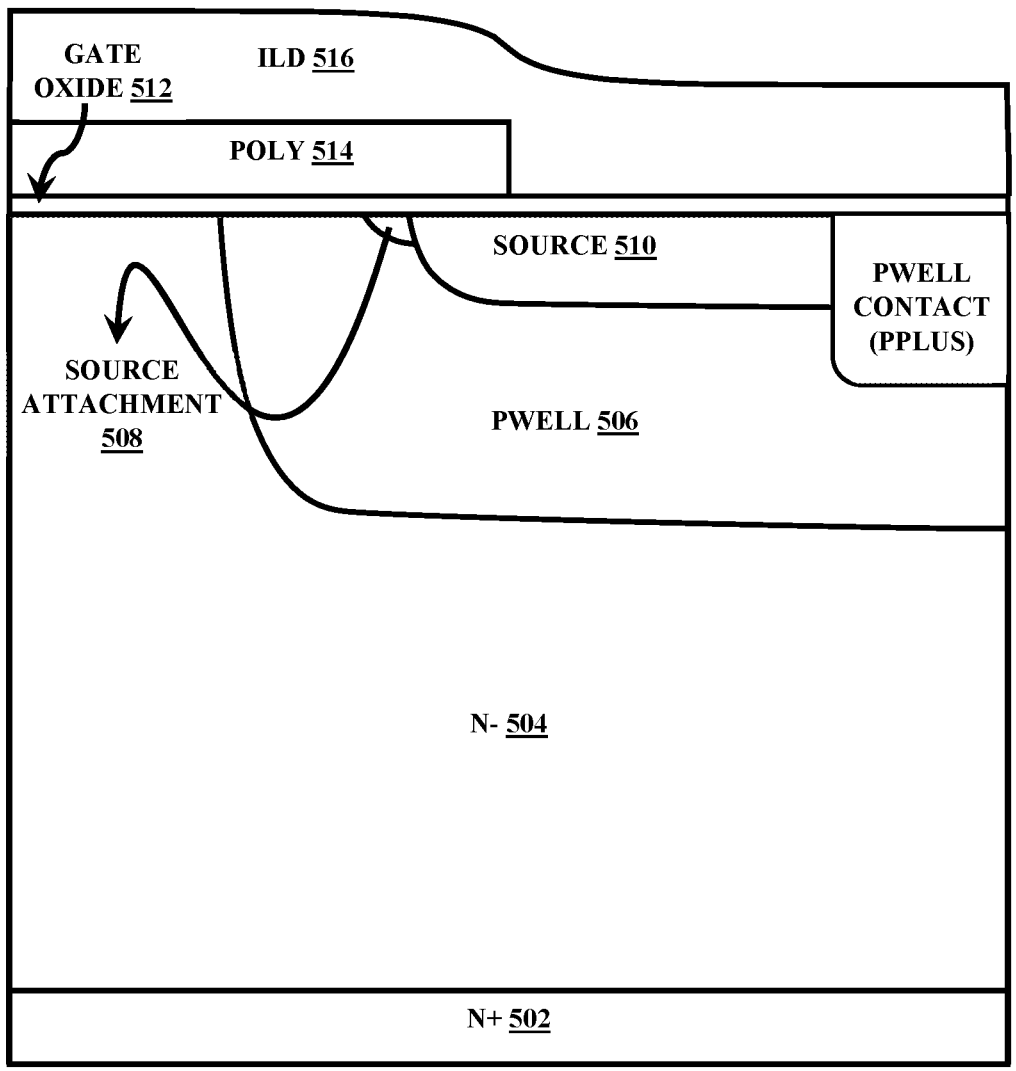
Figure 5P:
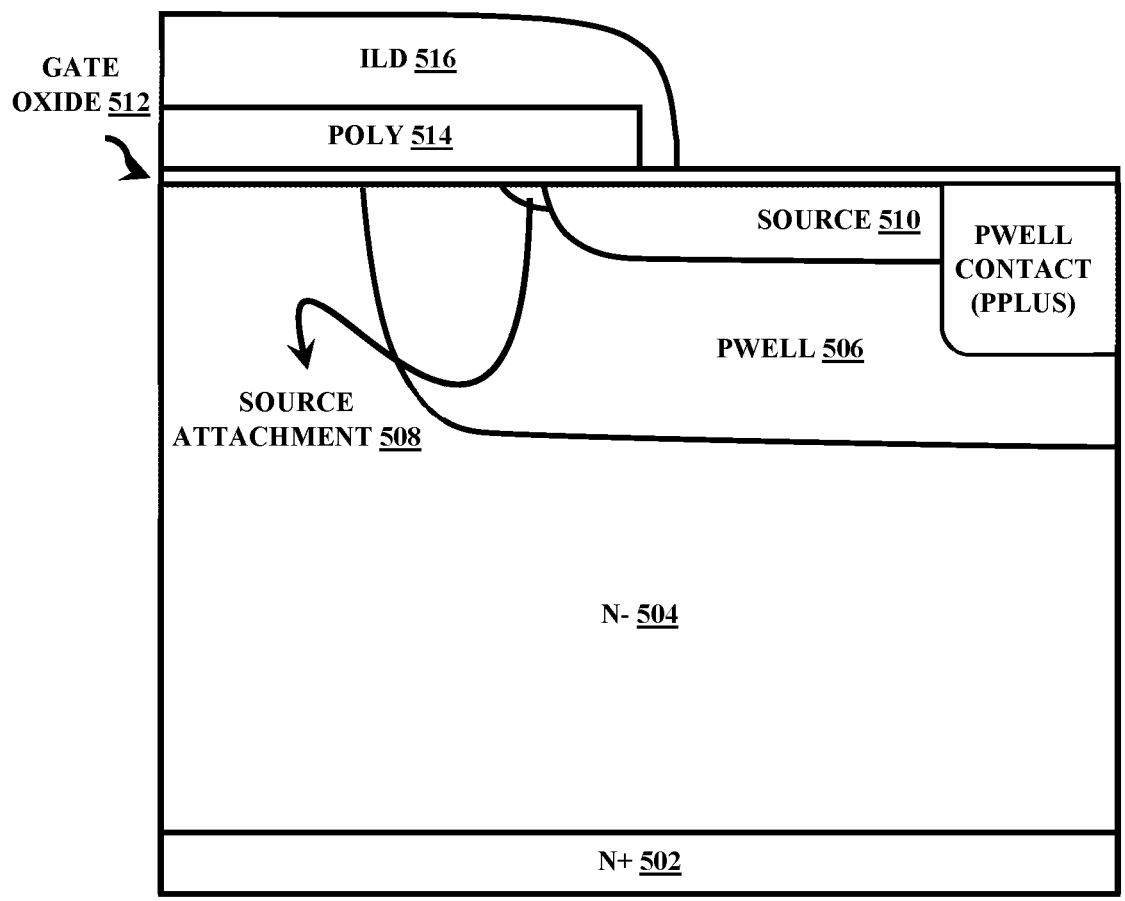
Figure 5Q:
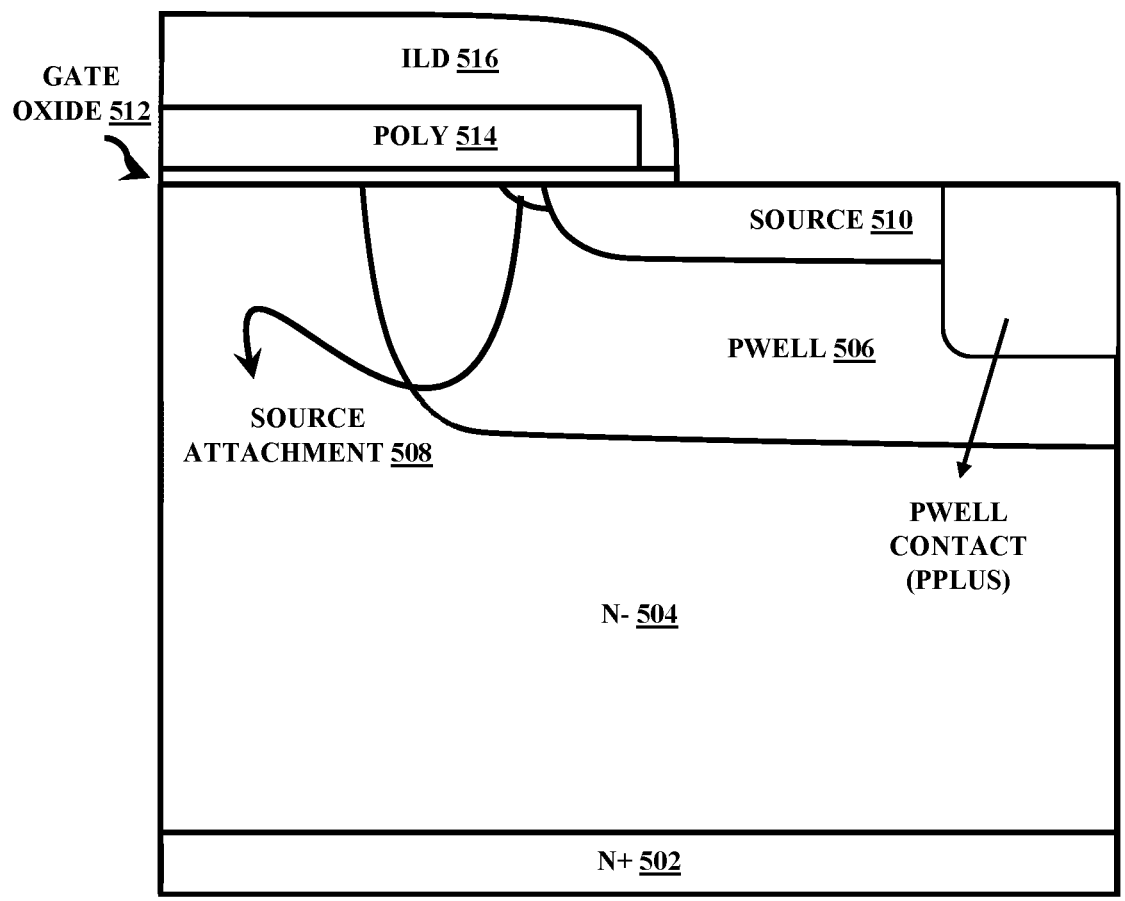

An inter-layer dielectric (ILD) 516 may be formed on the front side (i.e., top side) of the SiC wafer as shown in FIG. 5O. The inter-layer dielectric is an insulation layer. The ILD 516 may be formed by an oxide layer, a nitride layer, an oxynitride layer, or a combination of the above layers. The ILD 516 is then patterned by an etching technique as shown in FIG. 5P. The etching technique comprises but is not limited to, the RIE. In an embodiment, the etching is performed to open a contact window for a source contact of the planar gate SiC MOSFET. The ILD etching step may be used for further etching of a portion of the gate oxide layer 512 for complete clearing of the ILD/gate oxide layer stack where the source contact may be formed as shown in FIG. 5Q. Immediately after the ILD etching step, a possible reflow of the ILD layer (not shown in the schematic) may be performed for removing any sharp edges of the as-etched ILD layer.

Figure 5R:
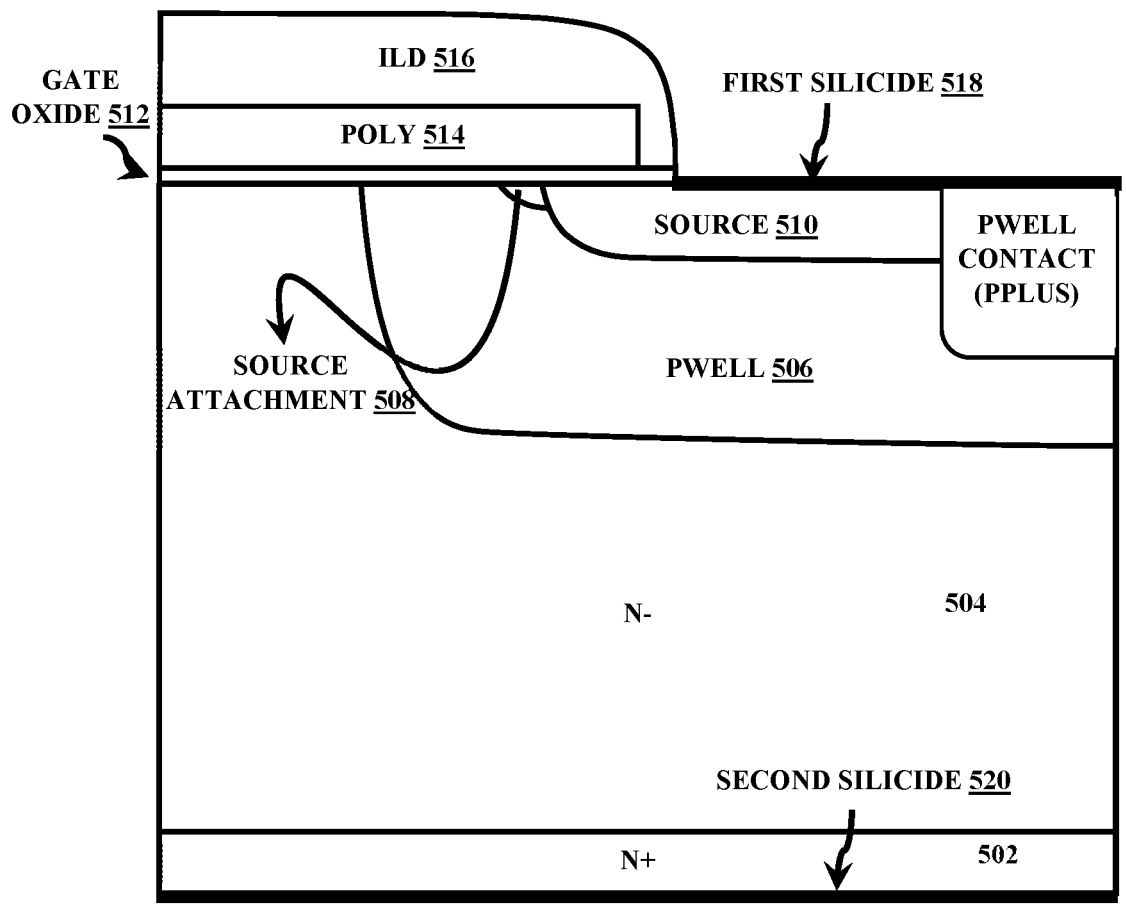
Figure 5S:
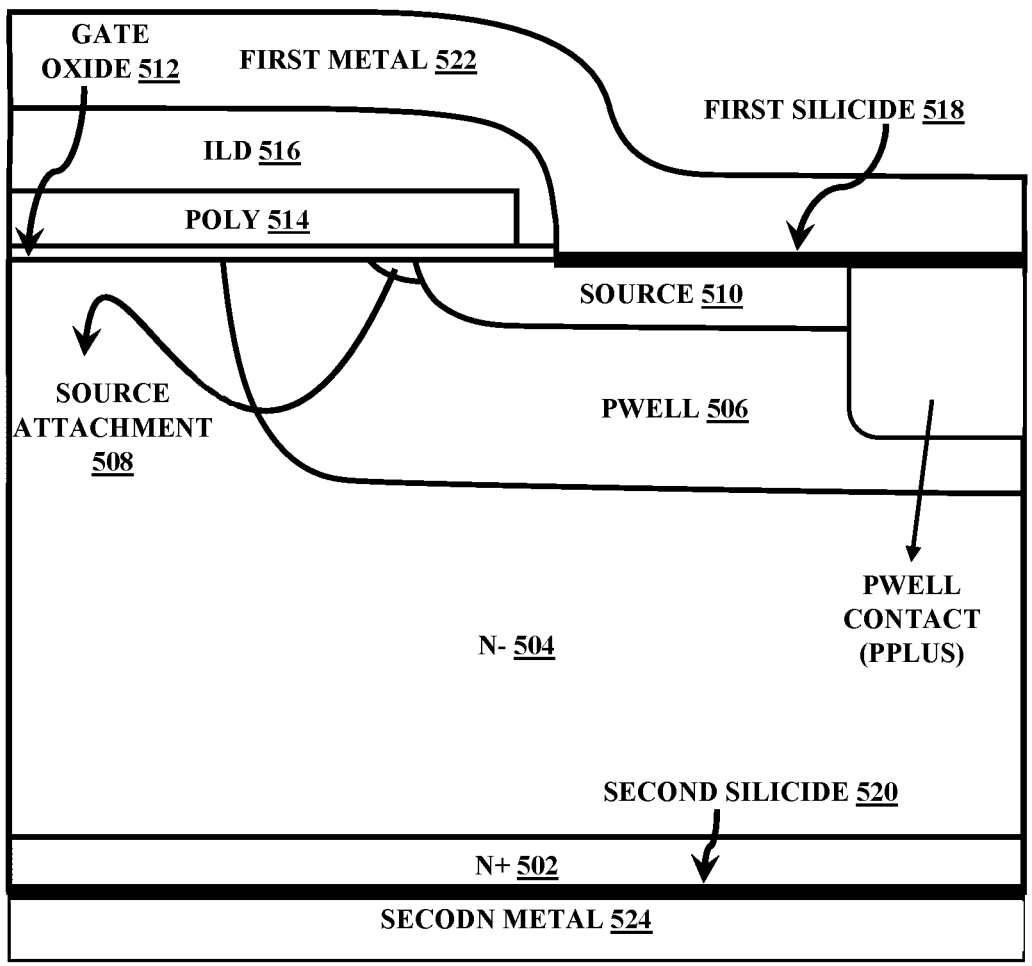

Once the source contact window is opened, a first silicide layer 518 for the source contact may be formed on a portion of the surface of the SiC wafer which is exposed to the air as shown in FIG. 5R. The first silicide layer 518 for the source contact is to establish a good quality ohmic contact for a source terminal (not shown in the schematic). The first silicide layer 518 may be formed by deposition of a nickel-based metal layer. The first silicide layer 518 is followed by appropriate thermal annealing. The thermal annealing may be performed in a rapid thermal annealing furnace at temperatures as high as 1000° C. or higher.

Once the first silicide layer 518 for the source contact is formed, a gate contact window may be opened by etching a portion of the ILD 516. The gate contact window is opened to expose a portion of the polysilicon layer 514. The portion of the polysilicon layer 514 is opened for making the gate contact window ready for subsequent deposition of a third metal (e.g., pad metal) for the gate contact (not shown in the schematics).

Immediately after completing the first silicide layer 518 formation for the source contact, a first metal 522 (e.g., a first pad metal) for the source contact may be deposited on the front side of the SiC wafer as shown in FIG. 5S. The first metal 522 is then patterned by an etching technique. The etching technique comprises, but is not limited to, a wet etching by using a patterned mask layer (not shown in the schematic). The first metal 522 for the source contact comprises an aluminum or an aluminum-based alloy as an example. The first metal 522 used for the source contact may also be used for third metal (not shown in the schematic) for the gate contact. The third metal formation may involve an etching step to physically separate the first metal 522 from the third metal (i.e., gate pad metal) or vice versa. The third metal for the gate pad may also be formed separately, if necessary. In case the gate pad metal is formed separately, the third metal for the gate contact may be of aluminum or an aluminum-based alloy as an example.

A protective coating layer (not shown in the schematic) may be formed on the front side of the SiC wafer to form a moisture barrier. The protective coating layer comprises, but is not limited to, an oxide layer, a nitride layer, an oxynitride layer, a polyimide layer, or a combination of the above mentioned layers. The protective coating layer is then patterned using an etching technique. The etching technique comprises, one of but is not limited to, the RIE, the wet-etching and a dedicated patterned mask layer (not shown in the schematic).

Once the protective coating layer formation and patterning is performed, a SiC wafer thinning (not shown in the schematic) may be performed by grinding the back side of the SiC wafer. In an embodiment, the SiC wafer thinning is performed to improve the on-state resistance of the completely fabricated planar gate SiC MOSFET. The back side of the SiC wafer may be grinded until the SiC wafer reaches a total thickness of 80~200 micrometers (μm). In an embodiment, the total thickness after the SiC wafer thinning may be further reduced in the future when the SiC wafer thinning technology may advance. The SiC wafer thinning may be accomplished by chemical mechanical planarization (CMP), wet etching, dry etching, or a combination of the above with a proper protective coating (not shown in the schematic) on the front side of the SiC wafer.

Once the wafer thinning step is completed, a second silicide layer 520 for a drain contact may be formed on the back side of the SiC wafer to establish a good quality ohmic contact for a drain terminal. The second silicide layer 520 for the drain contact may be formed by blanket-deposition of a nickel-based metal layer as an example as shown in FIG. 5R. The formation of the second silicide layer 520 involves a subsequent thermal treatment. The thermal treatment comprises, but is not limited to, a laser annealing technique to form a nickel-based silicide on the back side of the SiC wafer. Once the second silicide layer 520 is formed on the back side of the SiC wafer, a second metal 524 (e.g., second pad metal) for the drain contact may be formed on the back side of the SiC wafer as shown in FIG. 5S. The second metal 524 may be formed by sputtering or e-beam techniques as examples. The second metal 524 is formed for establishing a drain terminal of the completely fabricated planar gate SiC MOSFET. The second metal 524 for the drain contact may be of aluminum or aluminum-based alloy.

FIG. 6A-6Q illustrates a fabrication process of a silicon carbide (SiC) DMOSFET shown in FIG. 2B, according to one or more embodiments. A silicon carbide (SiC) wafer is prepared as shown in FIG. 6A. The SiC wafer prepared comprises a first conductivity type substrate 602, and a first conductivity type drift region 604. The first conductivity type drift region 604 is epi-grown and sandwiched between the first conductivity type substrate 602 and the air. The doping concentration and the thickness of the first conductivity type drift region 604 are designed primarily by the required electrical target performances including but not limited to blocking voltage (BV) and on-state resistance (RDS, ON) of a planar-gate SiC MOSFET device.

Figure 6B:
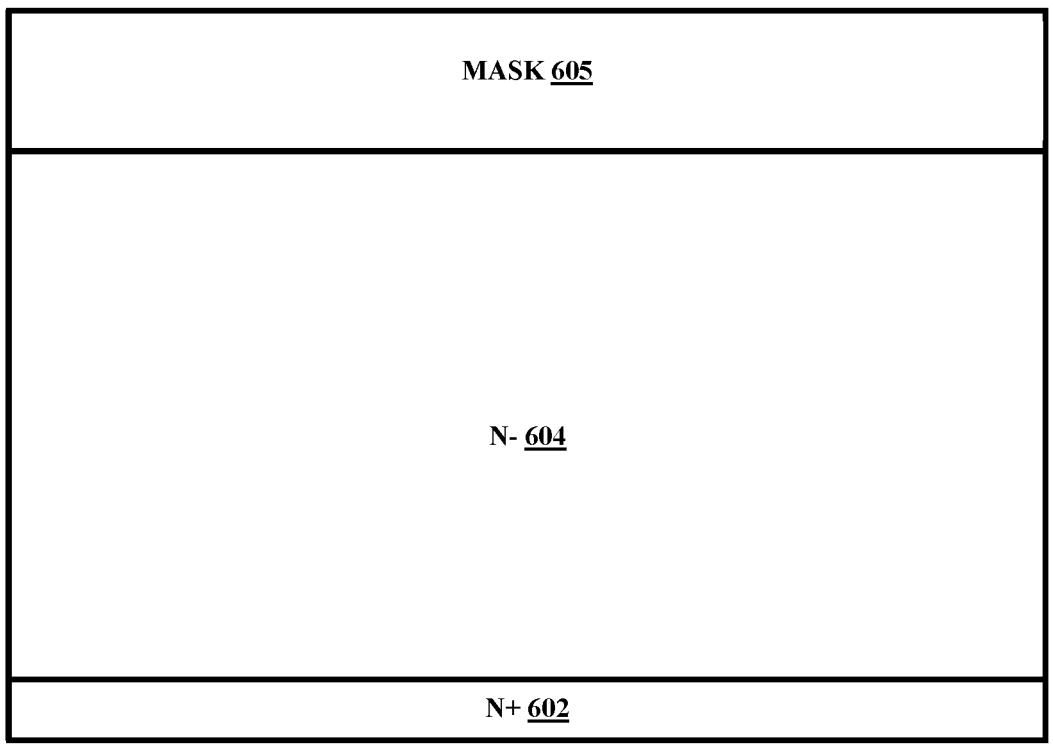

A mask layer 605, as shown in FIG. 6B, is deposited on top of surface of the SiC wafer. The mask layer 605 may be a hard mask layer. The mask layer 605 comprises a photoresist layer, an oxide layer, a nitride layer, a polysilicon layer, or a combination of the above layers. In an embodiment, the mask layer 605 comprises at least one of a silicon oxide layer, a polysilicon layer, and a silicon nitride layer. The mask layer 605 comprises a thickness ranging from 50 nanometers to 5000 nanometers.

Figure 6C:

The mask layer 605 is then patterned, as shown in FIG. 6C, by an etching technique. The etching technique comprises, but is not limited to reactive ion etching (RIE) or inductively coupled plasma etching (ICP) or wet etching. In an embodiment, the etching is performed to open up an area where a source attachment region 608, and a second conductivity type well region 606 may be formed underneath.

Figure 6D:
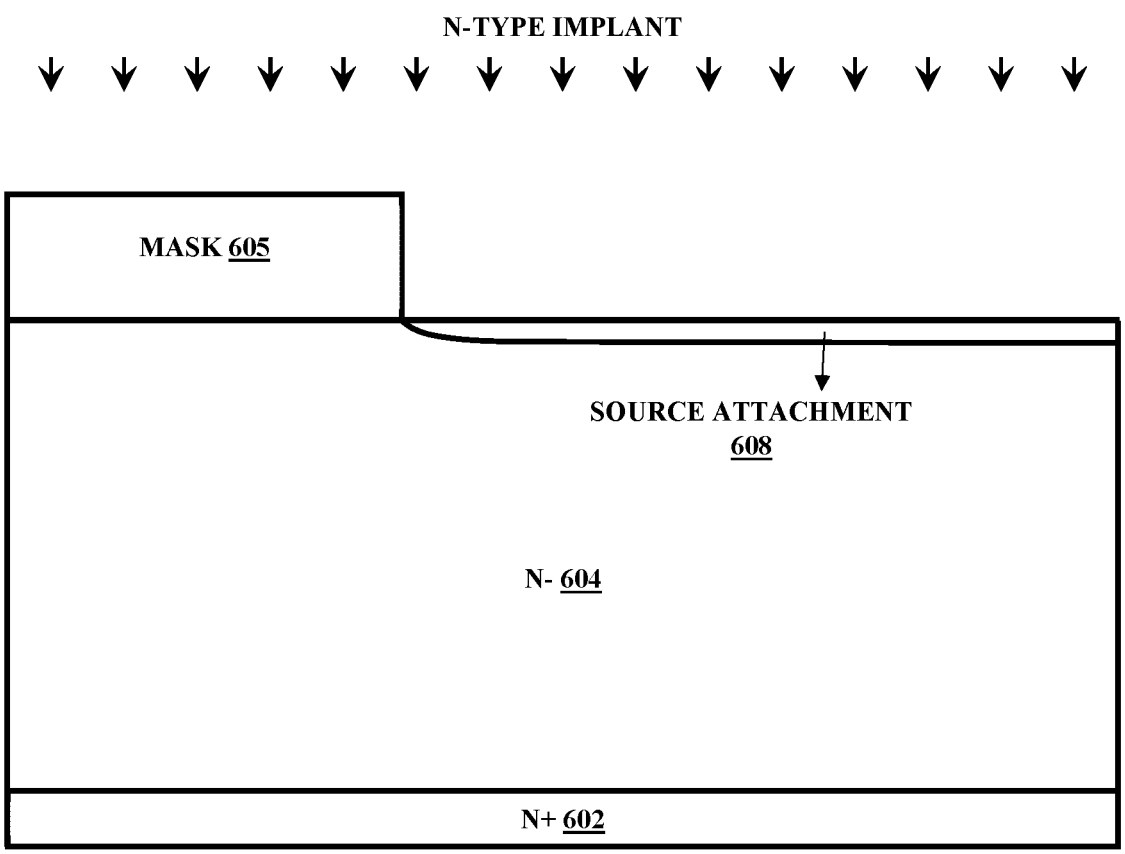

A thin layer of screen oxide (not shown in the schematic) may be formed immediately upon patterning the mask layer 605. With the patterned mask and the screen oxide present on the surface of the SiC wafer, a first conductivity type ion (e.g., n-type species) implantation is performed (i.e., in a direction orthogonal to the SiC wafer) to form the source attachment region 608 as shown in FIG. 6D. In an embodiment, the source attachment region 608 may be formed with a second conductivity type ions (e.g., p-type species) such as Aluminum or Boron. The ion implantation step for forming the source attachment region 608 may require an additional mask (not shown in the schematic) other than what was mentioned above to prevent any unwanted impurities from reaching to an edge termination region (not shown in the schematic).

In one embodiment, the mask layer 605 may be formed by depositing a top silicon oxide layer and a bottom silicon oxide layer. The top silicon oxide layer and the bottom silicon oxide layer is sandwiching a polysilicon layer. The thickness of the mask layer 605, having the top silicon oxide layer and the bottom silicon oxide layer sandwiching the polysilicon layer, is in a range of 1300 nanometers to 1800 nanometers. In case of the mask layer 605, having the top silicon oxide layer and the bottom silicon oxide layer sandwiching the polysilicon layer, the etching is performed onto the top silicon oxide layer and the bottom silicon oxide layer. The remnant thin silicon oxide layer is then formed. The ion implantation is then performed through the remnant thin silicon oxide layer to form the source attachment region 608.

Figure 6E:
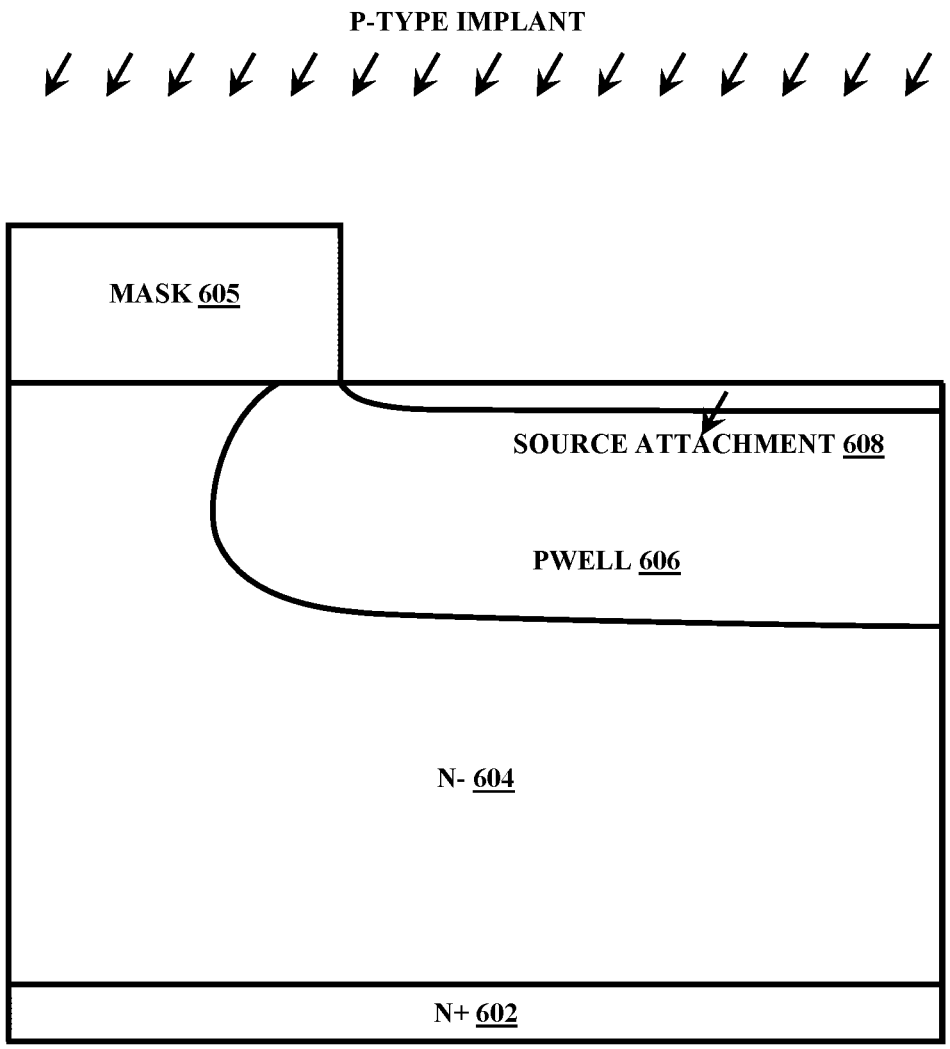

Using the same patterned mask (utilized for the formation of the source attachment region 608), a p-type angled ion implantation is performed to form the second conductivity type well region 606. The p-type angled ion implantation is performed at a non-zero tilt angle (i.e., in a direction non-orthogonal to the SiC wafer). From a viewpoint of an ideal doping structure, the second conductivity type well region 606 is assumed to maintain a constant level of its doping concentration throughout the second conductivity type well region 606. The second conductivity type well region 606 is further assumed to form an abrupt junction with the first conductivity type drift region 604. The second conductivity type well region 606 may touch the top of the SiC wafer. The second conductivity type well region 606 is formed by performing the ion implantation within the active region of the SiC DMOSFET using the second conductivity type ions. The active region is an area that most conduction current of a completely fabricated planar-gate SiC MOSFET flows during the on-state operation of the planar-gate SiC DMOSFET. The second conductivity type ions comprise one of but not limited to aluminum and boron. The second conductivity type well region 606 is formed within the first conductivity type drift region 604 as shown in FIG. 6E.

Figure 6F:
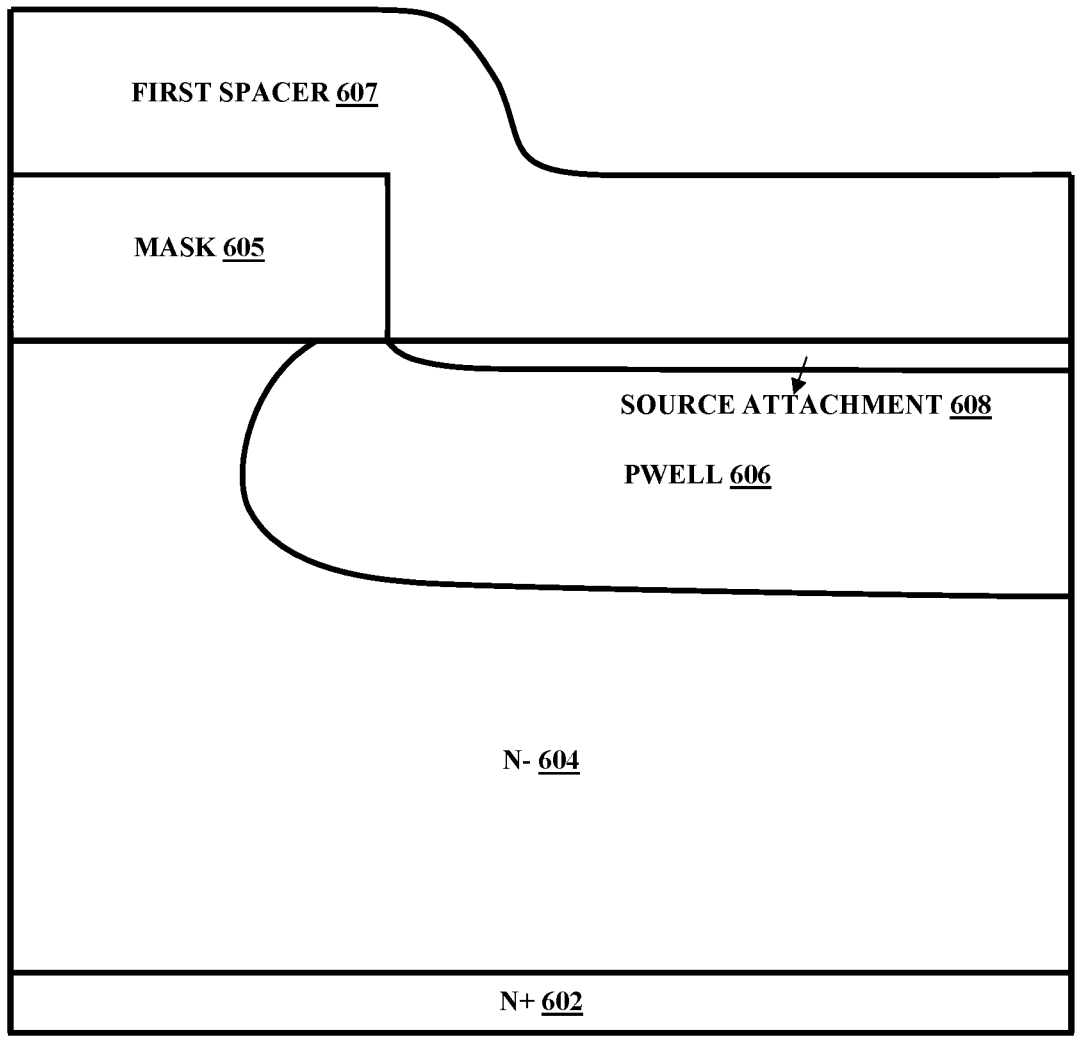
Figure 6G:
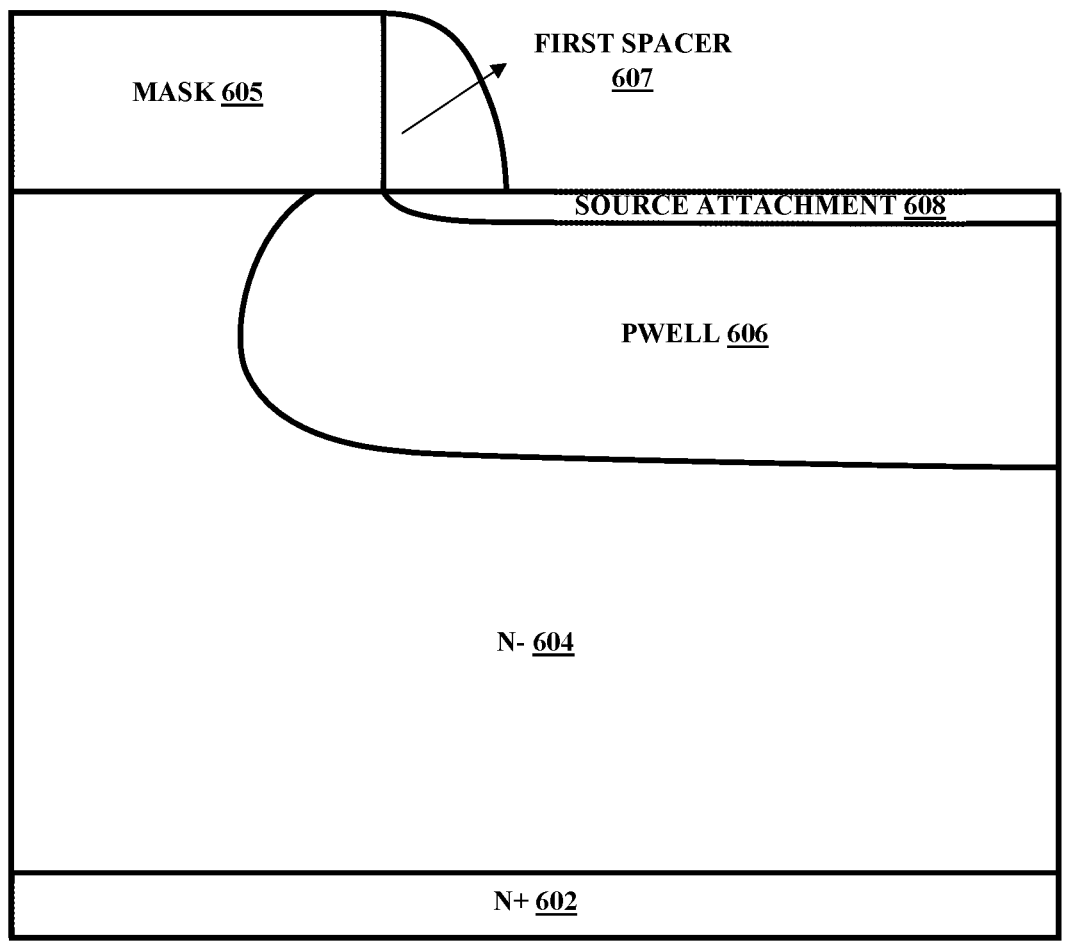

A first spacer layer 607 is then deposited on the front side of the SiC wafer while the patterned mask which was used to form the second conductivity type well region 506 and the source attachment region 608 is still present on the top of the SiC wafer as shown in FIG. 6F. A side (e.g., top side) of the SiC wafer where the surface of the SiC wafer is located may be referred as the front side of the SiC wafer. An opposite side (e.g., bottom side) of the front side of the SiC wafer may be referred as a back side of the SiC wafer. The first spacer layer 607 may comprise an oxide layer, a nitride layer, a polysilicon layer, or a combination of the above layers. The first spacer layer 607 deposited on the top of the SiC wafer is then etched back as shown in FIG. 6G. The first spacer layer 607 may be etched back by an etching technique. In an embodiment, the first spacer layer 607 may be etched with a first etch rate in a vertical direction and a second etch rate in a horizontal direction. The second etch rate is lower than the first etch rate. The etching technique comprises but not limited to RIE or ICP based dry etching or wet etching. The first spacer layer 607 comprises a first sidewall spacer is formed along a vertical side of the patterned mask. In an embodiment, the first sidewall spacer comprises a chemical vapor deposition (CVD) of at least one of a silicon oxide layer, a polysilicon layer, and a silicon nitride layer. The first sidewall spacer is used for the formation of the second conductivity type well region 606 and the source attachment region 608. The first sidewall spacer may be a remnant of the first spacer layer 607 as shown in FIG. 6G.

Figure 6H:
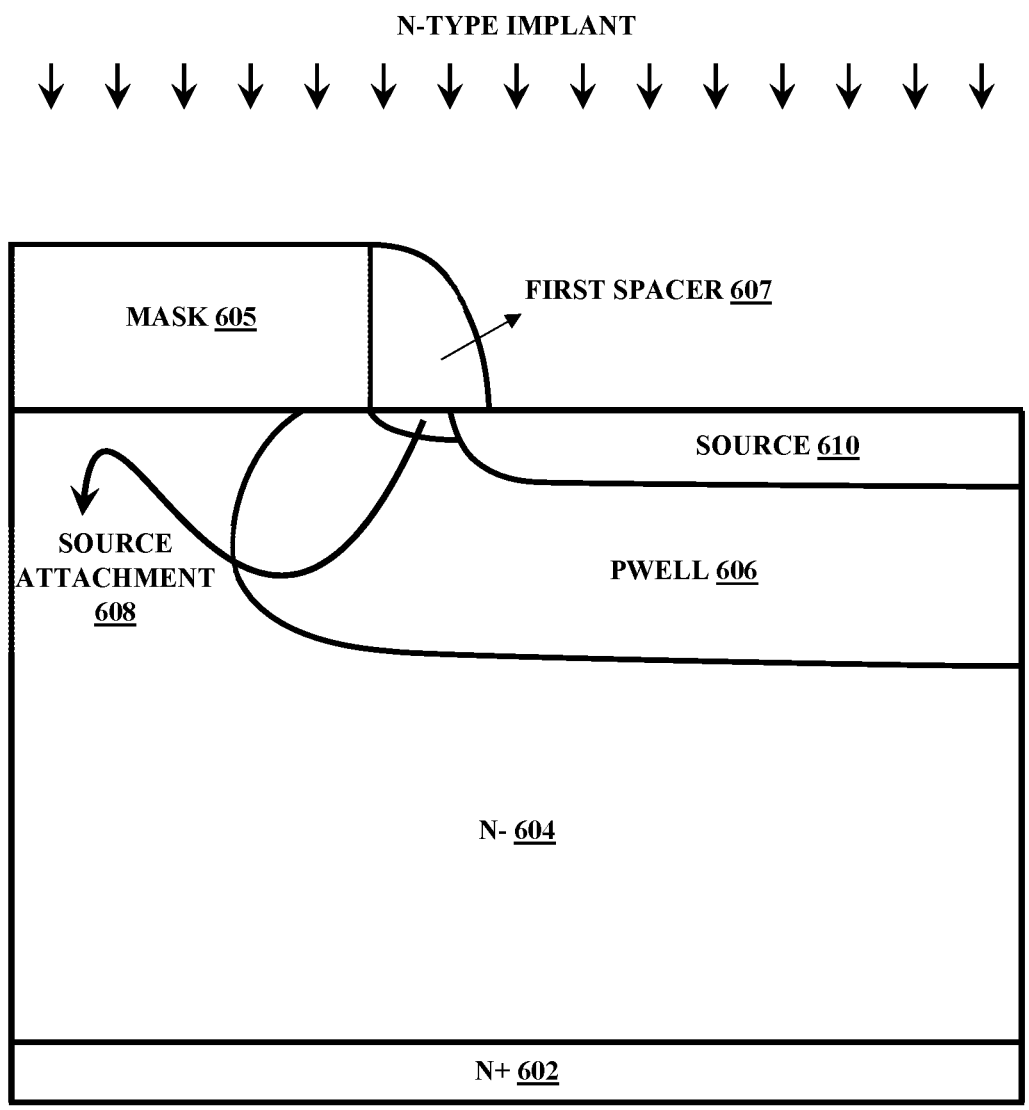

Upon the completion of the etch-back step of the first spacer layer 607, the patterned mask used for the second conductivity type well region 506 and the first sidewall spacer combined may form a second implant mask for a subsequent ion implantation step for a source region 610. The second implant mask may be the combination of the patterned mask used for the second conductivity type well region 606 and the first sidewall spacer. The second implant mask may be used for the ion implantation to form the source region 610. The source region 610 may be formed with a first conductivity type ions (e.g., n-type implant species) including but not limited to nitrogen or/and phosphorus as shown in FIG. 6H. The source region 610 may be formed within the second conductivity type well region 606. The top surface of the source region 610 may touch the surface of the SiC wafer. The ion implantation step for forming the source region 610 may require an additional mask (not shown in the schematic) other than what was mentioned above to prevent any unwanted n-type impurities from reaching to an edge termination region (not shown in the schematic).

Figure 6I:
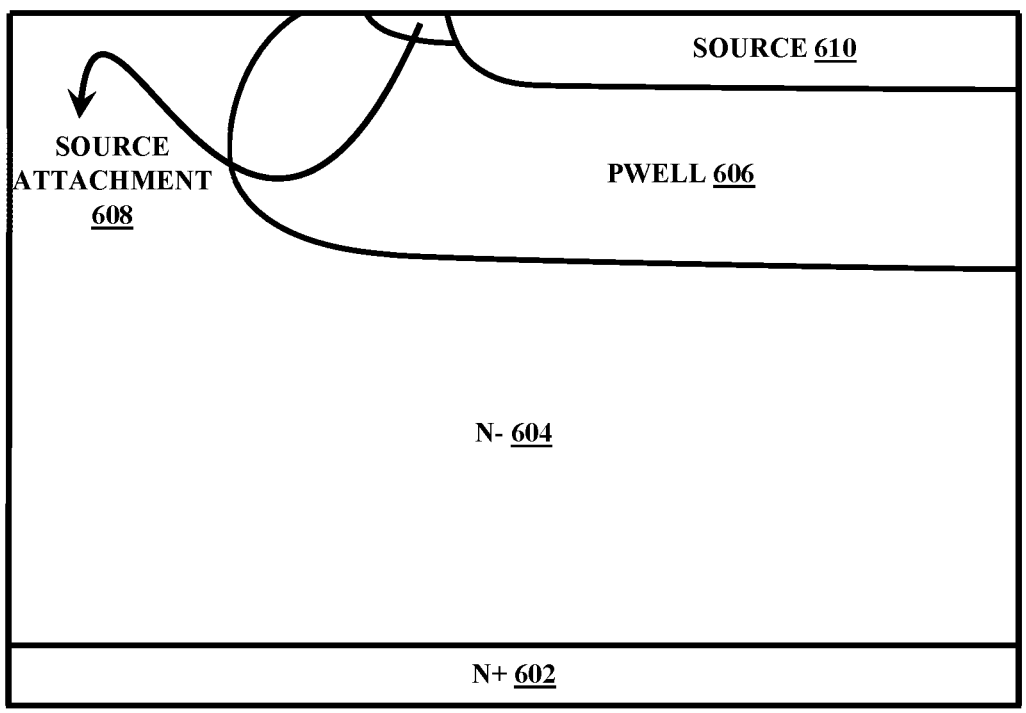

As shown in FIG. 6I, the patterned mask used for forming the second conductivity type well region 606, and the first sidewall spacer may be removed from the surface of the SiC wafer completely. The removal of the mask layers may be performed using an etching technique (e.g., wet etching) as shown in FIG. 6I. A fourth mask layer is then deposited onto the surface of the SiC wafer. The fourth mask layer is then patterned (not shown in the schematic). A p-conductivity type ion implantation is then performed onto the fourth mask layer for creating highly doped second conductivity type (e.g., p-type) regions that serve as the body contact regions. A short SiC dry etch step may be performed using the same patterned fourth mask layer in order to selectively remove the first conductivity type implanted regions. The short SiC dry etch step may be performed after the hard mask layer is patterned and prior to performing the second conductivity type implantation for the body contact region.

A thermal activation step is then performed (not shown in the schematics). The thermal activation electrically activates all implanted species which may start by coating the SiC wafer with a suitable coating material. The coating material may be a carbon-based material such as photoresist. As soon as the SiC wafer is coated using the coating material, the SiC wafer may be thermally annealed at a predefined high temperature. The predefined high temperature may be 1700° C. or even higher. The coating material may be removed from the SiC wafer upon completing the thermal annealing step. Immediately after performing the thermal activation step, an oxide layer may be thermally grown on both sides of the SiC wafer. The oxide layer grown is subsequently removed. The oxide layer formation and removal are collectively called as oxidation step by the SiC device community. The oxidation step is performed in order to improve the quality of the surface of the SiC wafer.

A field oxide layer may be formed on the surface of the SiC wafer. The field oxide layer may be formed by dry oxidation or wet oxidation of the SiC wafer (not shown in the schematics). In an embodiment, the field oxide layer may be formed by chemical vapor deposition (CVD) of a dielectric layer. The dielectric layer comprises a silicon oxide layer, a silicon nitride layer, or a combination thereof. A portion of the field oxide layer may be selectively cleared out by an etching technique. The etching technique comprise but not limited to hydrofluoric acid (HF)-based wet etching. The etching is performed so as to define the active region of the planar-gate SiC MOSFET.

Figure 6J:
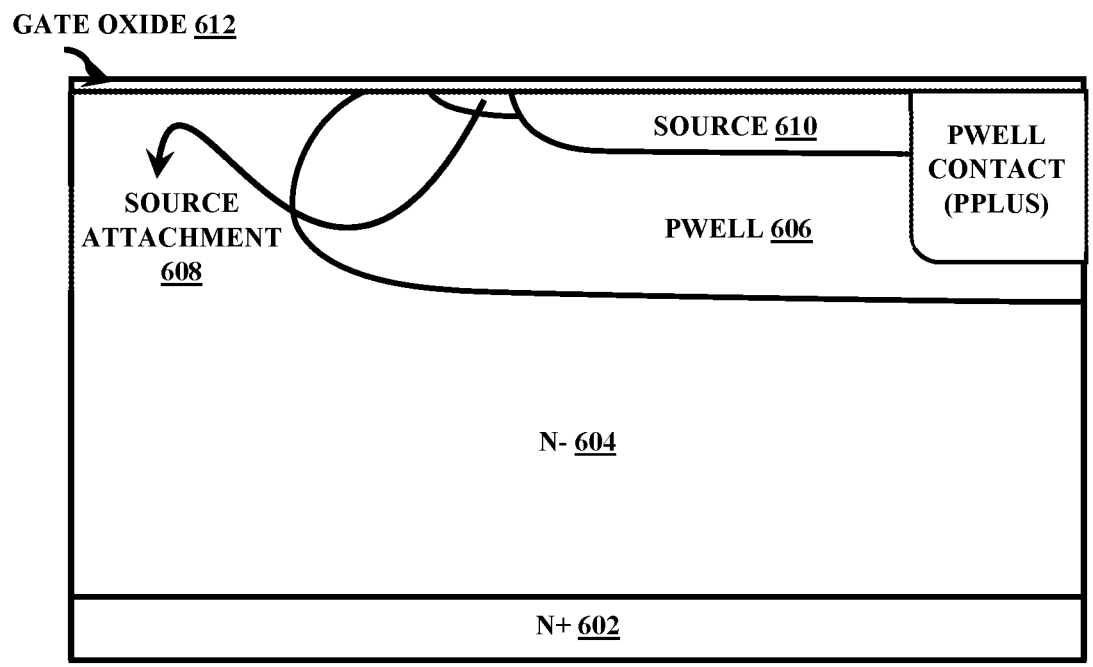
Figure 6K:
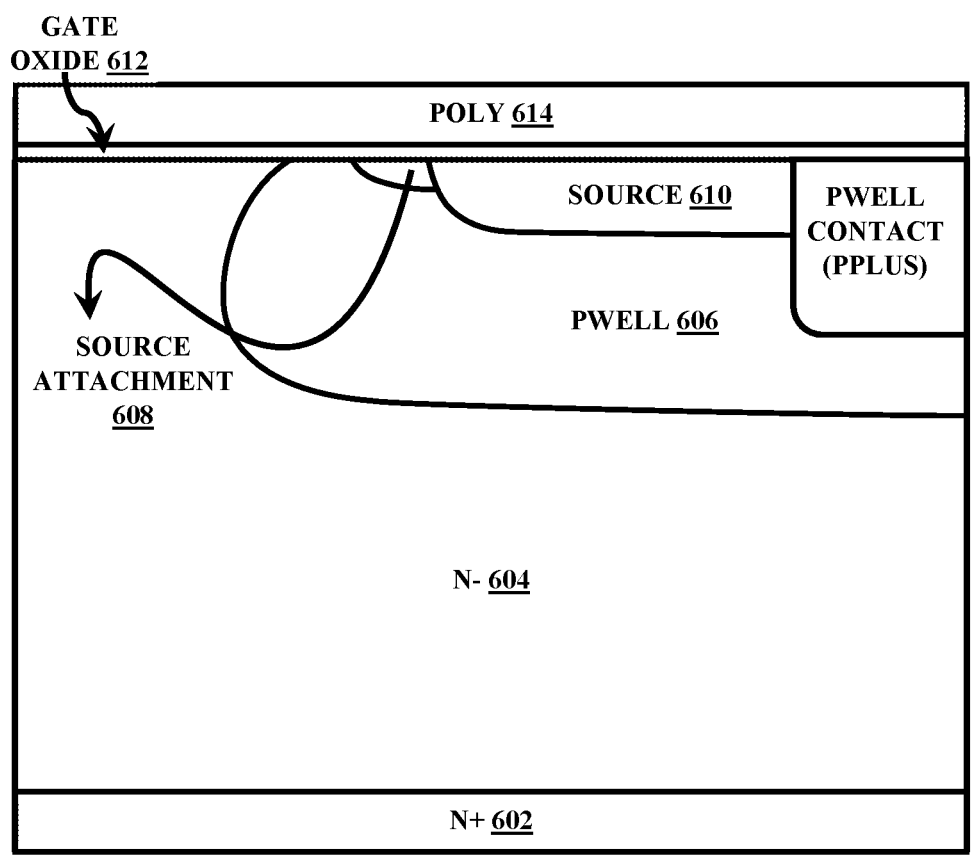
Figure 6L:
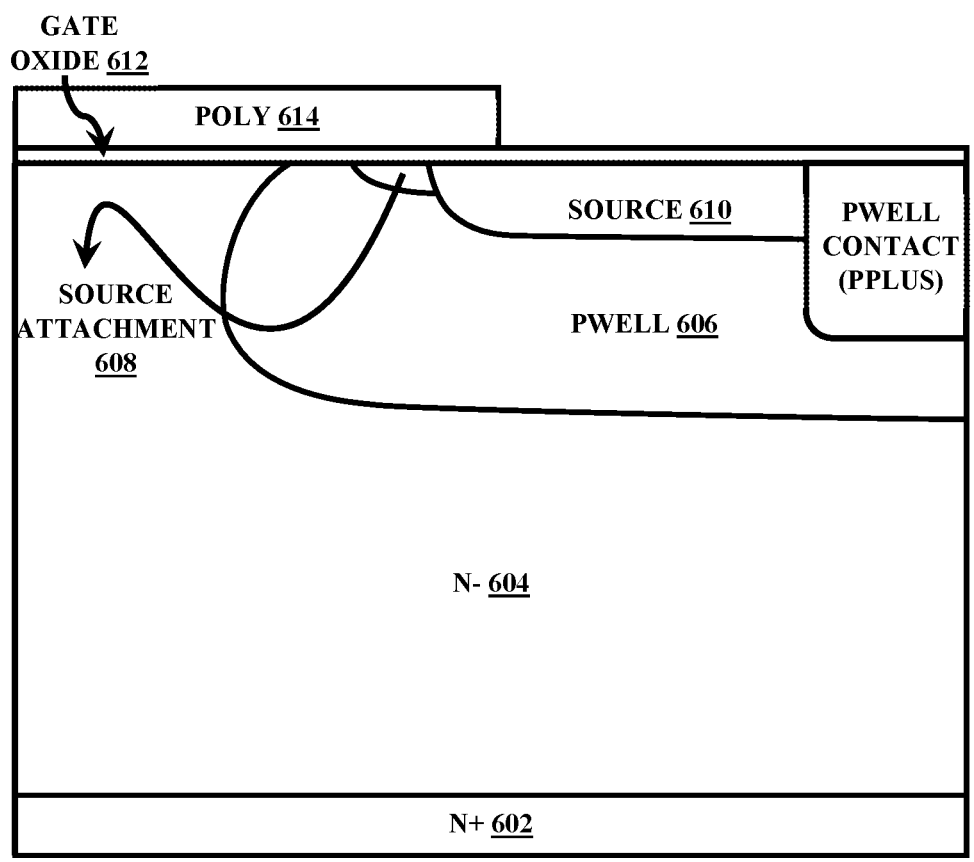

Once the active region is defined, a gate oxide layer 612 may be formed on the surface of the SiC wafer as shown in FIG. 6J. The gate oxide layer 612 may be formed by thermal oxidation. In an embodiment, the gate oxide layer 612 is formed by Plasma-enhanced chemical vapor deposition (PECVD) or low-pressure chemical vapor deposition (LPCVD), followed by adequate nitridation treatment to passivate the SiC surface. A polysilicon layer 614 is then performed on top of the gate oxide layer 612 as shown in FIG. 6K. The polysilicon layer 614 may be doped either by in-situ doping or by Phosphorus oxychloride (POCL3) based doping. The polysilicon layer 614 is then patterned by an etching technique as shown in FIG. 6L. The etching technique comprises, but is not limited to, the reactive ion etching (RIE). The etching is performed to define a lateral extent of a gate stack of the planar gate SiC MOSFET. In an embodiment, the gate layer 614 may be formed using a combination of polysilicon and refractory metals such as Molybdenum, Tungsten, etc.

Figure 6M:
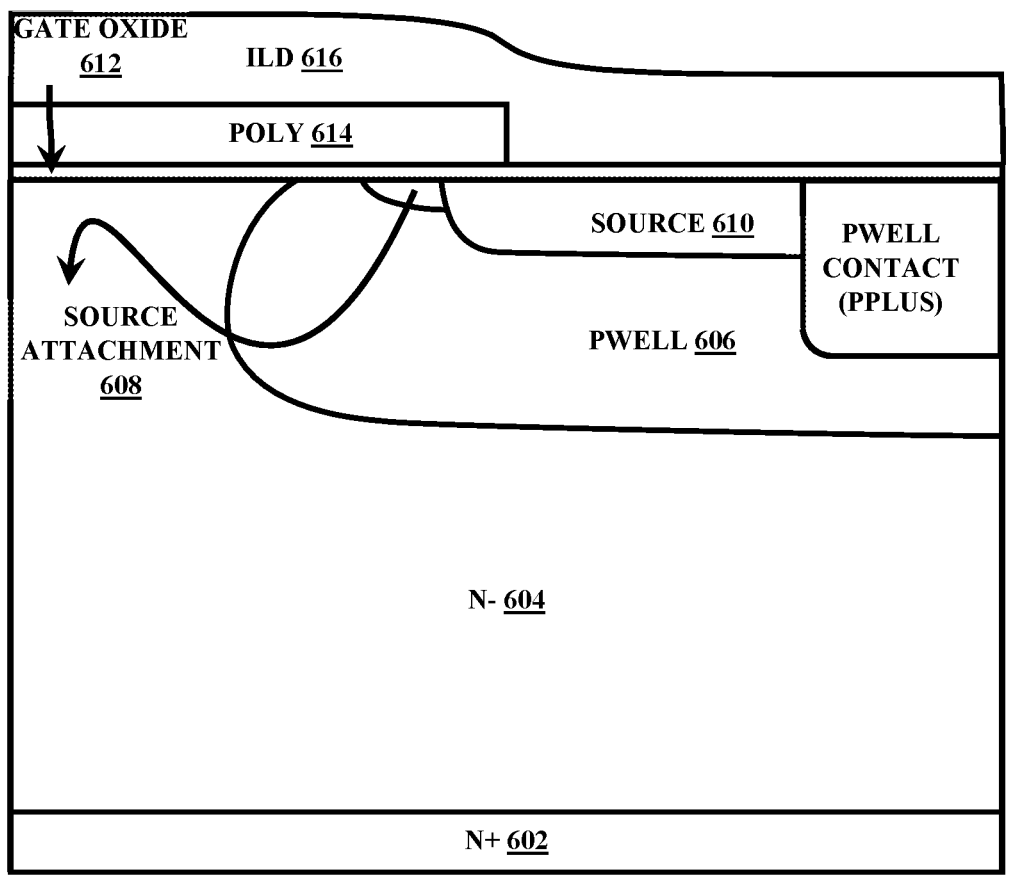
Figure 6N:
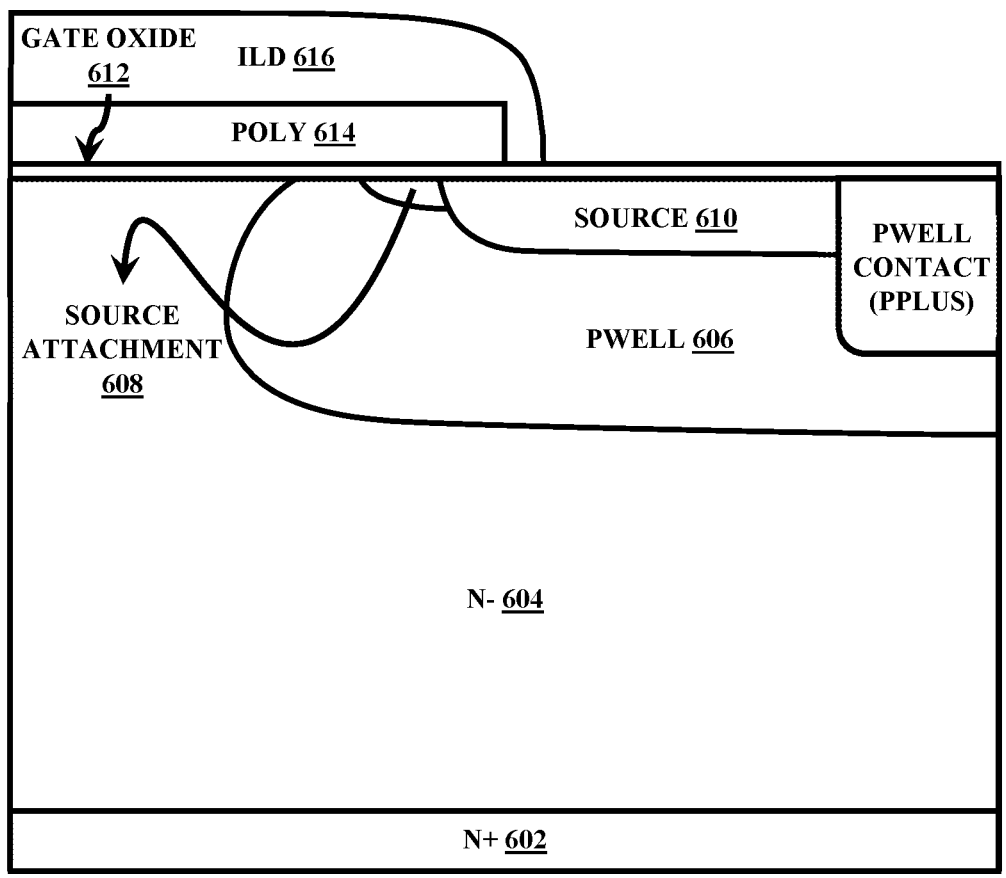
Figure 6O:
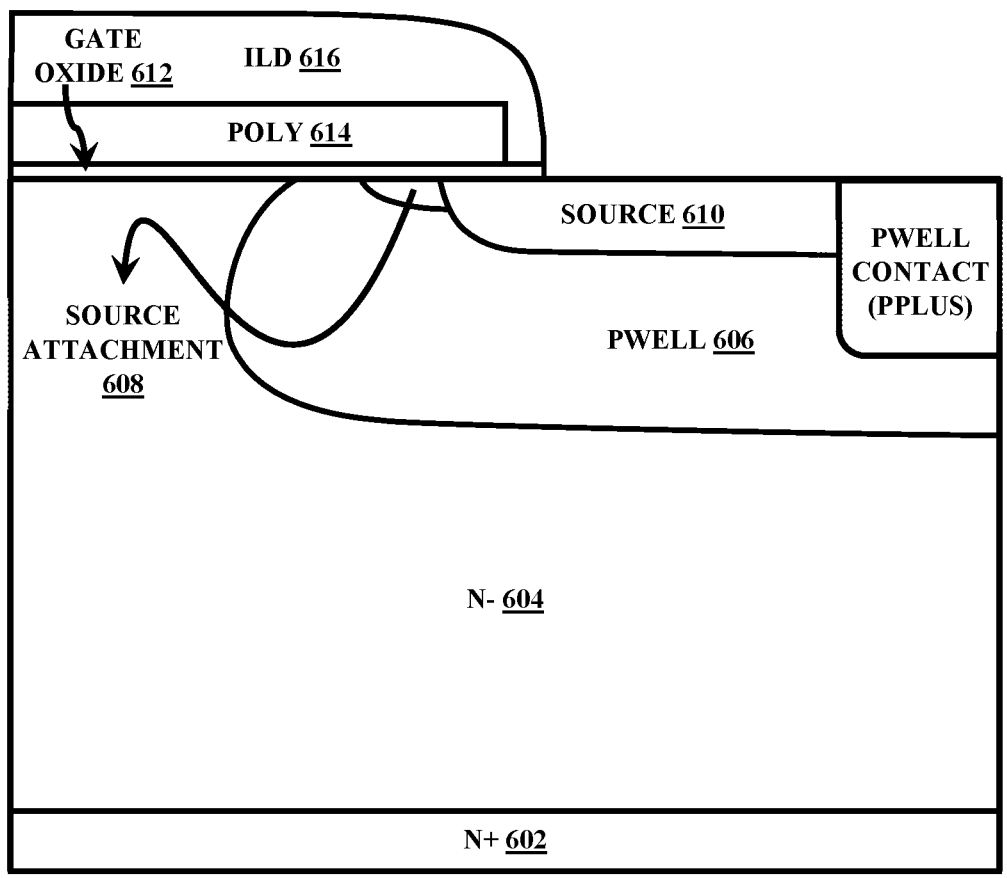

An inter-layer dielectric (ILD) 616 may be formed on the front side (i.e., top side) of the SiC wafer as shown in FIG. 6M. The inter-layer dielectric is an insulation layer. The ILD 616 may be formed by an oxide layer, a nitride layer, an oxynitride layer, or a combination of the above layers. The ILD 616 is then patterned by an etching technique as shown in FIG. 6N. The etching technique comprises, but is not limited to, the RIE. In an embodiment, the etching is performed to open a contact window for a source contact of the planar gate SiC MOSFET. The ILD etching step may be used for further etching of a portion of the gate oxide layer 612 for complete clearing of the ILD/gate oxide layer stack where the source contact may be formed as shown in FIG. 6O. Immediately after the ILD etching step, a possible reflow of the ILD layer (not shown in the schematic) may be performed for removing any sharp edges of the as-etched ILD layer.

Figure 6P:
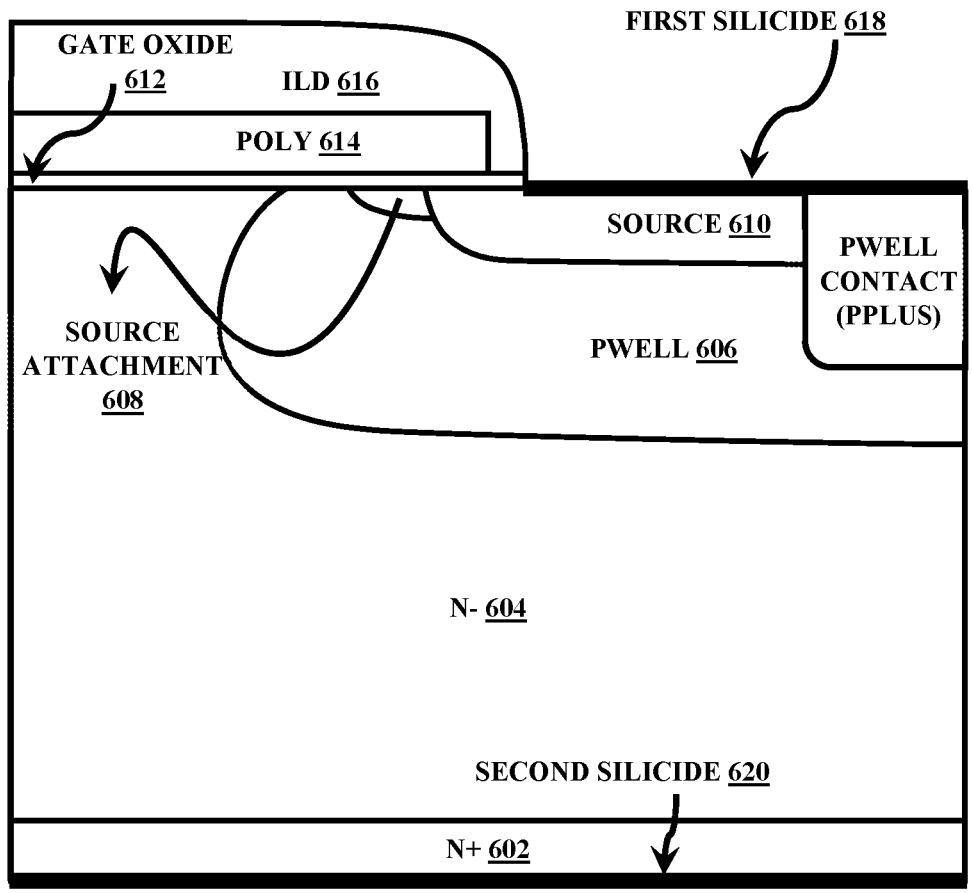
Figure 6Q:
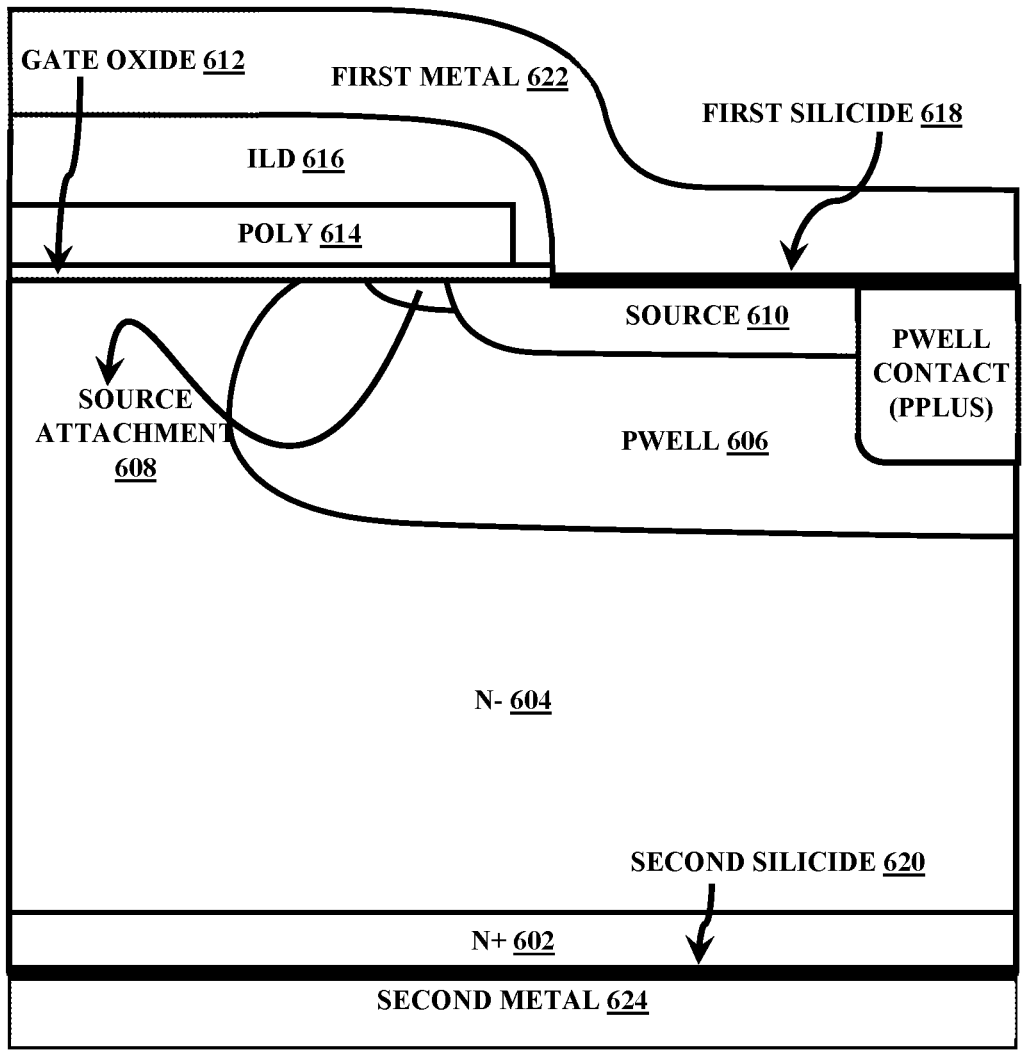

Once the source contact window is opened, a first silicide layer 618 for the source contact may be formed on a portion of the surface of the SiC wafer which is exposed to the air as shown in FIG. 6P. The first silicide layer 618 for the source contact is to establish a good quality ohmic contact for a source terminal (not shown in the schematic). The first silicide layer 618 may be formed by deposition of a nickel-based metal layer. The first silicide layer 618 is followed by appropriate thermal annealing. The thermal annealing may be performed in a rapid thermal annealing furnace at temperatures as high as 1000° C. or higher.

Once the first silicide layer 618 for the source contact is formed, a gate contact window may be opened by etching a portion of the ILD 616. The gate contact window is opened to expose a portion of the polysilicon layer 614. The portion of the polysilicon layer 614 is opened for making the gate contact window ready for subsequent deposition of a third metal for the gate contact (not shown in the schematics).

Immediately after completing the formation of the first silicide layer 618 for the source contact, a first metal 622 (e.g., a first pad metal) for the source contact may be deposited on the front side of the SiC wafer as shown in FIG. 6Q. The first metal 622 is then patterned by an etching technique. The etching technique comprises, but is not limited to, a wet etching by using a patterned mask layer (not shown in the schematic). The first metal 622 for the source contact comprises one of an aluminum or an aluminum-based alloy as an example. The first metal 622 used for the source contact may be used for third metal (not shown in the schematic) for the gate contact. The third metal formation may involve an etching step to physically separate the first metal 622 from the third metal (i.e., gate pad metal) or vice versa. The third metal for the gate pad metal may also be formed separately, if necessary. In case the third metal is formed separately, the third metal for the gate contact may be of aluminum or an aluminum-based alloy as an example.

A protective coating layer (not shown in the schematic) may be formed on the front side of the SiC wafer to form a moisture barrier. The protective coating layer comprise but not limited to an oxide layer, a nitride layer, an oxynitride layer, a polyimide layer, or a combination of the above-mentioned layers. The protective coating layer is then patterned using an etching technique. The etching technique comprises, one of but is not limited to, the RIE, the wet-etching and a dedicated patterned mask layer (not shown in the schematic).

Once the protective coating layer formation and patterning is performed, a SiC wafer thinning (not shown in the schematic) may be performed by grinding the back side of the SiC wafer. The SiC wafer thinning is performed to improve the on-state resistance of the completely fabricated planar-gate SiC MOSFET. The back side of the SiC wafer may be grinded until the SiC wafer reaches to a total thickness of 80–200 micrometers (μm). In an embodiment, the total thickness after the SiC wafer thinning may be further reduced in the future when the SiC wafer thinning technology may advance. The SiC wafer thinning may be accomplished by chemical mechanical planarization (CMP), wet etching, dry etching, or a combination of the above with a proper protective coating (not shown in the schematic) on the front side of the SiC wafer.

Once the wafer thinning step is completed, a second silicide layer 620 for a drain contact may be formed on the back side of the SiC wafer to establish a good quality ohmic contact for a drain terminal as shown in FIG. 6P. The second silicide layer 620 for the drain contact may be formed by blanket-deposition of a nickel-based metal layer as an example. The formation of the second silicide layer 620 involves a subsequent thermal treatment. The thermal treatment comprises, but is not limited to, a laser annealing technique to form a nickel-based silicide on the back side of the SiC wafer. Once the second silicide layer 620 is formed on the back side of the SiC wafer, a second metal 624 (e.g., second pad metal) for the drain contact may be formed on the back side of the SiC wafer as shown in FIG. 6Q. The second metal 624 may be formed by sputtering or e-beam techniques as examples. The second metal 624 is formed for establishing a drain terminal of the completely fabricated planar gate SiC MOSFET. The second metal 624 for the drain contact may be of aluminum or aluminum-based alloy.

Other embodiments are also within the scope of the following claims.

Although, various embodiments which incorporate the teachings described in detail herein, those skilled in the art can readily devise many other varied embodiments that still incorporate these teachings. For example, a complementary SiC MOSFET device with a P+ substrate, P– drift region and P+ source can be created in a N-well region. The embodiments described are all applicable to the complementary MOSFET as well.

In the embodiments and claims herein, the terms "first conductivity type region" and "second conductivity type region" are used to describe n-type and p-type regions respectively for a n-type device. For a p-type device "first conductivity type region" and "second conductivity type region" are used to describe p-type and n-type regions, respectively.

INCORPORATION BY REFERENCE

All publications, patents, patent application publications, and non-patent literatures cited in this application are hereby incorporated by reference in their entirety, including:

US20210134996A1 entitled "Silicon Carbide Power Devices";

U.S. Pat. No. 11,049,962B2 entitled "Silicon Carbide Power Devices"; and

U.S. Pat. No. 11,183,566B1 entitled "Improved Performance Silicon Carbide Power Devices".

What is claimed is:

1. A metal-oxide-semiconductor field-effect transistor (MOSFET) device comprising a unit cell on a silicon carbide (SiC) substrate, the unit cell comprising:
   a source region;
   a well region;
   a source attachment region;
   a gate oxide layer; and
   a gate metal layer,
   wherein the source attachment region is in direct contact with the source region,
   wherein the gate metal layer completely overlaps with the source attachment region,
   wherein the gate oxide layer extends beyond a lateral edge of the gate metal layer, and
   wherein the source attachment region comprises a doping concentration lower than a doping concentration of the source region.

2. The device of claim 1, wherein the source attachment region comprises a first conductivity type region.

3. The device of claim 1, wherein the source attachment region comprises a second conductivity type region.

4. The device of claim 1, wherein the source attachment region comprises a first depth shallower than a second depth of the source region.

5. The device of claim 1, wherein the source attachment region comprises a first depth equal to a second depth of the source region.

6. The device of claim 1, wherein the source attachment region comprises a first doping concentration equal to a second doping concentration of the source region.

7. The device of claim 1, wherein the device comprises a metal-oxide-semiconductor field-effect transistor (MOSFET) channel.

8. The device of claim 7, wherein the MOSFET channel extends from a first edge of the well region to a second edge of the source attachment region when the source attachment region comprises a first conductivity type region.

9. The device of claim 7, wherein the MOSFET channel comprises an extent that is equal to sum of the well region and the source attachment region when the source attachment region comprises a second conductivity type region.

10. The device of claim 1, wherein the device comprises a well contact region.

11. The device of claim 10, wherein the device comprises the well contact region at center of the unit cell.

12. The device of claim 10, wherein the device comprises the well contact region positioned at orthogonal location along a direction of the source region.

13. The device of claim 1, wherein the device comprises a trench region.

14. The device of claim 13, wherein the device comprises a well contact region located below the trench region.

15. The device of claim 13, wherein a third depth of the trench region is greater than a second depth of the source region.

16. The device of claim 1, wherein the device comprises a sinker region.

17. The device of claim 16, wherein the sinker region is located directly underneath the source region.

18. The device of claim 16, wherein the sinker region comprises a second conductivity type region.

19. The device of claim 1, wherein the source region is confined within the well region.

20. The device of claim 1, wherein the source attachment region is confined with the well region.

* * * * *